United States Patent
Crisp et al.

(10) Patent No.: US 8,659,140 B2
(45) Date of Patent: *Feb. 25, 2014

(54) STUB MINIMIZATION USING DUPLICATE SETS OF SIGNAL TERMINALS IN ASSEMBLIES WITHOUT WIREBONDS TO PACKAGE SUBSTRATE

(75) Inventors: Richard Dewitt Crisp, Hornitos, CA (US); Wael Zohni, San Jose, CA (US); Belgacem Haba, Saratoga, CA (US); Frank Lambrecht, Mountainview, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/439,317

(22) Filed: Apr. 4, 2012

(65) Prior Publication Data

US 2013/0082395 A1 Apr. 4, 2013

Related U.S. Application Data

(60) Provisional application No. 61/542,488, filed on Oct. 3, 2011, provisional application No. 61/542,553, filed on Oct. 3, 2011, provisional application No. 61/542,495, filed on Oct. 3, 2011, provisional application No. 61/600,483, filed on Feb. 17, 2012.

(51) Int. Cl.

| H01L 23/52 | (2006.01) |
|---|---|
| H01L 23/02 | (2006.01) |
| H01L 23/48 | (2006.01) |
| H01L 29/40 | (2006.01) |
| H01L 23/04 | (2006.01) |
| H05K 7/00 | (2006.01) |
| H05K 1/18 | (2006.01) |
| H01L 21/82 | (2006.01) |

(52) U.S. Cl.
USPC ........... 257/691; 257/686; 257/693; 257/695; 257/697; 257/698; 257/778; 257/E25.006; 438/129; 361/760; 361/761; 361/777; 361/778

(58) Field of Classification Search
None
See application file for complete search history.

(56) References Cited

U.S. PATENT DOCUMENTS

| 3,670,208 A | 6/1972 | Hovnanian et al. |
| 5,148,265 A | 9/1992 | Khandros et al. |

(Continued)

FOREIGN PATENT DOCUMENTS

| EP | 1205977 A2 | 5/2002 |
| JP | 2002-076252 A | 3/2002 |

(Continued)

OTHER PUBLICATIONS

Kang, et al., 8Gb 3D DDR3 DRAM Using Through-Silicon-Via Technology, IEEE, International Solid-State Circuits Conference, 2009, Samsung Electronics, Hwasung, Korea.

(Continued)

*Primary Examiner* — Michael Jung
(74) *Attorney, Agent, or Firm* — Lerner, David, Littenberg, Krumholz & Mentlik, LLP

(57) ABSTRACT

A microelectronic package can include a microelectronic element having a face and a plurality of element contacts thereon, a substrate having first and second surfaces, and terminals on the second surface configured for connecting the package with at least one external component. The substrate can have substrate contacts on the first surface facing the element contacts of the microelectronic element and joined thereto. The terminals can include first terminals arranged at positions within first and second parallel grids. The first terminals of each grid can be configured to carry address information usable by circuitry within the microelectronic package to determine an addressable memory location from among all the available addressable memory locations of a memory storage array within the microelectronic element. The signal assignments of the first terminals in the first grid can be a mirror image of the signal assignments of the first terminals in the second grid.

30 Claims, 27 Drawing Sheets

(56) References Cited

U.S. PATENT DOCUMENTS

| | | | |
|---|---|---|---|
| 5,148,266 | A | 9/1992 | Khandros et al. |
| 5,480,840 | A | 1/1996 | Barnes et al. |
| 5,679,977 | A | 10/1997 | Khandros et al. |
| 5,777,391 | A | 7/1998 | Nakamura et al. |
| 5,821,614 | A | 10/1998 | Hashimoto et al. |
| 5,929,517 | A | 7/1999 | Distefano et al. |
| 5,936,305 | A | 8/1999 | Akram |
| 5,973,403 | A | 10/1999 | Wark |
| 6,086,386 | A | 7/2000 | Fjelstad et al. |
| 6,130,116 | A | 10/2000 | Smith et al. |
| 6,197,665 | B1 | 3/2001 | DiStefano et al. |
| 6,252,264 | B1 | 6/2001 | Bailey et al. |
| 6,255,899 | B1 | 7/2001 | Bertin et al. |
| 6,261,867 | B1 | 7/2001 | Robichaud et al. |
| 6,297,960 | B1 | 10/2001 | Moden et al. |
| 6,323,436 | B1 * | 11/2001 | Hedrick et al. ............... 174/256 |
| 6,343,019 | B1 | 1/2002 | Jiang et al. |
| 6,376,769 | B1 | 4/2002 | Chung |
| 6,380,318 | B1 | 4/2002 | Saito et al. |
| 6,384,473 | B1 | 5/2002 | Peterson et al. |
| 6,426,560 | B1 | 7/2002 | Kawamura et al. |
| 6,433,422 | B1 | 8/2002 | Yamasaki |
| 6,445,594 | B1 | 9/2002 | Nakagawa et al. |
| 6,452,266 | B1 | 9/2002 | Iwaya et al. |
| 6,462,423 | B1 | 10/2002 | Akram et al. |
| 6,560,134 | B2 | 5/2003 | Brox et al. |
| 6,577,004 | B1 | 6/2003 | Rumsey et al. |
| 6,617,695 | B1 | 9/2003 | Kasatani |
| 6,619,973 | B2 | 9/2003 | Perino et al. |
| 6,620,648 | B2 | 9/2003 | Yang |
| 6,633,078 | B2 | 10/2003 | Hamaguchi et al. |
| 6,661,089 | B2 | 12/2003 | Huang |
| 6,692,987 | B2 | 2/2004 | Lim et al. |
| 6,707,141 | B2 | 3/2004 | Akram |
| 6,720,666 | B2 | 4/2004 | Lim et al. |
| 6,742,098 | B1 | 5/2004 | Halbert et al. |
| 6,744,137 | B2 | 6/2004 | Kinsman |
| 6,765,288 | B2 | 7/2004 | Damberg |
| 6,781,220 | B2 | 8/2004 | Taube et al. |
| 6,821,815 | B2 | 11/2004 | Smith et al. |
| 6,836,007 | B2 | 12/2004 | Michii et al. |
| 6,876,088 | B2 | 4/2005 | Harvey |
| 6,894,379 | B2 * | 5/2005 | Feurle ............... 257/686 |
| 6,894,381 | B2 | 5/2005 | Hetzel et al. |
| 6,906,415 | B2 | 6/2005 | Jiang et al. |
| 6,943,057 | B1 | 9/2005 | Shim et al. |
| 6,982,485 | B1 | 1/2006 | Lee et al. |
| 7,061,092 | B2 | 6/2006 | Akram et al. |
| 7,061,105 | B2 | 6/2006 | Masuda et al. |
| 7,061,121 | B2 | 6/2006 | Haba |
| 7,091,064 | B2 | 8/2006 | Jiang |
| 7,138,709 | B2 | 11/2006 | Kumamoto |
| 7,145,226 | B2 | 12/2006 | Kumamoto |
| 7,151,319 | B2 | 12/2006 | Iida et al. |
| 7,170,158 | B2 | 1/2007 | Choi et al. |
| 7,262,507 | B2 | 8/2007 | Hino et al. |
| 7,272,888 | B2 | 9/2007 | DiStefano |
| 7,324,352 | B2 * | 1/2008 | Goodwin ............... 361/803 |
| 7,368,319 | B2 | 5/2008 | Ha et al. |
| 7,372,169 | B2 | 5/2008 | Chang |
| 7,389,937 | B2 | 6/2008 | Ito |
| 7,405,471 | B2 | 7/2008 | Kledzik et al. |
| 7,414,312 | B2 | 8/2008 | Nguyen et al. |
| 7,476,975 | B2 | 1/2009 | Ogata |
| 7,518,226 | B2 | 4/2009 | Cablao et al. |
| 7,535,110 | B2 | 5/2009 | Wu et al. |
| 7,550,842 | B2 | 6/2009 | Khandros et al. |
| 7,589,409 | B2 | 9/2009 | Gibson et al. |
| 7,633,146 | B2 | 12/2009 | Masuda et al. |
| 7,633,147 | B2 | 12/2009 | Funaba et al. |
| 7,642,635 | B2 | 1/2010 | Kikuchi et al. |
| 7,692,931 | B2 | 4/2010 | Chong et al. |
| 7,763,964 | B2 | 7/2010 | Matsushima |
| 7,763,969 | B2 | 7/2010 | Zeng et al. |
| RE41,478 | E | 8/2010 | Nakamura et al. |
| RE41,721 | E | 9/2010 | Nakamura et al. |
| RE41,722 | E | 9/2010 | Nakamura et al. |
| 7,795,721 | B2 | 9/2010 | Kurita |
| RE41,972 | E | 11/2010 | Lenander et al. |
| 7,989,940 | B2 | 8/2011 | Haba et al. |
| RE42,972 | E | 11/2011 | Nakamura et al. |
| 2001/0002727 | A1 | 6/2001 | Shiraishi et al. |
| 2001/0022740 | A1 | 9/2001 | Nuxoll et al. |
| 2002/0000583 | A1 | 1/2002 | Kitsukawa et al. |
| 2002/0027019 | A1 | 3/2002 | Hashimoto |
| 2002/0030261 | A1 | 3/2002 | Rolda et al. |
| 2002/0053727 | A1 | 5/2002 | Kimura |
| 2002/0053732 | A1 | 5/2002 | Iwaya et al. |
| 2002/0066950 | A1 | 6/2002 | Joshi |
| 2002/0171142 | A1 | 11/2002 | Kinsman |
| 2003/0064547 | A1 | 4/2003 | Akram et al. |
| 2003/0089978 | A1 | 5/2003 | Miyamoto et al. |
| 2003/0089982 | A1 | 5/2003 | Feurle |
| 2003/0107908 | A1 | 6/2003 | Jang et al. |
| 2003/0205801 | A1 | 11/2003 | Baik et al. |
| 2003/0211660 | A1 | 11/2003 | Lim et al. |
| 2004/0016999 | A1 | 1/2004 | Misumi |
| 2004/0061211 | A1 | 4/2004 | Michii et al. |
| 2004/0061577 | A1 | 4/2004 | Breisch et al. |
| 2004/0090756 | A1 | 5/2004 | Ho et al. |
| 2004/0112088 | A1 | 6/2004 | Ueda et al. |
| 2004/0145042 | A1 | 7/2004 | Morita et al. |
| 2004/0164382 | A1 | 8/2004 | Gerber et al. |
| 2004/0184240 | A1 | 9/2004 | Su |
| 2005/0116358 | A1 | 6/2005 | Haba |
| 2005/0194672 | A1 | 9/2005 | Gibson et al. |
| 2005/0206585 | A1 | 9/2005 | Stewart et al. |
| 2005/0258532 | A1 * | 11/2005 | Yoshikawa et al. ............ 257/698 |
| 2006/0004981 | A1 | 1/2006 | Bains |
| 2006/0081983 | A1 | 4/2006 | Humpston et al. |
| 2006/0207788 | A1 | 9/2006 | Yoon et al. |
| 2006/0290005 | A1 | 12/2006 | Thomas et al. |
| 2007/0025131 | A1 | 2/2007 | Ruckerbauer et al. |
| 2007/0108592 | A1 | 5/2007 | Lai et al. |
| 2007/0120245 | A1 | 5/2007 | Yoshikawa et al. |
| 2007/0143553 | A1 | 6/2007 | LaBerge |
| 2007/0187836 | A1 | 8/2007 | Lyne |
| 2007/0241441 | A1 | 10/2007 | Choi et al. |
| 2008/0012110 | A1 | 1/2008 | Chong et al. |
| 2008/0061423 | A1 | 3/2008 | Brox et al. |
| 2008/0088033 | A1 | 4/2008 | Humpston et al. |
| 2008/0098277 | A1 * | 4/2008 | Hazelzet ............... 714/753 |
| 2008/0150155 | A1 | 6/2008 | Periaman et al. |
| 2008/0182443 | A1 * | 7/2008 | Beaman et al. ............... 439/260 |
| 2008/0185705 | A1 | 8/2008 | Osborn et al. |
| 2008/0230888 | A1 | 9/2008 | Sasaki |
| 2008/0265397 | A1 | 10/2008 | Lin et al. |
| 2009/0065948 | A1 | 3/2009 | Wang |
| 2009/0108425 | A1 | 4/2009 | Lee et al. |
| 2009/0200680 | A1 | 8/2009 | Shinohara et al. |
| 2009/0250255 | A1 * | 10/2009 | Shilling et al. ............... 174/260 |
| 2009/0250822 | A1 | 10/2009 | Chen et al. |
| 2009/0294938 | A1 * | 12/2009 | Chen ............... 257/676 |
| 2009/0314538 | A1 | 12/2009 | Jomaa et al. |
| 2010/0052111 | A1 | 3/2010 | Urakawa |
| 2010/0102428 | A1 | 4/2010 | Lee et al. |
| 2010/0182040 | A1 | 7/2010 | Feng et al. |
| 2010/0244272 | A1 | 9/2010 | Lee et al. |
| 2010/0244278 | A1 | 9/2010 | Shen |
| 2010/0295166 | A1 | 11/2010 | Kim |
| 2010/0301466 | A1 | 12/2010 | Taoka et al. |
| 2010/0327457 | A1 | 12/2010 | Mabuchi |
| 2011/0042824 | A1 | 2/2011 | Koide |
| 2011/0193178 | A1 | 8/2011 | Chang et al. |
| 2011/0193226 | A1 | 8/2011 | Kirby et al. |
| 2011/0254156 | A1 * | 10/2011 | Lin ............... 257/737 |
| 2012/0018863 | A1 | 1/2012 | Oganesian et al. |
| 2012/0020026 | A1 | 1/2012 | Oganesian et al. |

FOREIGN PATENT DOCUMENTS

| | | |
|---|---|---|
| JP | 2004-063767 A | 2/2004 |
| JP | 2008-198841 A | 8/2008 |
| JP | 3143893 U | 8/2008 |

(56) References Cited

FOREIGN PATENT DOCUMENTS

| | | | |
|---|---|---|---|
| JP | 2010-098098 | A | 4/2010 |
| KR | 2001-0002214 | A | 1/2001 |
| KR | 2005-0119414 | A | 12/2005 |
| KR | 2006-0120365 | A | 11/2006 |
| KR | 2007-0088177 | A | 8/2007 |
| KR | 2009-0008341 | A | 1/2009 |
| KR | 2009-0086314 | A | 8/2009 |
| TW | M338433 | U | 8/2008 |
| WO | 2010120310 | A1 | 10/2010 |

OTHER PUBLICATIONS

U.S. Appl. No. 13/306,300, filed Nov. 29, 2011.
U.S. Appl. No. 13/346,201, filed Jan. 9, 2012.
U.S. Appl. No. 13/080,876, filed Apr. 6, 2011.
U.S. Appl. No. 13/306,068, filed Nov. 29, 2011.
U.S. Appl. No. 13/346,185, filed Jan. 9, 2012.
U.S. Appl. No. 13/337,565, filed Dec. 27, 2011.
U.S. Appl. No. 13/440,313, filed Apr. 5, 2012.
U.S. Appl. No. 13/440,212, filed Apr. 5, 2012.
U.S. Appl. No. 13/439,286, filed Apr. 5, 2012.
U.S. Appl. No. 13/354,747, filed Jan. 20, 2012.
U.S. Appl. No. 13/354,772, filed Jan. 20, 2012.
Kang, et al., 8Gb 3D DDR3 DRAM Using Through-Silicon-Via Technology, IEEE, International Solid-State Circuits Conference, 2009, pp. 130-132.
U.S. Appl. No. 13/337,575, filed Dec. 27, 2011.
U.S. Appl. No. 13/440,515, filed Apr. 5, 2012.
Sandforce, "SF-2200 & SF-2100 Client SSD Processors", 2011.
U.S. Appl. No. 13/439,299, filed Apr. 4, 2012.
U.S. Appl. No. 13/439,354, filed Apr. 4, 2012.
U.S. Appl. No. 13/439,273, filed Apr. 4, 2012.
U.S. Appl. No. 13/439,228, filed Apr. 4, 2012.
U.S. Appl. No. 13/440,299, filed Apr. 5, 2012.
U.S. Appl. No. 13/440,290, filed Apr. 5, 2012.
U.S. Appl. No. 13/440,199, filed Apr. 5, 2012.
U.S. Appl. No. 13/440,280, filed Apr. 5, 2012.
Elpida User's Manual, "Introduction to GDDR5 SGRAM", Document No. E1600E10 (Ver. 1.0), Published Mar. 2010, Japan, URL: http:'www.elpida.com.
Hynix, "2GB (64Mx32) GDDR5 SGRAM HRGQ2H24AFR", Nov. 2011-Feb. 2012.
Partial International Search Report dated Oct. 26, 2012 in International Patent Appl. No. PCT/US2012/046049.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
International Search Report and Written Opinion for Application No. PCT/US2012/046049 dated Jan. 10, 2013.
International Search Report and Written Opinion for Application No. PCT/US2012/046049 dated Nov. 29, 2012.
Partial Search Report for Application No. PCT/US2012/057170 dated Jan. 31, 2013.
Partial Search Report for Application No. PCT/US2012/057554 dated Jan. 24, 2013.
Partial Search Report for Application No. PCT/US2012/058273 dated Jan. 24, 2013.
US Amendment for U.S. Appl. No. 13/439,299 dated Jan. 18, 2013.
US Non Final Office Action dated Oct. 18, 2012 for U.S. Appl. No. 13/439,299.
International Search Report and Written Opinion for Application No. PCT/US2012/058398 dated Jul. 4, 2013.
International Search Report and Written Opinion for Application No. PCT/US2012/058434 dated Jun. 21, 2013.
International Search Report and Written Opinion for Application No. PCT/US2012/057895 dated Jun. 10, 2013.
International Search Report and Written Opinion for Application No. PCT/US2012/058229 dated Jul. 3, 2013.
International Search Report and Written Opinion for Application No. PCT/US2012/057204 dated Aug. 30, 2013.
International Search Report and Written Opinion for Application No. PCT/US2012/057810 dated Jul. 23, 2013.
International Search Report for Application No. PCT/US2012/057173 dated Aug. 5, 2013.
International Search Report for Application No. PCT/US2012/057905 dated Aug. 20, 2013.
International Search Report and Written Opinion dated Mar. 21, 2013 for Application No. PCT/US2012/000425.
International Search Report and Written Opinion dated Mar. 21, 2013 for Application No. PCT/US2012/057911.
International Search Report and Written Opinion for Application No. PCT/US2012/046249 dated Mar. 20, 2013.
International Search Report and Written Opinion for Application No. PCT/US2012/046255 dated Mar. 20, 2013.
International Search Report and Written Opinion for Application No. PCT/US2012/057170 dated Mar. 22, 2013.
International Search Report and Written Opinion for Application No. PCT/US2012/057179 dated Apr. 4, 2013.
International Search Report and Written Opinion for Application No. PCT/US2012/057200 dated Mar. 1, 2013.
International Search Report and Written Opinion for Application No. PCT/US2012/057554 dated Feb. 28, 2013.
International Search Report and Written Opinion for Application No. PCT/US2012/057563 dated Mar. 5, 2013.
International Search Report and Written Opinion for Application No. PCT/US2012/058273 dated Mar. 6, 2013.
International Search Report and Written Opinion for Application No. PCT/US2012/058407 dated Mar. 28, 2013.
International Search Report and Written Opinion for Application No. PCT/US2012/058423 dated Mar. 20, 2013.
International Search Report and Written Opinion for Application No. PCT/US2012/058557 dated Mar. 12, 2013.
Partial Search Report for Application No. PCT/US2012/000425 dated Jan. 30, 2013.
Partial Search Report for Application No. PCT/US2012/058557 dated Feb. 4, 2013.

* cited by examiner

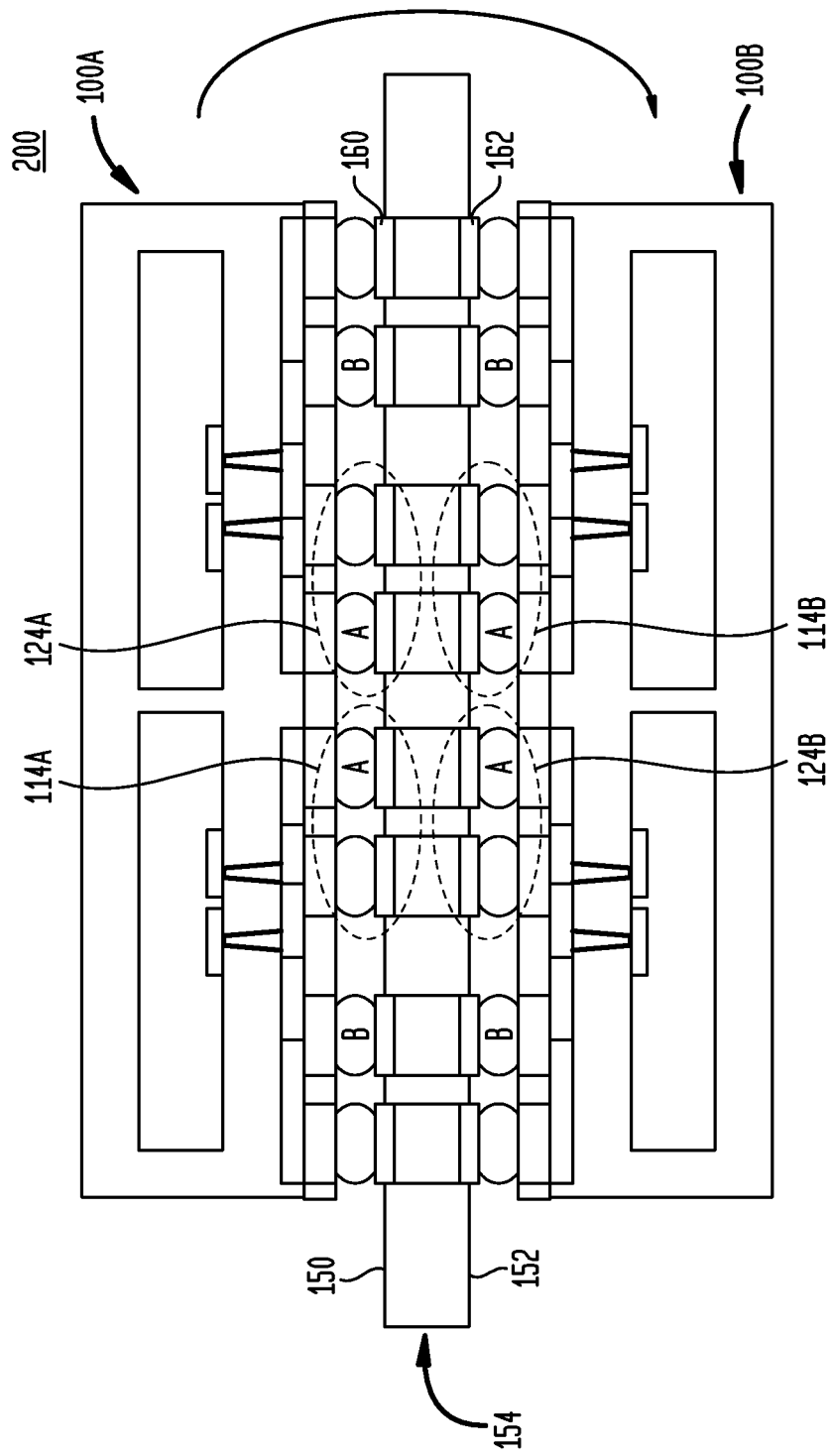

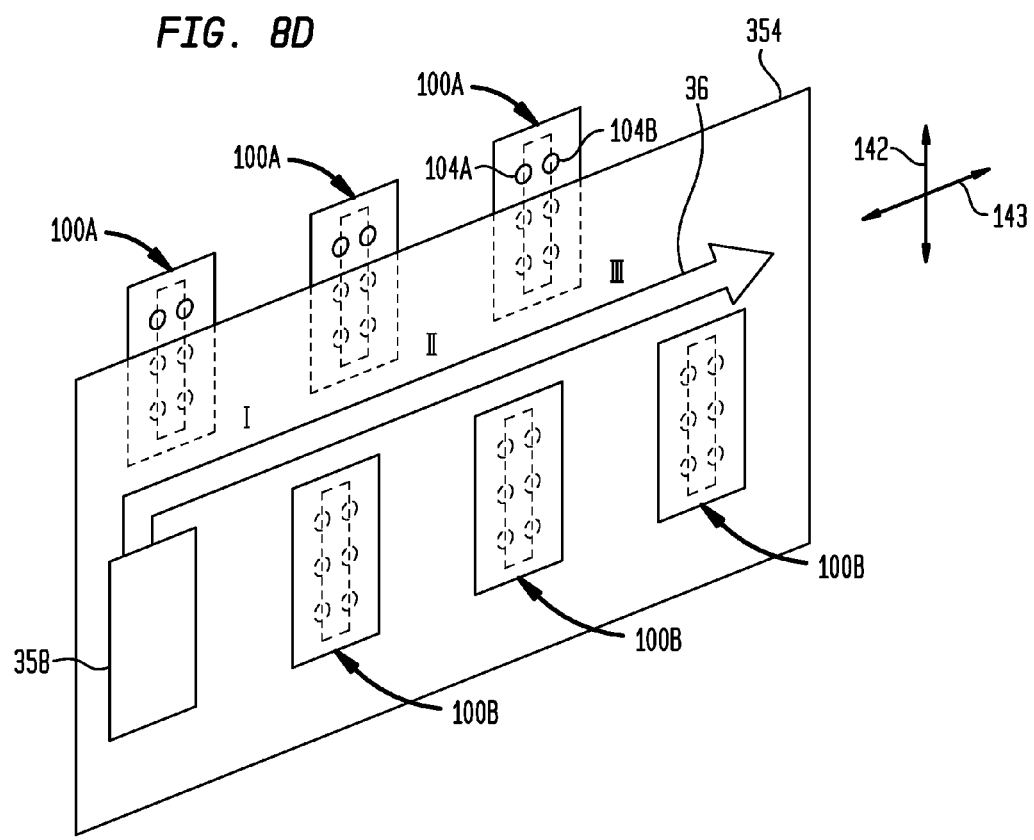

STUB MINIMIZATION USING DUPLICATE SETS OF SIGNAL TERMINALS IN ASSEMBLIES WITHOUT WIREBONDS TO PACKAGE SUBSTRATE

RELATED APPLICATIONS

The present application claims the benefit of the filing date of U.S. Provisional Patent Application Nos. 61/542,488, 61/542,495, and 61/542,553, all filed Oct. 3, 2011, and 61/600,483, filed Feb. 17, 2012, the disclosures of which are hereby incorporated herein by reference.

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

In "flip chip" designs, the front face of the chip confronts the face of a package dielectric element, i.e., substrate of the package, and the contacts on the chip are bonded directly to contacts on the face of the substrate by solder bumps or other connecting elements. In turn, the substrate can be bonded to a circuit panel through the external terminals that overlie the substrate. The "flip-chip" design provides a relatively compact arrangement. Some flip-chip packages are commonly referred to as "chip-scale packages" in which each package occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference. Certain innovative mounting techniques offer compactness approaching or equal to that of conventional flip-chip bonding.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips, are commonly packaged in single- or multiple-chip packages and assemblies. Each package has many electrical connections for carrying signals, power, and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds that extend in both horizontal and vertical directions relative to the surface of the chip.

Conventional microelectronic packages can incorporate a microelectronic element that is configured to predominantly provide memory storage array function, i.e., a microelectronic element that embodies a greater number of active devices to provide memory storage array function than any other function. The microelectronic element may be or include a DRAM chip, or a stacked electrically interconnected assembly of such semiconductor chips. Typically, all of the terminals of such package are placed in sets of columns adjacent to one or more peripheral edges of a package substrate to which the microelectronic element is mounted.

For example, in one conventional microelectronic package 12 seen in FIG. 1, three columns 14 of terminals can be disposed adjacent a first peripheral edge 16 of the package substrate 20 and three other columns 18 of terminals can be disposed adjacent a second peripheral edge 22 of the package substrate 20. A central region 24 of the package substrate 20 in the conventional package does not have any columns of terminals. FIG. 1 further shows a semiconductor chip 11 within the package having element contacts 26 on a face 28 thereof which are electrically interconnected with the columns 14, 18 of terminals of the package 12 through wire bonds 30 extending through an aperture, e.g., bond window, in the central region 24 of package substrate 20. In some cases, an adhesive layer 32 may be disposed between the face 28 of the microelectronic element 11 and the substrate 20 to reinforce the mechanical connection between the microelectronic element and the substrate, with the wire bonds extending through an opening in the adhesive layer 32.

In light of the foregoing, certain improvements in the positioning of terminals on microelectronic packages can be made in order to improve electrical performance, particularly in assemblies which include such packages and a circuit panel to which such packages can be mounted and electrically interconnected with one another.

BRIEF SUMMARY OF THE INVENTION

In accordance with an aspect of the invention, a microelectronic package can include a microelectronic element having a face and a plurality of element contacts thereon, a substrate having first and second opposed surfaces, and a plurality of terminals on the second surface configured for connecting the microelectronic package with at least one component external to the package. The microelectronic element can embody a greater number of active devices to provide memory storage array function than any other function. The substrate can have a set of substrate contacts on the first surface facing the element contacts of the microelectronic element and joined thereto.

The terminals can be electrically connected with the substrate contacts and can include first terminals arranged at positions within first and second parallel grids. The first terminals of each of the first and second grids can be configured to carry address information usable by circuitry within the microelectronic package to determine an addressable memory location from among all the available addressable memory locations of a memory storage array within the microelectronic element. The signal assignments of the first terminals in the first grid can be a mirror image of the signal assignments of the first terminals in the second grid.

In an exemplary embodiment, the first terminals of each of the first and second grids can be configured to carry all of the address information usable by the circuitry within the microelectronic package to determine the addressable memory location. In one example, the first terminals of each of the first and second grids can be configured to carry information that controls an operating mode of the microelectronic element. In a particular embodiment, the first terminals of each of the first and second grids can be configured to carry all of the command signals transferred to the microelectronic package, the command signals being write enable, row address strobe, and column address strobe signals.

In one embodiment, the first terminals of each of the first and second grids can be configured to carry clock signals transferred to the microelectronic package, the clock signals being clocks used for sampling signals carrying the address information. In a particular example, the first terminals of each of the first and second grids can be configured to carry all of the bank address signals transferred to the microelectronic package. In one example, the element contacts can include redistribution contacts exposed at the front face of the microelectronic element. Each redistribution contact can be electrically connected with a contact pad of the microelectronic element through at least one of a trace or a via. In an exemplary embodiment, the signal assignments of the first terminals in the first and second grids can be symmetric about an axis between the first and second grids. The axis can be equidistant from first and second opposed edges of the substrate.

In a particular example, the columns of terminals in the first and second grids can extend in a direction parallel to first and second opposed edges of the substrate. The signal assignments of the first terminals in the first and second grids can be symmetric about an axis between the first and second grids. The axis may be not more than a distance of three and one-half times a minimum pitch between any two adjacent columns of the first terminals from a line parallel to and equidistant from the first and second edges of the substrate. In one embodiment, a column axis which extends through centers of a majority of the terminals of a particular column containing at least some first terminals may not extend through the center of one or more of the terminals of such column.

In one example, the column axis may not extend through at least one of the one or more non-centered terminals of the column. In a particular embodiment, each of the first and second grids can include first and second parallel columns of the first terminals. In an exemplary embodiment, at least one of the first or second grids can include at least one terminal between the first and second parallel columns of such grid. In one embodiment, the terminals can include second terminals. At least some of the second terminals can be configured to carry information other than the address information. In a particular example, the second terminals can be disposed at positions on the second surface other than in the first and second grids. In one example, at least some of the second terminals can be disposed within the first and second grids.

In a particular embodiment, one portion of the second terminals can be arranged in a third grid and another portion of the second terminals can be arranged in a fourth grid. Columns of terminals in the third and fourth grids can be parallel to one another and to columns of terminals in the first and second grids. The signal assignments of the second terminals in the third grid can be a mirror image of the signal assignments of the second terminals in the fourth grid. In one example, the first and second grids can separate the third and fourth grids from one another.

In an exemplary embodiment, one portion of the second terminals can be arranged in a fifth grid and another portion of the second terminals can be arranged in a sixth grid. Columns of terminals in the fifth and sixth grids can be parallel to one another and can extend in a second direction transverse to a first direction in which columns of terminals in the first and second terminals extend. The signal assignments of the second terminals in the fifth grid can be symmetric about an axis between the first and second grids, and the signal assignments of the second terminals in the sixth grid can be symmetric about the axis between the first and second grids. The axis can be equidistant from first and second opposed edges of the substrate. In one example, the at least one component external to the package can be a circuit panel. In a particular example, the microelectronic package can also include a buffer chip having a surface facing the first surface of the substrate. The buffer chip can be electrically connected with the first terminals of at least one of the first and second grids. The buffer chip can be configured to regenerate at least some of the address information received at the first terminals and output the regenerated signals to the microelectronic element.

In one embodiment, the microelectronic element can be a first microelectronic element and the set of substrate contacts can be a first set of substrate contacts. The microelectronic package can also include a second microelectronic element having a face and a plurality of element contacts thereon. The second microelectronic element can embody a greater number of active devices to provide memory storage array function than any other function. The substrate can have a second set of substrate contacts on the first surface facing the element contacts of the second microelectronic element and joined thereto. The terminals can be electrically connected with the second set of substrate contacts. The first terminals of each of the first and second grids can be configured to carry address information usable by circuitry within the microelectronic package to determine an addressable memory location from among all the available addressable memory locations of a memory storage array within the first and second microelectronic elements.

In a particular example, the faces of the first and second microelectronic elements can be arranged in a single plane parallel to the first surface of the substrate. In one embodiment, the first terminals of the first grid can be electrically connected with the first microelectronic element and the first terminals of the second grid can be electrically connected with the second microelectronic element. In a particular embodiment, the first terminals of the first and second grids can be electrically connected with each of the first and second microelectronic elements.

In one example, the first terminals of the first grid can be electrically connected with the first microelectronic element and may not be electrically connected with the second microelectronic element. The first terminals of the second grid can be electrically connected with the second microelectronic element and are may not be electrically connected with the first microelectronic element. In an exemplary embodiment, the substrate can include a dielectric element having a coefficient of thermal expansion ("CTE") in the plane of the dielectric element of less than 30 parts per million per degree Celsius ("ppm/° C."). In one example, the substrate can include an element having a CTE of less than 12 ppm/° C.

In accordance with another aspect of the invention, a microelectronic package can include a microelectronic element having a face and a plurality of element contacts thereon, a substrate having first and second opposed surfaces, and a plurality of terminals on the second surface configured for connecting the microelectronic package with at least one component external to the package. The microelectronic element can embody a greater number of active devices to provide memory storage array function than any other function. The substrate can have a set of substrate contacts on the first surface facing the element contacts of the microelectronic element and joined thereto.

The terminals can be electrically connected with the substrate contacts and can include first terminals arranged at positions within first and second parallel grids. The first terminals of each of the first and second grids can be configured to carry a majority of the address information usable by circuitry within the microelectronic package to determine an addressable memory location from among all the available addressable memory locations of a memory storage array within the microelectronic element. The signal assignments of the first terminals in the first grid can be a mirror image of the signal assignments of the first terminals in the second grid. In a particular embodiment, the first terminals of each of the first and second grids can be configured to carry at least three-quarters of the address information usable by the circuitry within the microelectronic package to determine the addressable memory location.

BRIEF DESCRIPTION OF THE DRAWINGS

FIG. 5A is a fragmentary view showing an alternate arrangement of terminals for a portion of FIG. 5.

FIG. 8A is a sectional view illustrating a microelectronic assembly and first and second microelectronic packages electrically interconnected therewith in accordance with an embodiment of the invention.

FIG. 8D is a schematic diagram illustrating a microelectronic assembly including a circuit panel and microelectronic packages electrically connected thereto, e.g., a memory module, among others, according to an embodiment of the invention.

DETAILED DESCRIPTION

Figure 1:
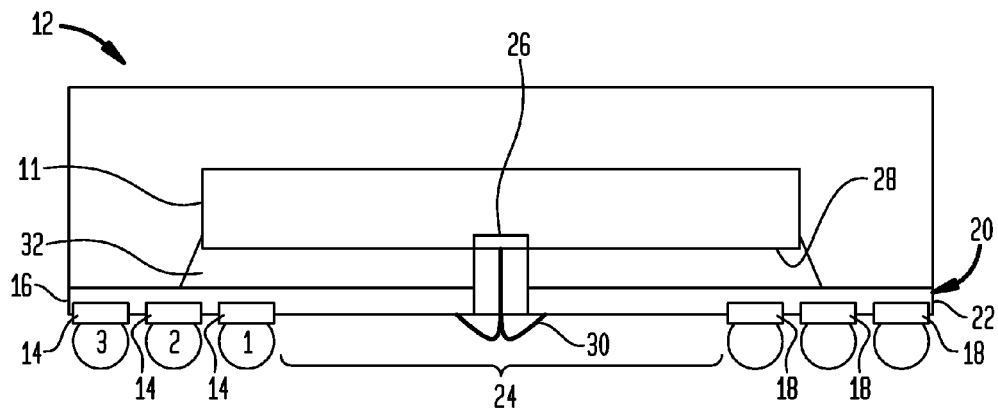
FIG. 1 is a sectional view illustrating a conventional microelectronic package containing a DRAM chip.

In view of the illustrative conventional microelectronic package 12 described relative to FIG. 1, the inventors have recognized improvements which can be made that may help improve the electrical performance of a microelectronic package incorporating a memory storage array chip, and a microelectronic assembly that incorporates such microelectronic package.

Figure 2:
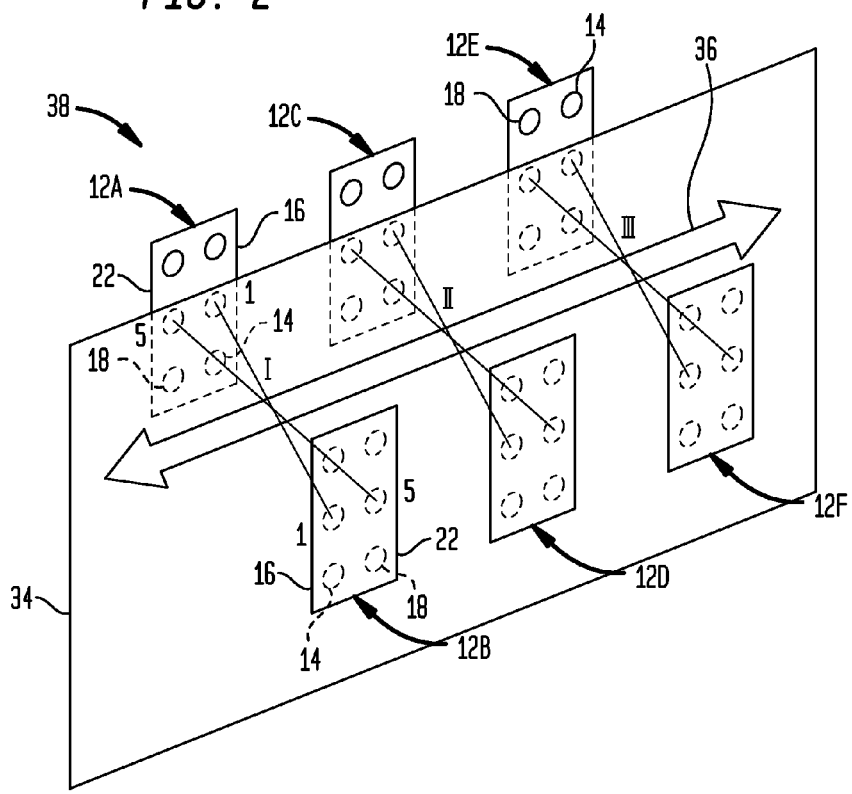
FIG. 2 is a diagrammatic schematic diagram illustrating a microelectronic assembly, e.g., a DIMM module, incorporating a circuit panel and a plurality of microelectronic packages mounted opposite one another to first and second opposite surfaces thereof.
Figure 3:
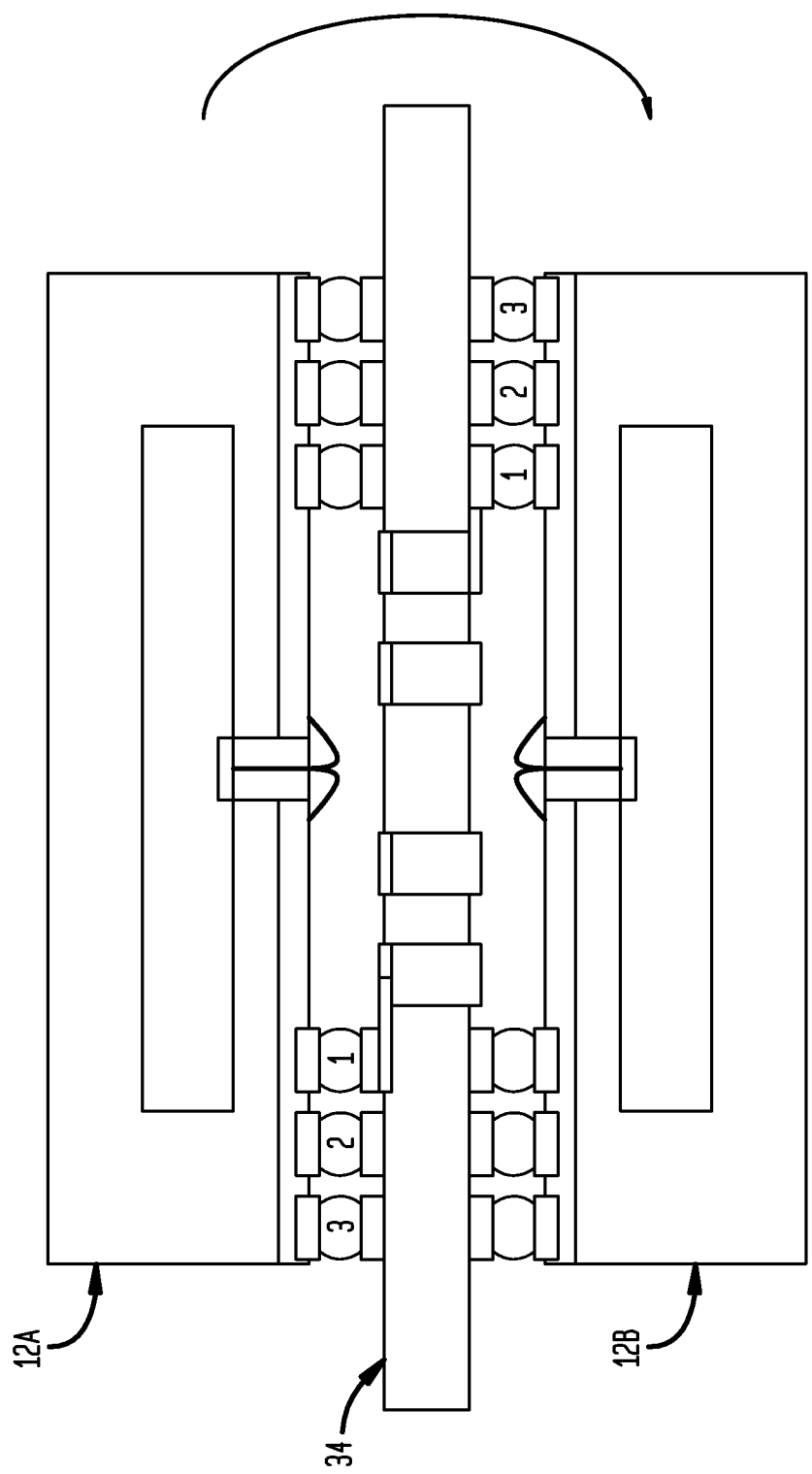
FIG. 3 is a sectional view further illustrating an electrical interconnection between first and second microelectronic packages and a circuit panel in an assembly such as shown in FIG. 2.
Figure 4:
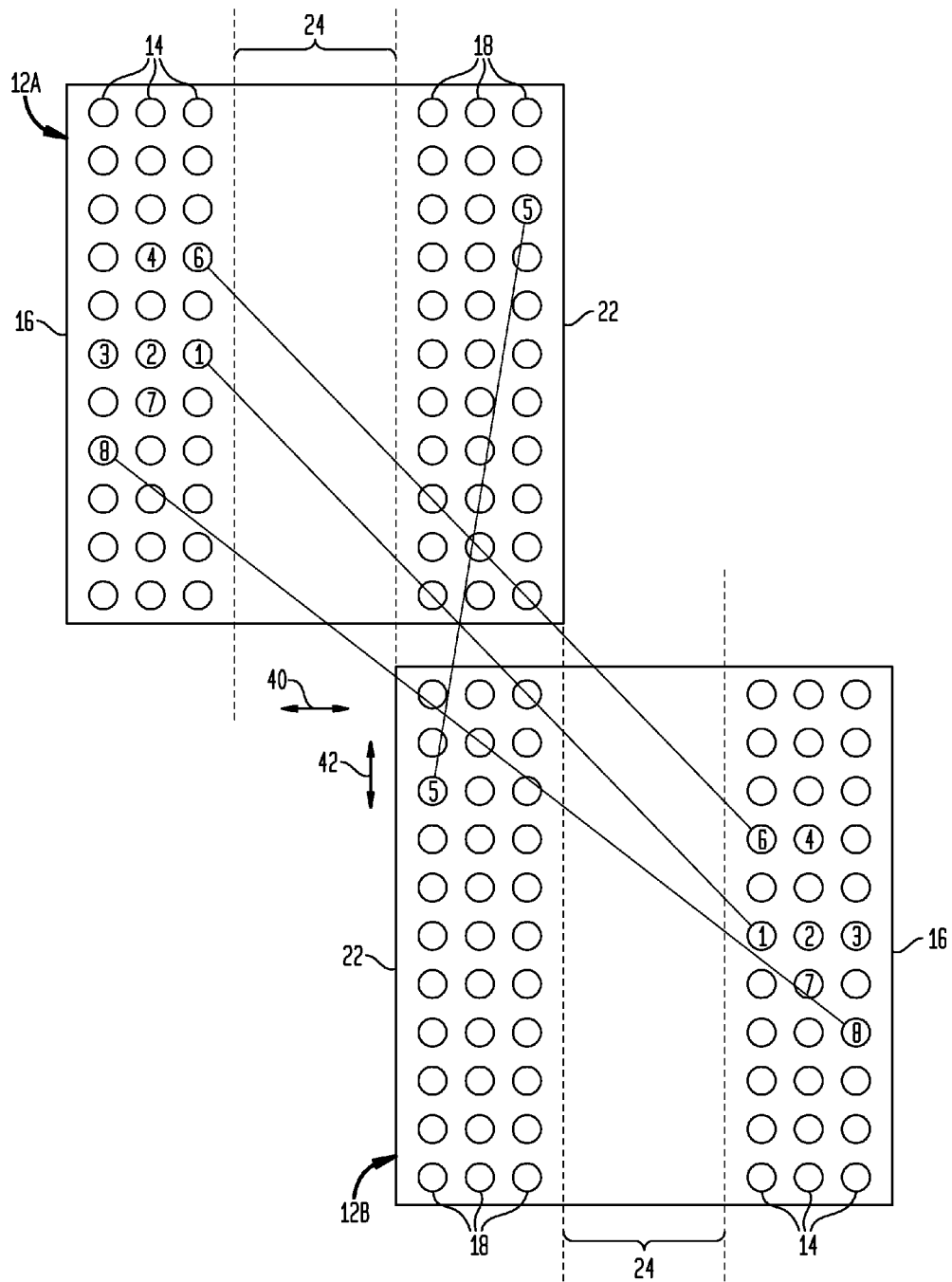
FIG. 4 is a diagrammatic plan view further illustrating the electrical interconnection between first and second microelectronic packages in an assembly such as shown in FIG. 2.

Improvements can be made particularly for use of a microelectronic package when provided in an assembly such as shown in FIGS. 2-4, in which a package 12A is mounted to a surface of a circuit panel with another like package 12B mounted opposite thereto on an opposite surface of the circuit panel. The packages 12A, 12B typically are functionally and mechanically equivalent to one another. Other pairs 12C and 12D; and 12E and 12F, of functionally and mechanically equivalent packages typically are also mounted to the same circuit panel 34. The circuit panel and the packages assembled thereto may form a portion of an assembly commonly referred to as a dual in-line memory module ("DIMM"). The packages in each oppositely mounted pair of packages, e.g., packages 12A, 12B, connect to contacts on opposite surfaces of the circuit panel so that the packages in each pair overlie one another typically by more than 90% of their respective areas. Local wiring within the circuit panel 34 connects terminals, e.g., the terminals labeled "1" and "5" on each package to global wiring on the circuit panel. The global wiring includes the signal conductors of a bus 36 used to conduct some signals to connection sites on the circuit panel 34 such as sites I, II and III. For example, the packages 12A, 12B are electrically connected to the bus 36 by local wiring coupled to a connection site I, the packages 12C, 12D are electrically connected to the bus by local wiring coupled to connection site II, and the packages 12E, 12F are electrically connected to the bus by local wiring coupled to connection site III.

The circuit panel 34 electrically interconnects the terminals of the respective packages 12A, 12B using local interconnect wiring that appears similar to a crisscross or "shoelace" pattern in which a terminal labeled "1" near one edge of package 12A connects through the circuit panel 34 to a terminal labeled "1" of package 12B near the same edge 16 of package 12B. However, the edge 16 of package 12B as assembled to circuit panel 34 is far from the edge 16 of package 12A. FIGS. 2-4 further shows that a terminal labeled "5" near an edge 22 of package 12A is connected through the circuit panel 34 to a terminal labeled "5" of package 12B near the same edge 22 of package 12B. In assembly 38 the edge 22 of package 12A is far from the edge 22 of package 12B.

Connections through the circuit panel between terminals on each package, e.g., the package 12A, to the corresponding terminals on the package mounted opposite thereto, i.e., the package 12B, are fairly long. As further seen in FIG. 3, in such assembly of like microelectronic packages 12A, 12B, the circuit panel 34 may electrically interconnect a signal conductor of the bus 36 with the terminal of package 12A marked "1" and the corresponding terminal of package 12B marked "1", when the same signal from the bus is to be transmitted to each package. Similarly, the circuit panel 34 may electrically interconnect another signal conductor of the bus 36 with the terminal of package 12A marked "2" and the corresponding terminal of package 12B marked "2". The same connection arrangement may also apply to other signal conductors of the bus and corresponding terminals of each package.

Local wiring between the bus 36 on the circuit panel 34 and each package of the respective pair of packages, e.g., packages 12A, 12B (FIG. 2) at a connection site I of the board can be in form of unterminated stubs. Such local wiring when relatively long may in some cases impact the performance of the assembly 38 as discussed below. Moreover, the circuit panel 34 also requires local wiring to electrically interconnect certain terminals of other packages: the pair of packages 12C and 12D, and the pair of packages 12E and 12F to the global wiring of the bus 36, and such wiring can also impact the performance of the assembly in the same way.

FIG. 4 further illustrates the interconnection between microelectronic packages 12A, 12B of respective pairs of terminals assigned to carry signals "1", "2", "3", "4", "5", "6", "7", and "8". As seen in FIG. 4, all of the columns 14, 18 of terminals are exposed near the edges 16, 22, respectively, of each package 12A, 12B, rather than in a central region 24 of the surface of the substrate, the wiring needed to traverse the circuit panel 34 in a direction 40 transverse to the direction 42 in which the columns 14, 18 of terminals extend can be quite long. In recognition that the length of a DRAM chip can be in the range of ten millimeters on each side, the length of the local wiring in a circuit panel 34 in an assembly 38 seen in FIGS. 2-4 required for some signals to route the same signal to the corresponding terminals of two oppositely mounted packages 12A, 12B can range between five and ten millimeters and may typically be about seven millimeters.

In some cases, relatively long unterminated wiring on a circuit panel which connects the terminals of a package may not severely impact the electrical performance of the assembly 38. However, when a signal is transferred from a bus 36 of the circuit panel to each of multiple pairs of packages connected to the circuit panel as shown in FIG. 2, the inventors recognize that the electrical lengths of the stubs, i.e., the local wiring, that extend from the bus 36 to the terminal connected thereto on each package potentially impacts the performance of the assembly 38. Signal reflections on the unterminated stubs can travel in the reverse direction from the connected terminals of each package back onto the bus 36, and thus degrade the signals being transferred from the bus 36 to the packages. The impacts may be tolerable for some packages containing microelectronic elements of current manufacture. However, in present or future assemblies which operate with increased signal switching frequencies, low voltage swing signals or both, the inventors recognize that the impacts can become severe. For these assemblies, settling time, ringing, jitter, or intersymbol interference of a transmitted signal may increase to an unacceptable degree.

The inventors further recognize that the electrical lengths of the unterminated stubs are usually longer than the local wiring that connects the bus 36 on the circuit panel with the terminals of the packages mounted thereto. Unterminated wiring within each package from the package terminals to the semiconductor chip therein adds to the lengths of the stubs.

In a specific example, the bus 36 is a command-address bus of an assembly having a predominant memory storage array function such as a DIMM. The command-address bus 36 can be configured to carry address information transferred to the microelectronic packages that is usable by circuitry within the packages, e.g., row address and column address decoders, and bank selection circuitry, if present, to determine an addressable memory location from among all the available addressable memory locations of a memory storage array within a microelectronic element in the packages. The command-address bus 36 can be configured to carry the above-noted address information to connection sites, e.g., sites I, II, and III shown in FIG. 2. These above-noted address information can then be distributed by local wiring to respective sets of panel contacts on opposite surfaces of the circuit panel, to which packages 12A, 12B, 12C, 12D, 12E and 12F are connected.

In a particular example, when the microelectronic element is or includes a DRAM chip, command-address bus 36 can be configured to carry all of a group of signals of a command-address bus of the microelectronic element, i.e., command signals, address signals, bank address signals and clock signals that are transferred to the microelectronic packages, wherein the command signals include write enable, row address strobe, and column address strobe signals, and the clock signals are clocks used for sampling the address signals. While the clock signals can be of various types, in one embodiment, the clock signals carried by these terminals can be one or more pairs of differential clock signals received as differential or true and complement clock signals.

Accordingly, certain embodiments of the invention described herein provide a microelectronic package configured so as to permit the lengths of stubs to be reduced when first and second such packages are mounted opposite one another on opposite surfaces of a circuit panel, e.g., a circuit board, module board or card, or flexible circuit panel. Assemblies which incorporate first and second microelectronic packages mounted opposite one another on a circuit panel can have significantly reduced stub lengths between the respective packages. Reducing the stub lengths within such assemblies can improve electrical performance, such as by reducing one or more of settling time, ringing, jitter, or intersymbol interference, among others. Moreover, it may be possible to obtain other benefits as well, such as simplifying the structure of the circuit panel or reducing the complexity and cost of designing or manufacturing the circuit panel, or for both designing and manufacturing the circuit panel.

Certain embodiments of the invention provide a package or microelectronic assembly in which a microelectronic element, e.g., a semiconductor chip, or stacked arrangement of semiconductor chips, is configured to predominantly provide a memory storage array function. In such microelectronic element, the number of active devices, e.g., transistors therein that are configured, i.e., constructed and interconnected with other devices, to provide the memory storage array function, is greater than the number of active devices that are configured to provide any other function. Thus, in one example, a microelectronic element such as a DRAM chip may have memory storage array function as its primary or sole function. Alternatively, in another example, such microelectronic element may have mixed use and may incorporate active devices configured to provide memory storage array function, and may also incorporate other active devices configured to provide another function such as processor function, or signal processor or graphics processor function, among others. In this case, the microelectronic element may still have a greater number of active devices configured to provide the memory storage array function than any other function of the microelectronic element.

The microelectronic elements have faces with a plurality of columns of element contacts on the faces. In some embodiments, the microelectronic elements are each flip-chip mounted to the substrate, such that the element contacts of the first and second microelectronic elements face respective first and second sets of substrate contacts on a first surface of a substrate and are joined thereto. In other embodiments, a microelectronic element may include a first semiconductor chip adjacent the substrate and electrically connected thereto, and one or more second semiconductor chips overlying the first semiconductor chip and electrically connected therewith that are configured to predominantly provide memory storage array function.

A plurality of terminals may be provided on the second surface of the substrate that are configured for connecting the microelectronic package with at least one component external to the package. The terminals that are electrically connected with the substrate contacts include first terminals which are arranged at positions within first and second parallel grids.

In certain embodiments of the invention, the first and second grids are configured to carry all of a group of signals of a command-address bus of the microelectronic element; i.e., command signals, address signals, bank address signals and clock signals that are transferred to the microelectronic package, wherein the command signals include write enable, row address strobe, and column address strobe signals, and the clock signals are clocks used for sampling the address signals. While the clock signals can be of various types, in one embodiment, the clock signals carried by these terminals can be one or more pairs of differential clock signals received as differential or true and complement clock signals.

On a circuit panel, e.g., a printed circuit board, module card, etc., these above-noted signals of the command-address bus: i.e., command signals, address signals, bank address signals and clock signals, can be bussed to multiple microelectronic packages that are connected thereto in parallel. Providing duplicate sets of first terminals in first and second parallel grids in which the signal assignments in one grid are a mirror image of the signal assignments in the other grid can reduce the lengths of stubs in an assembly of first and second microelectronic packages mounted opposite one another to a circuit panel.

When first and second microelectronic packages are mounted to opposite mounting surfaces of a circuit panel with the circuit panel electrically interconnecting the packages, each of the first terminals of the first grid of the first package can be aligned within a distance of one ball pitch of the corresponding first terminals of the second, mirror image grid of the second package to which they connect, i.e., the corresponding grids can be aligned within a distance of one ball pitch of one another in orthogonal x and y directions parallel to one of the mounting surfaces of the circuit panel, the ball pitch being no greater than a minimum pitch between any two adjacent parallel columns of the terminals on either package. In addition, each of the first terminals of the first grid of the second package can be so aligned within one ball pitch of the corresponding first terminals of the second, mirror image grid of the first package to which they connect. As a result, each first terminal of the first package can be electrically connected with a corresponding first terminal of the second package, with the mounting locations of each pair of terminals on the opposite circuit panel surfaces being aligned within one ball pitch of each other in orthogonal x and y directions parallel to one of the surfaces of the circuit panel.

In some cases, the mounting locations of each pair of connected terminals on the opposite circuit panel surfaces may even be coincident with one another. Accordingly, the lengths of the electrical connections through the circuit panel between pairs of electrically connected first terminals of the first and second packages can be significantly reduced, in that the terminals in each of these pairs of electrically connected first terminals may overlie one another, or at least be aligned within one ball pitch of one another in x and y orthogonal directions along the first circuit panel surface.

The circuit panel construction may also be simplified in an assembly having this construction because the routing between each electrically connected pair of first terminals can be mostly in a vertical direction, i.e., in a direction through the thickness of the circuit panel. That is, straight through via connections on the circuit panel may be all that is needed to electrically connect each pair of corresponding first terminals of the packages mounted to the opposite surfaces of the circuit panel.

Moreover, it may be possible to reduce the number of routing layers of wiring on the circuit panel required to route the signals from the above-noted signals carried by the first terminals, e.g., command-address bus signals, between connection sites where respective pairs of microelectronic packages are connected. Specifically, the number of routing layers required to route such signals along the circuit panel may in some cases be reduced to two or fewer routing layers. However, on the circuit panel, there may be a greater number of routing layers that carry other signals than the number of routing layers that carry the above-noted address or command-address bus signals.

The microelectronic package may also have second terminals other than the first terminals, such terminals typically being configured to carry signals other than the above-noted address or command-address bus signals. In one example, the second terminals can include terminals used for carrying uni-directional or bi-directional data signals to and or from the microelectronic element, and data strobe signals, as well as data masks and ODT or "on die termination" signals used to turn on or off parallel terminations to termination resistors. Signals or reference potentials such as chip select, reset, power supply voltages, e.g., Vdd, Vddq, and ground, e.g., Vss and Vssq, can be carried by the second terminals; none of the signals or reference potentials needs to be carried by the first terminals. In some embodiments, it is possible for some or all terminals configured to carry signals other than the above-noted address or command-address bus signals to be disposed as second terminals in whichever locations on the package they can be placed.

Alternatively, in some embodiments it is possible for some or all terminals which are configured to carry signals other than the above noted address or command-address bus signals to be disposed in the first grid and the second, mirror image grid of terminals on the package. In this way, it may be possible to reduce the stub lengths in the electrical connections provided on a circuit panel between corresponding terminals, as described above.

In other embodiments, some or all of the terminals which are configured to carry signals other than the above-noted address or command-address bus signals can be disposed as a set of second terminals in a third grid on the package surface, and another set of the second terminals in a fourth grid on the same package surface, in which the signal assignments of the second terminals in the third grid are a mirror image of the signal assignments of the second terminals in the fourth grid. In this way, similar to the connections between corresponding first terminals of first and second packages as described above, the lengths of the electrical connections through the circuit panel between pairs of electrically connected second terminals of the first and second packages can be significantly reduced. In an example, a pair of electrically connected second terminals may be aligned within one ball pitch of one another. In a particular example, the terminals in each of these pairs of electrically connected second terminals may overlie one another, i.e., be coincident with one another. Moreover, benefits similar to those described above for reducing stub lengths and simplifying the construction of a circuit panel for the connections between the first and second packages may be obtained when second terminals of a microelectronic package are arranged in this way.

Figure 5:
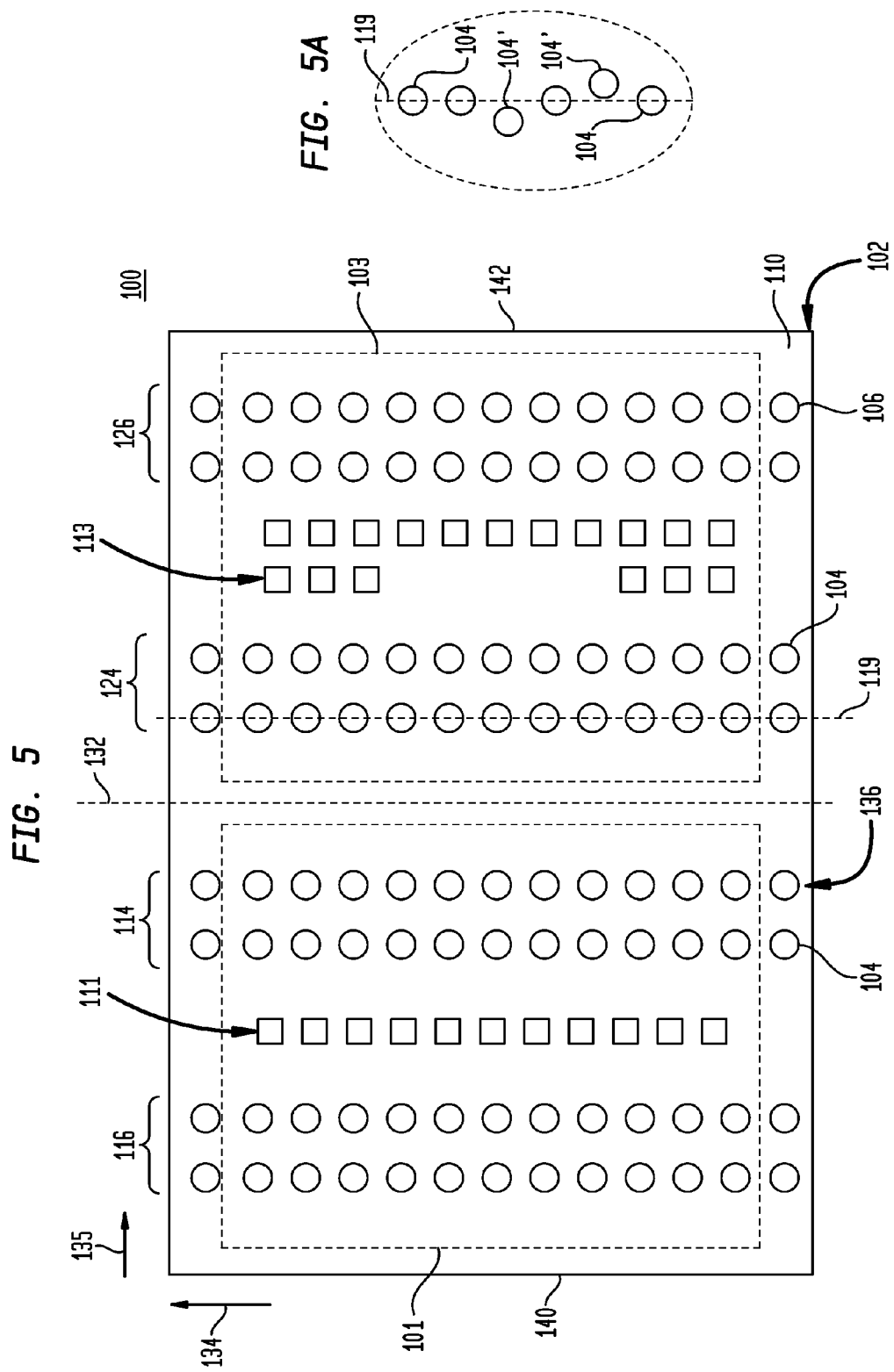
FIG. 5 is a diagrammatic plan view illustrating an arrangement and signal assignment of terminals in a microelectronic package according to an embodiment of the invention.
Figure 6:
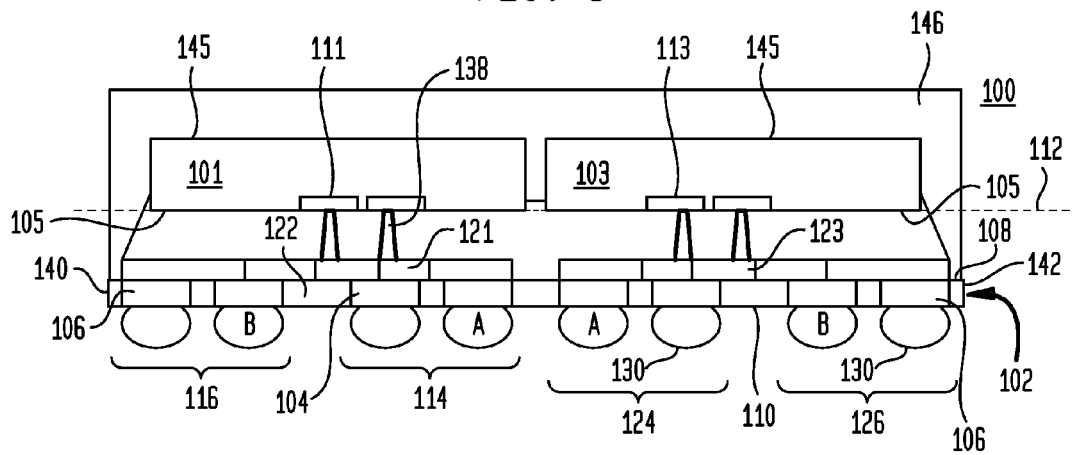
FIG. 6 is a sectional view through line 6-6 of FIG. 5 further illustrating the microelectronic package shown in FIG. 5.
Figure 7:
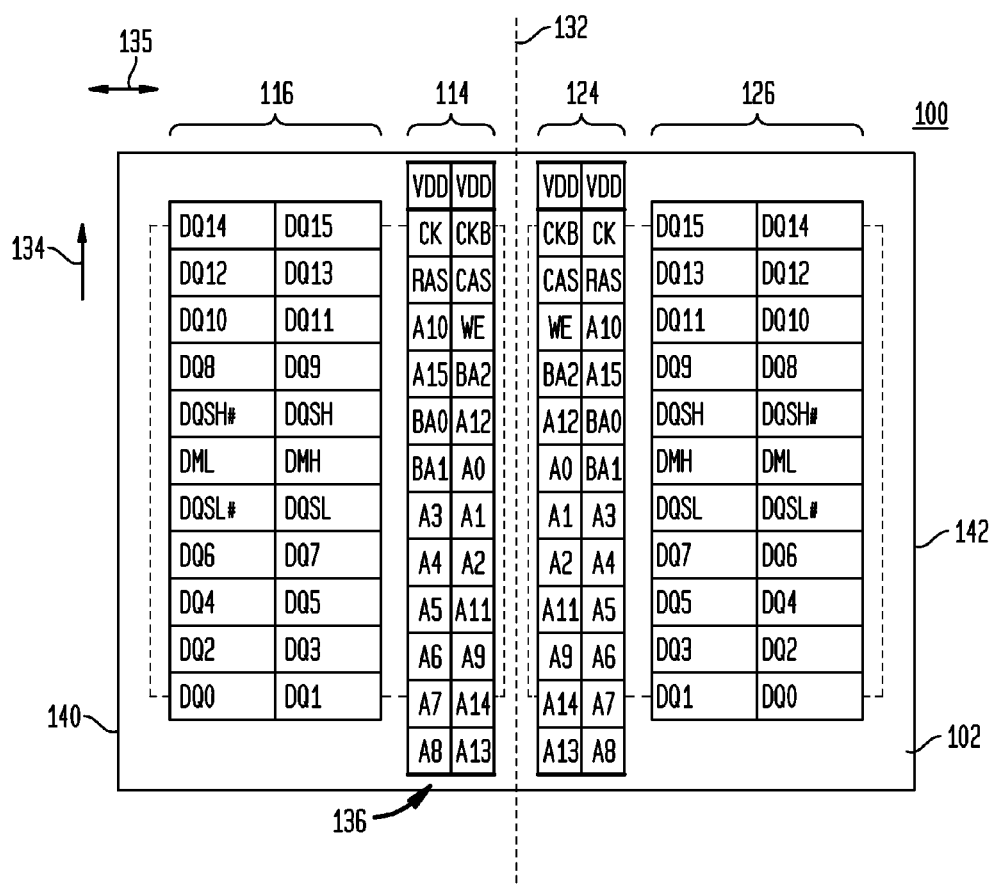
FIG. 7 is a plan view further illustrating an arrangement of terminals in accordance with the embodiment shown in FIGS. 5 and 6.

Thus, a microelectronic package 100 according to an embodiment of the invention is illustrated in FIGS. 5, 6, and 7. As seen therein, the package 100 can include first and second microelectronic elements 101, 103 each being configured to predominantly provide memory storage array function, in that each of the first and second microelectronic elements has a greater number of active devices, e.g., transistors, configured to provide memory storage array function than any other function, as indicated above.

The first and second microelectronic elements have element contacts 111, 113 at their respective faces 105. In one type of such microelectronic element 101, 103, each one of some contacts of the element contacts 111, 113 is dedicated to receiving a respective address signal of the plurality of address signals supplied to the microelectronic element. In this case, each of such contacts 111, 113 is able to receive one respective address signal of the plurality of address signals supplied to the microelectronic element 101, 103 from the outside.

In one particular example of this type of microelectronic element 101, 103, each of the plurality of address signals present at the element contacts 111, 113 can be sampled relative to an edge of a clock used by the respective microelectronic element, i.e., upon on a transition of the clock between first and second different voltage states. That is, each address signal can be sampled upon a rising transition between a lower voltage state and a higher voltage state of the clock, or upon a falling transition between a higher voltage state and a lower voltage state of the clock. Thus, the plurality of address signals may all be sampled upon the rising transition of the clock, or such address signals may all be sampled upon the falling transition of the clock, or in another example, the address signal at one of the element contacts 111, 113 can be sampled upon the rising transition of the clock and the address signal at one other external contact can be sampled upon the falling transition of the clock.

In another type of microelectronic element 101, 103 configured to predominantly provide memory storage array function, one or more of the address contacts thereon can be used in a multiplexed manner. In this example, a particular element contact 111, 113 of the respective microelectronic element 101, 103 can receive two or more different signals supplied to the microelectronic element from the outside. Thus, a first address signal can be sampled at the particular contact 111, 113 upon a first transition of the clock between the first and second different voltage states (e.g., a rising transition), and a signal other than the first address signal can be sampled at the particular contact upon a second transition of the clock (e.g., a falling transition) between the first and second voltage states that is opposite the first transition.

In such a multiplexed manner, two different signals can be received within the same cycle of the clock on the same element contact 111, 113 of the respective microelectronic element 101, 103. In a particular case, multiplexing in this manner can allow a first address signal and a different signal to be received in the same clock cycle on the same element contact 111, 113 of the respective microelectronic element 101, 103. In yet another example, multiplexing in this manner can allow a first address signal and a second different address signal to be received in the same clock cycle on the same element contact 111, 113 of the respective microelectronic element 101, 103.

The substrate 102 can include a dielectric element 122, which in some cases can consist essentially of polymeric material, e.g., a resin or polyimide, among others. Alternatively, the substrate can include a dielectric element having a composite construction such as glass-reinforced epoxy, e.g., of BT resin or FR-4 construction. In some examples, the dielectric element has a coefficient of thermal expansion in the plane of the dielectric element, i.e., in a direction parallel to a first surface 108 thereof, of up to 30 parts per million per degree Celsius (hereinafter, "ppm/° C."). In another example, the substrate can include a supporting element of material having a coefficient of thermal expansion ("CTE") of less than 12 parts per million per degree Celsius, on which the terminals and other conductive structure are disposed. For example, such low CTE element can consist essentially of glass, ceramic or semiconductor material or liquid crystal polymer material, or a combination of such materials.

As seen in FIG. 6, a first set 121 and a second set 123 of substrate contacts are disposed at a first surface 108 of the substrate, the first set 121 of substrate contacts facing the element contacts 111 of the first microelectronic element and being joined thereto at 138, such as with a bond metal, e.g., solder, tin, indium, eutectic, or gold, among others, or other conductive bond material, or possibly other structure such as a conductive bump or a micropillar, among possible structures. In some cases, a die attach adhesive or underfill may be disposed between the faces 105 of the microelectronic elements and the surface 108 of the substrate 102, which may mechanically reinforce the connection between the microelectronic elements and the substrate, and may mechanically support the joints between the microelectronic elements and the substrate.

The second set 123 of the substrate contacts face the element contacts 113 of the second microelectronic element and are joined thereto. In the embodiment as particularly shown in FIG. 6, the faces 105 of the first and second microelectronic elements 101, 103, can be arranged in a single plane 112 that is parallel to the first surface 108 of the substrate 102.

As particularly shown in FIG. 5, in some embodiments, the contacts of each microelectronic element may be arranged in a single column as shown for contacts 111, or the contacts may be arranged in a plurality of columns as shown for contacts 113. Each column may contain a contact at each vertical layout position of the column along direction 134, or a contact may be missing from one or more positions of a column, as in the case of one of the columns of contacts 113. In a particular embodiment, the contacts may be arranged in an area array over the face 105 of the microelectronic element. In another example, the contacts of a microelectronic element can be arranged in one or more sets of contacts adjacent one or more peripheral edges of the microelectronic element indicated by the dashed lines marking the boundaries of the microelectronic elements 101, 103 in FIG. 5. In a particular example, the microelectronic element can be a single semiconductor chip and the contacts 111, or 113 thereon may be "chip contacts" which are the contacts of the semiconductor chip. In another example, a particular microelectronic element can include one or more semiconductor chips each having chip contacts, and the contacts 111, or 113 may include redistribution contacts which are formed on a face 105 thereof, and which are electrically connected to the chip contacts by conductive elements such as traces and vias, for example. An example of such a microelectronic element is described below with reference to FIG. 26D. Unless otherwise noted, the "contacts" of the microelectronic elements in each of the examples herein can be arranged in any of these described ways.

The microelectronic element 101, or microelectronic element 103 or both may also include additional contacts that may not be disposed within a column of the element contacts. These additional contacts may be used for connection to power, ground, or as contacts available for contact with a probing device, such as may be used for testing.

As seen in FIG. 5, the package 100 can have first terminals 104 and second terminals 106 for electrically and mechanically connecting the package 100 with a component external to the package 100, such as a circuit panel, for example. The terminals 104, 106 can be electrically conductive pads, posts, or other electrically conductive structure. In the example seen in FIG. 6, the terminals in some cases may include joining elements 130, such as may include a bond metal such as solder, tin, indium, gold, or a eutectic material, among others, or other conductive bond material, and may in some cases also include additional structure such as a conductive bump attached to conductive structure of the substrate such as conductive pads or posts. The first terminals 104 and the second terminals 106 can be electrically connected with the substrate contacts 121, 123 through electrically conductive structure on the substrate, such as traces and vias, for example.

A first set of the first terminals 104 can be arranged at positions within a first grid 114 at a second surface 110 of the substrate 102 opposite from the first surface 108. A second set of the first terminals 104 can be arranged at positions within a second grid 124 at the second surface 110 of the substrate. Although, in some of the figures, the first and second grids are shown extending beyond the outer boundaries of the front surface of the microelectronic elements, that need not be the case. In certain embodiments of the invention, each of the first and second grids 114, 124 of first terminals can be configured to carry certain signals of the command-address bus, that is, specifically all of a set of address signals of microelectronic elements 101, 103 configured to provide dynamic memory storage function in a microelectronic package 100.

For example, when the microelectronic elements 101, 103 include or are DRAM semiconductor chips, each of the first and second grids 114, 124 are configured to carry sufficient address information transferred to the microelectronic package 100 that is usable by circuitry within the package, e.g., row address and column address decoders, and bank selection circuitry, if present, to determine an addressable memory location from among all the available addressable memory locations of a memory storage array within a microelectronic element in the package. In a particular embodiment, each of the first and second grids 114, 124 can be configured to carry all the address information used by such circuitry within the microelectronic package 100 to determine an addressable memory location within such memory storage array.

In a variation of such embodiment, each of the first and second grids 114, 124 can be configured to carry a majority of the address information that is used by such circuitry within the microelectronic package 100 to determine an addressable memory location within such memory storage array, and then other terminals such as at least some of the above-referenced second terminals 106 on the microelectronic package would then be configured to carry the remaining part of the address information. In such variation, in a particular embodiment, each of the first and second grids 114, 124 are configured to carry three-quarters or more of the address information that is used by such circuitry within the microelectronic package 100 to determine an addressable memory location within such memory storage array.

In a particular embodiment, each of the first and second grids 114, 124 may not be configured to carry chip select information, e.g., information usable to select a particular chip within the microelectronic package 100 for access to a memory storage location within the chip. In another embodiment, at least one of the first and second grids 114, 124 may indeed carry chip select information.

Typically, when the microelectronic elements 101, 103 in the microelectronic package 100 include DRAM chips, the address signals in one embodiment can include all address signals that are transferred to the package from a component external to the package, e.g., a circuit panel such as the circuit panel 154 described below, which are used for determining a random access addressable memory location within the microelectronic package for read access thereto, or for either read or write access thereto.

At least some of the second terminals 106 can be configured to carry signals other than the address signals that are carried by the first terminals 104 of the first and second grids 114, 124. Signals or reference potentials such as chip select, reset, power supply voltages, e.g., Vdd, Vddq, and ground, e.g., Vss and Vssq, can be carried by the second terminals 106; none of these signals or reference potentials needs to be carried by the first terminals 104 in any of the embodiments referred to herein, unless otherwise noted.

In a particular embodiment, each of the first and second grids 114, 124 of each microelectronic package can be configured to carry information that controls an operating mode of at least one of the first and second microelectronic elements 101, 103. More specifically, each of the first and second grids 114, 124 can be configured to carry all of a particular set of command signals and/or clock signals transferred to the microelectronic package 100. In such an embodiment, the first terminals 104 can be configured to carry all of the command signals, address signals, bank address signals, and clock signals transferred to the microelectronic package 100 from an external component, wherein the command signals include row address strobe, column address strobe and write enable. In such an embodiment, a first chip in a microelectronic element having a composite structure, such as one of the microelectronic elements 901 shown in FIG. 21, for example, can be configured to regenerate the information that controls the operating mode. Alternatively, or in addition thereto, the first chip in such a composite microelectronic element can be configured to partially or fully decode the information that controls the operating mode of the microelectronic element. In such embodiment, each second chip may or may not be configured to fully decode one or more of address information, command information, or information that controls an operating mode of the microelectronic element.

In an embodiment in which one or more of the microelectronic elements are configured to provide dynamic memory storage array function, such as provided by a dynamic random access memory ("DRAM") semiconductor chip, or an assembly of DRAM chips, the command signals are write enable, row address strobe, and column address strobe signals. Other signals such as ODT (on die termination), chip select, clock enable, are not part of the command signals that need to be carried by the first and second grids 114, 124. The clock signals can be clocks used by one or more of the microelectronic elements for sampling the address signals. For example, as seen in FIG. 7, the first terminals 104 can include clock signals CK and CKB, row address strobe RAS, column address strobe CAS and write enable signals WE, as well as address signals A0 through A15 inclusive, and bank address signals BA0, BA1 and BA2.

In this embodiment, at least some of the second terminals 106 can be configured to carry signals other than the command signals, address signals, and clock signals that are carried by the first terminals 104 of the first and second grids 114, 124. Signals or reference potentials such as chip select, reset, power supply voltages, e.g., Vdd, Vddq, and ground, e.g., Vss and Vssq, can be carried by the second terminals 106; none of these signals or reference potentials needs to be carried by the first terminals 106 in any of the embodiments referred to herein, unless otherwise noted.

In another embodiment, when one or more of the microelectronic elements are configured to provide memory storage array function implemented in a technology other than for DRAM, such as NAND flash memory, for example, the particular command signals which need to be carried by the first and second grids 114, 124 can be a different set of signals other than the group of write enable, address strobe, and column address strobe signals which need to be carried in the DRAM case.

In one embodiment, at least some of the second terminals 106 that are configured to carry signals other than the address signals can be arranged at positions within the first and second grids 114, 124. In one example, at least some of the second terminals 106 that are configured to carry signals other than the command signals, address signals, and clock signals can be arranged at positions within the first and second grids 114, 124. Although particular configurations of second terminals 106 are shown in the figures, the particular configurations shown are for illustrative purposes and are not meant to be limiting. For example, the second terminals 106 can also include terminals that are configured to be connected to power or ground signals.

An arrangement of the first terminals in the first and second grids 114, 124 of the package is particularly shown in FIGS. 5-7. In one example, each grid 114, 124 may include first and second parallel columns 136 of terminals. The parallel columns 136 of terminals in each grid can be adjacent to one other. Alternatively, although not shown in FIGS. 5-7, at least one terminal may be disposed between the first and second columns of terminals. In another example, such as seen in FIG. 5A, the grids may include a column of terminals for which a column axis 119 extends through a majority of the terminals 104 of such column, i.e., is centered relative thereto. However, in such column, one or more of the terminals might not be centered relative to the column axis 119, as in the case of terminals 104'. In this case, these one or more terminals are considered part of a particular column, even though such terminal(s) might not be centered relative to axis 119 because they are closer to the axis 119 of that particular column than to the axis of any other column. The column axis 119 may extend through these one or more terminals which are not centered relative to the column axis, or, in some cases, the non-centered terminals may be farther from the column axis such that the column axis 119 may not even pass through these non-centered terminals of the column. There may be one, several or many terminals in one column or even in more than one column which are not centered with respect to a column axis of the respective column in a grid.

Moreover, it is possible for the grids of terminals to contain arrangements of terminals in groupings other than columns, such as in arrangements shaped like rings, polygons or even scattered distributions of terminals. As shown in FIG. 6, an encapsulant 146 may overlie the first surface 108 of the substrate and may contact the microelectronic elements 101, 103 therein. In some cases, the encapsulant may overlie surfaces 145 of the microelectronic elements which face away from the substrate 102.

As seen in FIG. 7, the signal assignments of the first terminals in the second grid 124 are a mirror image of the signal assignments 124 of the first terminals in the first grid 114. Stated another way, the signal assignments of the first terminals in the first and second grids are symmetric about an axis 132 between the first and second grids 114, 124, the axis 132 in this case extending in a direction 134 in which columns 136 of the first terminals extend. With the signal assignments in the second grid 124 being a mirror image of those in the first grid 114, a first terminal 104 of the first grid 114 which is assigned to carry the signal CK (clock) is in the same relative vertical position (in direction 134) within the grid as the corresponding first terminal 104 of the second grid 114 which is assigned to carry the signal CK. However, since the first grid 114 contains two columns 136 and the terminal of the first grid 114 assigned to carry the signal CK is in the left column among the two columns 136 of the first grid, the mirror image arrangement requires that the corresponding terminal of the second grid 124 assigned to carry the signal CK is in the right column 136 among the two columns of the second grid.

Another result of this arrangement is that the terminal assigned to carry the signal WE (write enable) is also in the same relative vertical position within the grid in each of the first and second grids 114, 124. However, in the first grid 114, the terminal assigned to carry WE is in the right column among the two columns 136 of the first grid, and the mirror image arrangement requires that the corresponding terminal of the second grid 124 assigned to carry the signal WE is in the left column 136 among the two columns of the second grid 124. As can be seen in FIG. 7, the same relationship applies for each first terminal in each of the first and second grids, at least for each first terminal assigned to carry a command-address bus signal as discussed above.

The axis 132 about which the signal assignments of the first terminals are symmetric can be located at various positions on the substrate. In a particular embodiment, the axis can be a central axis of the package that is located equidistant from first and second opposed edges 140, 142 of the substrate particularly when the columns 136 of the first terminals extend in a direction parallel to the edges 140, 142 and the first and second grids are disposed at locations which are symmetric about this central axis.

Alternatively, this axis of symmetry 132 can be offset in a horizontal direction 135 from the central axis that is equidistant between edges 140, 142. In one example, the axis 132 can be offset from a central axis or line that is parallel to and equidistant from the first and second edges 140, 142 of the substrate 102, the offset distance being not more than a distance of three and one-half times a minimum pitch between any two adjacent columns of the first terminals 104. In a particular embodiment, at least one column of terminals of each of the first and second grids 114, 124 can be disposed within an offset distance from a central axis or line that is parallel to and equidistant from the first and second edges 140, 142 of the substrate 102, the offset distance being a distance of three and one-half times a minimum pitch between any two adjacent columns of the first terminals 104.

In a particular example, the first terminals 104 of the first grid 114 can be electrically connected with the first microelectronic element 101, and the first terminals 104 of the second grid 124 can be electrically connected with the second microelectronic element 103. In such case, the first terminals 104 of the first grid 114 may also be not electrically connected with the second microelectronic element 103, and the first terminals 104 of the second grid 124 of the package 100 may also be not electrically connected with the first microelectronic element 101. In yet another example, the first terminals 104 of each of the first and second grids 114 can be electrically connected with each of the first and second microelectronic elements 101, 103.

As mentioned above, the second terminals 106 can be configured to carry signals other than the above-noted signals of the command-address bus. In one example, the second terminals 106 can include terminals used for carrying uni-directional or bi-directional data signals to and or from the microelectronic element, and data strobe signals, as well as data masks and ODT or "on die termination" signals used to turn on or off parallel terminations to termination resistors. Signals such as chip select, reset, clock enable, as well as reference potentials such as power supply voltages, e.g., Vdd, Vddq, or ground, e.g., Vss and Vssq, can be carried by the second terminals 106; none of the signals or reference potentials needs to be carried by the first terminals 104. In some embodiments it is possible for some or all terminals that are configured to carry signals other than the command-address bus signals to be disposed as second terminals 106 on the package, wherever they can be suitably placed. For example, some or all of the second terminals 106 can be arranged in the same grids 114, 124 on the substrate 102 in which the first terminals 104 are arranged. Some or all of the second terminals 106 may be disposed in the same column or in different columns as some or all of the first terminals 104. In some cases, one or more second terminals can be interspersed with the first terminals in the same grids or column thereof.

In a particular example, some or all of the second terminals 106 can be disposed in a third grid 116 on the second surface 110 of the substrate, and another set of the second terminals can be disposed in a fourth grid 126 on the package surface 110. In a particular case, the signal assignments of the second terminals in the third grid 116 can be a mirror image of the signal assignments of the second terminals in the fourth grid 126, in like manner to that described above for the first and second grids. The third and fourth grids 116, 126 may in some cases extend in the direction 134 in which the first and second grids extend and can be parallel to one another. The third and fourth grids may also be parallel to the first and second grids 114, 124. Alternatively, each of the third and fourth grids 116, 126 can extend in another direction 135 which is transverse to or even orthogonal to direction 134.

In one example, second surface 110 of the substrate 102 can have first and second peripheral regions adjacent to the first and second edges 140, 142, respectively, wherein a central region separates the first and second peripheral regions. In such example, the first and second grids 114, 124 can be disposed in the central region of the second surface 110, and the third and fourth grids 116, 126 can be disposed in the respective first and second peripheral regions.

FIG. 8A illustrates an assembly 200 of first and second microelectronic packages 100A, 100B, each being a microelectronic package 100 as described with reference to FIGS. 5-7 above, as mounted to opposite first and second surfaces 150, 152 of a circuit panel 154. The circuit panel can be of various types, such as a printed circuit board used in a dual-inline memory module ("DIMM") module, a circuit board or panel to be connected with other components in a system, or a motherboard, among others. The first and second microelectronic packages 100A, 100B can be mounted to corresponding contacts 160, 162 exposed at the first and second surfaces 150, 152 of the circuit panel 154.

As particularly shown in FIG. 8A, because the signal assignments of the first terminals in the second grid 124 of each package are a mirror image of the signal assignments of the first terminals in the first grid 114 of each package, when the packages 100A, 100B are mounted to the circuit panel opposite one another, each first terminal in the first grid 114A of the first package 100A is aligned with the corresponding first terminal in the second grid 124B of the second package 100B which has the same signal assignment and to which it is electrically connected. Moreover, each first terminal in the second grid 124A of the first package 100A is aligned with the corresponding first terminal in the first grid 114B which has the same signal assignment and to which it is electrically connected.

To be sure, the alignment of each pair of connected terminals can be within a tolerance, such that each pair of connected terminals can be aligned within one ball pitch of one another in orthogonal x and y directions along the first surface 150 of the circuit panel 154. Alternatively, connected terminals on opposite surfaces of the circuit panel can be coincident with one another. In a particular example, a majority of the positions of the aligned grids of the respective first and second packages 100A, 100B (e.g., the first grid 114A of the first package and the second grid 124B of the second package) can be aligned with one another in orthogonal x and y directions along the first surface 150 of the circuit panel 154.

Thus, as further shown in FIG. 8A, a particular first terminal that carries a signal marked "A" in grid 114A of the first package 100A is aligned with the corresponding first terminal of grid 124B of the second package 100B that carries the same signal "A". The same is also true regarding a particular first terminal that carries a signal marked "A" in grid 124A of the first package 100A that is aligned with the corresponding first terminal of grid 114B of the second package 100B that carries the same signal "A".

In this way, as further seen in FIG. 8A, the lengths of the electrical connections through the circuit panel between each pair of electrically connected first terminals of the first and second packages 100A, 100B can be significantly reduced, in that the terminals in each of these pairs of electrically connected second terminals may overlie one another, or at least be aligned within one ball pitch of one another. The reductions in the lengths of these electrical connections can reduce stub lengths in the circuit panel and the assembly, which can help improve the electrical performance, such as reducing settling time, ringing, jitter, or intersymbol interference, among others, for the above-noted signals which are carried by the first terminals and which are transferred to microelectronic elements in both the first and second packages. Moreover, it may be possible to obtain other benefits as well, such as simplifying the structure of the circuit panel or reducing the complexity and cost of designing or manufacturing the circuit panel.

Figure 8B:
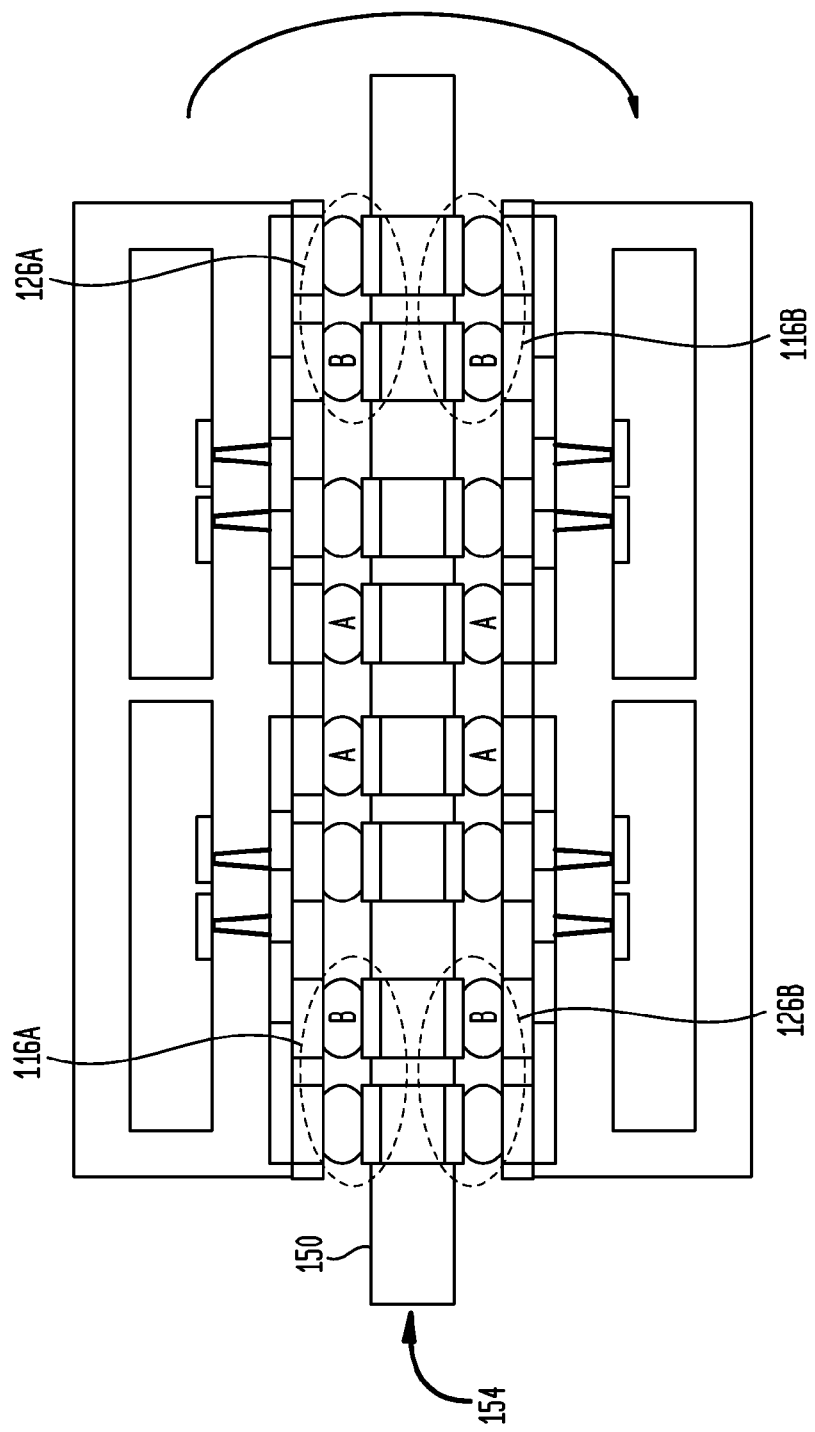
FIG. 8B is a sectional view illustrating a microelectronic assembly and first and second microelectronic packages electrically interconnected therewith in accordance with an embodiment of the invention.

As further shown in FIG. 8B, when the second terminals of each package 100A, 100B are arranged in third and fourth grids having the specific mirror image arrangement described above with respect to FIGS. 5-7, each second terminal of each package's third grid can be aligned with the corresponding second terminal of the other package's fourth grid which has the same signal assignment and to which it is electrically connected. Thus, as seen in FIG. 8B, each second terminal in the third grid 116A of the first package 100A is aligned with the corresponding first terminal in the fourth grid 126B of the second package 100B which has the same signal assignment and to which it is electrically connected. Moreover, each first terminal in the fourth grid 126A of the first package 100A is aligned with the corresponding first terminal in the third grid 116B which has the same signal assignment and to which it is electrically connected. Again, the alignment of each pair of connected terminals is within a tolerance, such that each pair of connected terminals can be aligned within one ball pitch of one another in orthogonal x and y directions along the first surface 150 of the circuit panel 154.

Thus, as further shown in FIG. 8B, a particular first terminal that carries a signal marked "B" in grid 116A of the first package 100A is aligned with the corresponding first terminal of grid 126B of the second package 100B that carries the same signal "B" and to which it is electrically connected. The same is also true regarding a particular first terminal that carries a signal marked "B" in grid 126A of the first package 100A that is aligned with the corresponding first terminal of grid 116B of the second package 100B that carries the same signal "B" and to which it is electrically connected.

Similar to the connections between corresponding first terminals 104 of first and second packages as described above, in this embodiment, the lengths of the electrical connections through the circuit panel between pairs of electrically connected second terminals 106 of the first and second packages can be significantly reduced, in that the terminals in each of these pairs of electrically connected second terminals may be coincident with one another, or at least be aligned within one ball pitch of one another in orthogonal x and y directions parallel to the circuit panel surface. As used herein, when grids of terminals of packages at opposite surfaces of a circuit panel are "coincident" with one another, the alignment can be within customary manufacturing tolerances or can be within a tolerance of less than one-half of one ball pitch of one another in x and y orthogonal directions parallel to the first and second circuit panel surfaces, the ball pitch being as described above.

Moreover, benefits similar to those described above for reducing stub lengths and simplifying the construction of a circuit panel for the connections between the first and second packages may be obtained when the second terminals of a microelectronic package are arranged in this way, i.e., terminals which can be assigned to carry signals other than the above-noted signals of the command-address bus.

Figure 8C:
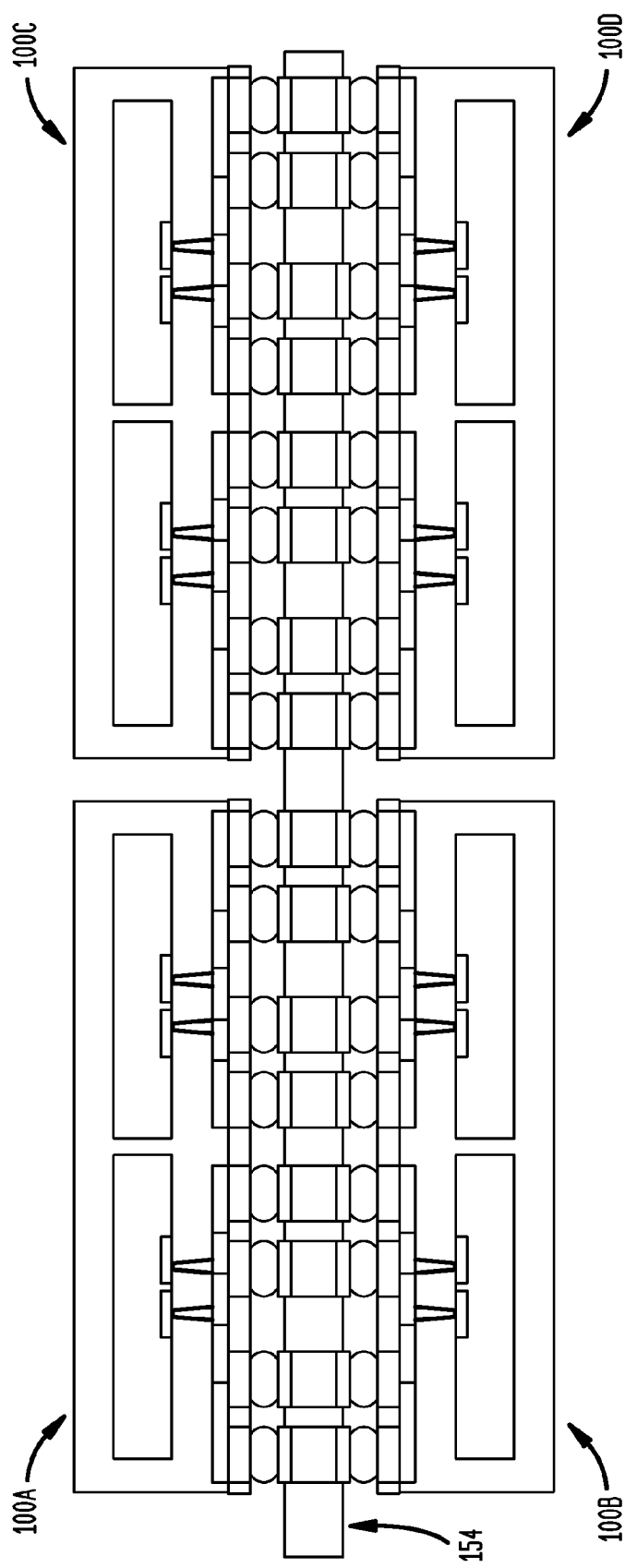
FIG. 8C is a sectional view illustrating a microelectronic assembly and four microelectronic packages electrically interconnected therewith in accordance with an embodiment of the invention.

FIG. 8C further illustrates that two, or more pairs of microelectronic packages each having a construction either as described above or hereinafter can be electrically interconnected with respective panel contacts on a circuit panel 154, e.g., a board of a dual-inline memory module ("DIMM"), in similar orientations as packages 100A, 100B. Thus, FIG. 8C shows an additional pair of packages 100C, 100D electrically interconnected with circuit panel 154 in opposite orientations facing one another as described above. In addition to packages 100A, 100B, 100C, and 100D one or more other pairs of packages may also be electrically interconnected with circuit panel, such as described above.

FIG. 8D illustrates a microelectronic assembly such as, for example, a DIMM, among others, incorporating a circuit panel and a plurality of microelectronic packages mounted opposite one another to first and second opposite surfaces thereof. As seen in FIG. 8D, the above-noted address signals or command-address bus signals can be routed on a bus 36, e.g., an address bus or command-address bus on the circuit panel or circuit board 354, in at least one direction 143 between connection sites I, II or III at which respective pairs of microelectronic packages 100A, 110B are connected to opposite sides of the circuit panel. Signals of such bus 36 reach each pair of packages at the respective connection sites I, II or III at slightly different times. The at least one direction 143 can be transverse or orthogonal to a direction 142 in which at least one column 138 of a plurality of contacts on at least one microelectronic element within each package 100A or 100B extends. In such way, the signal conductors of the bus 36 on (i.e., on or within) the circuit panel 354 can in some cases be spaced apart from one another in a direction 142 which is parallel to the at least one column 138 of contacts on a microelectronic element within a package 100A, or 100B connected to the circuit panel.

Such a configuration, particularly when the first terminals 104A, 104B of each microelectronic package are arranged in one or more columns extending in such direction 142, may help simplify the routing of signal conductors of one or more global routing layers on the circuit panel used to route the signals of the bus 36. For example, it may be possible to simplify routing of the command-address bus signals on a circuit panel when relatively few first terminals are disposed at the same vertical layout position on each package. Thus, in the example shown in FIG. 7, only four first terminals are disposed at the same vertical layout position on each package, such as the first terminals in each grid 114, 124 configured to receive address signals A3 and A1.

In one embodiment, the microelectronic assembly 354 can have a microelectronic element 358 that can include a semiconductor chip configured to perform buffering of at least some signals transferred to the microelectronic packages 100A, 100B of the assembly 354. Such a microelectronic element 358 having a buffering function can be configured to help provide impedance isolation for each of the microelectronic elements in the microelectronic packages 100A and 100B with respect to components external to the microelectronic assembly 354.

In an exemplary embodiment, the microelectronic assembly 354 can have a microelectronic element 358 that can include a semiconductor chip configured predominantly to perform a logic function, such as a solid state drive controller, and one or more of the microelectronic elements in the microelectronic packages 100A and 100B can each include memory storage elements such as nonvolatile flash memory. The microelectronic element 358 can include a special purpose processor that is configured to relieve a central processing unit of a system such as the system 1200 (FIG. 28) from supervision of transfers of data to and from the memory storage elements included in the microelectronic elements. Such a microelectronic element 358 including a solid state drive controller can provide direct memory access to and from a data bus on a motherboard (e.g., the circuit panel 1202 shown in FIG. 28) of a system such as the system 1200.

In such an embodiment of the microelectronic assembly 354 having a microelectronic element 358 that includes a controller function and/or a buffering function, the command-address bus signals can be routed between the microelectronic element 358 and each pair of packages 100A and 100B at respective connection sites I, II or III. In the particular example shown in FIG. 8D, a portion of the command-address bus 36 that extends past the connection sites I, II or III can extend in the direction 143 or in another direction transverse to the direction 143 to reach contacts of the microelectronic element 358. In one embodiment, the command-address bus 36 can extend in the direction 143 to reach contacts of the microelectronic element 358.

Figure 9:
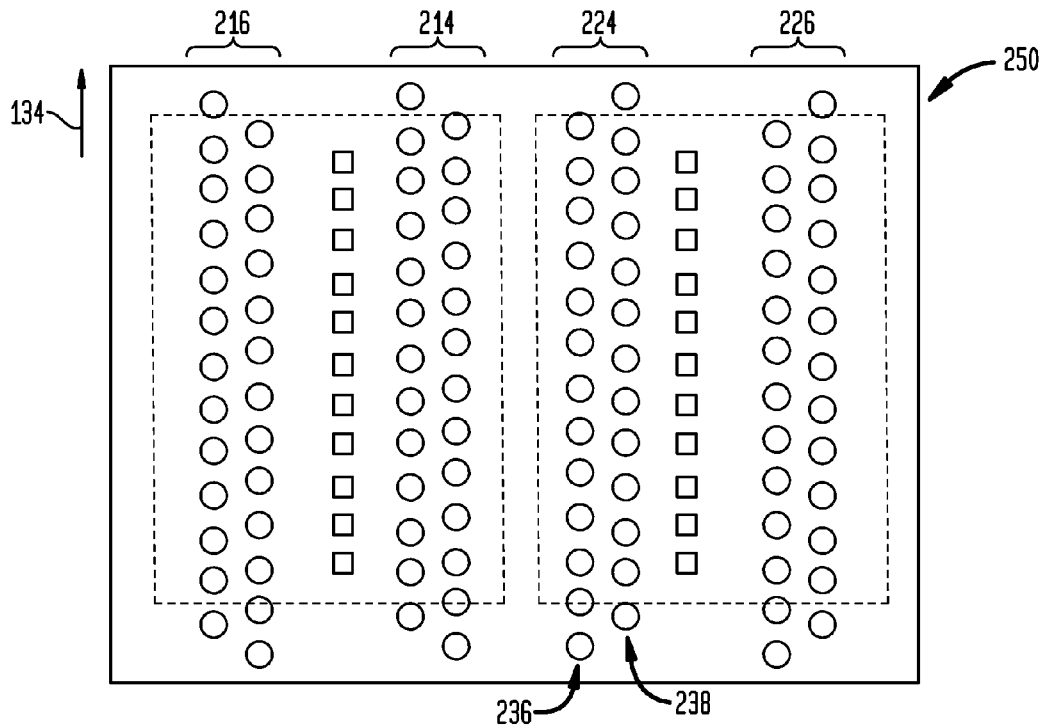
FIG. 9 is a diagrammatic plan view illustrating an arrangement and signal assignment of terminals in a microelectronic package according to an embodiment of the invention.

FIG. 9 illustrates a particular arrangement of terminals within respective first grids 214, 224, and second grids 216, 226 of the package 250, illustrating that terminals at the same relative vertical position within adjacent columns 236, 238 in each grid may in fact be disposed at positions which are somewhat offset in the vertical layout direction 134 of the package.

Figure 10:
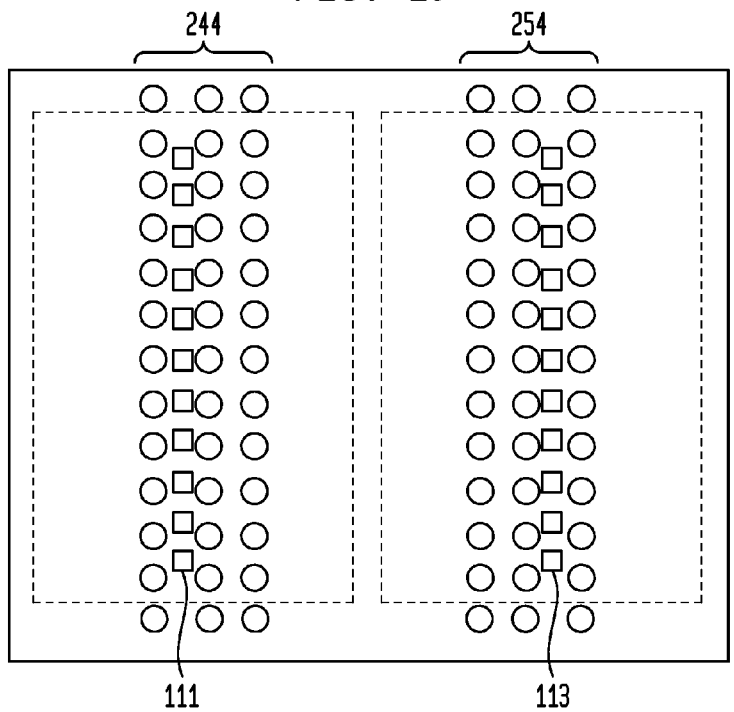
FIG. 10 is a diagrammatic plan view illustrating an arrangement and signal assignment of terminals in a microelectronic package according to an embodiment of the invention.

FIG. 10 illustrates a particular arrangement of first terminals in first and second parallel grids 244, 254, each of which can include three adjacent columns of terminals. As shown in FIG. 10, the columns may overlie portions of the faces of the microelectronic elements where the element contacts 111, 113 are disposed. As mentioned above, in some embodiments, it may be possible for signals other than the above-noted command-address bus signals to also be assigned to terminals within the same grids which carry the particular command-address bus signals. FIG. 10 illustrates one possible arrangement thereof.

In a further embodiment (not shown) which is a variation of the embodiment shown and described above relative to FIGS. 5-7, it is possible for the first terminals arranged to carry the above-noted command-address bus signals to be provided in first and second individual columns of terminals, wherein each respective individual column contains a set of first terminals configured to carry all of the above-noted command address bus signals. The first terminals can further be arranged such that the signal assignments in the first column are a mirror image of the signal assignments in the second column, in that the signal assignments are symmetric about an axis extending in the same direction as the first and second columns and between the individual columns. In this way, the signal assignments of the first terminals in the first column are the same as the signal assignments of the first terminals at the same relative vertical positions in the second column on the package.

Figure 11:
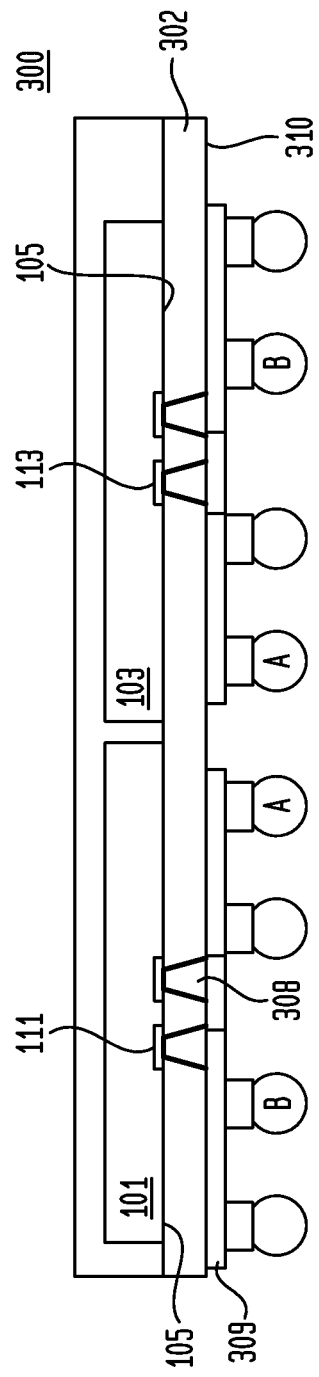
FIG. 11 is a sectional view illustrating a wafer-level microelectronic package according to a variation of the embodiment shown in FIGS. 5-7.

FIG. 11 illustrates a variation of the above embodiment in which a package 300 which can be similar in all respects with the package described above relative to FIGS. 5-7, except that the package 300 can be implemented as a wafer-level package having a dielectric layer 302 formed on the faces 105 of the microelectronic elements 101, 103. Metalized vias 308 are formed, e.g., by plating or depositing a metal or conductive material such as a conductive paste, conductive matrix material, etc. in contact with the element contacts 111, 113 of each microelectronic element. The vias 308 may be formed integrally with electrically conductive traces 309 extending in a direction parallel to a surface 310 of the dielectric layer 302. The vias and some or all of the conductive traces of the package may be integral parts of a monolithic metal layer. In a particular examples, one metal layer or more than one such metal layer can be formed by a build-up process of plating, printing, dispensing, screen printing, stenciling or other appropriate technique after forming dielectric layer 302 on the microelectronic elements. The structure of the wafer-level package 300 and the techniques for making it can be applied to any of the other embodiments shown or described in this application.

Figure 12:
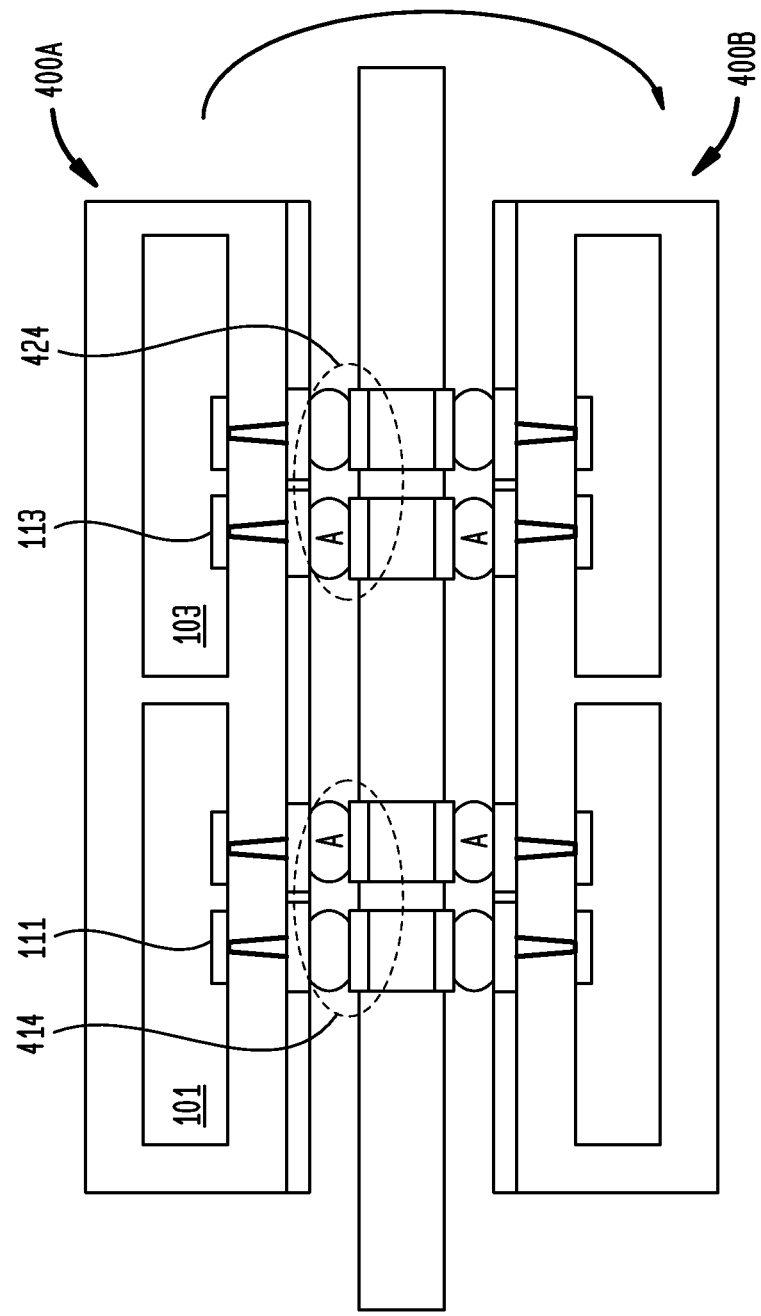
FIG. 12 is a sectional view illustrating a microelectronic assembly and first and second microelectronic packages electrically interconnected therewith in accordance with an embodiment of the invention.

FIG. 12 illustrates an assembly of first and second packages 400A, 400B in which the first and second grids 414, 424 within each package are now disposed at locations close to the element contacts 111, 113 of each microelectronic element 101, 103. The locations of second terminals, which may or may not be disposed in third and fourth grids as described above, are omitted from FIG. 12 for clarity, as is the case in figures depicting other embodiments described below. In this case, nearness of the first terminals in the grids 414, 424 with the element contacts may also help to reduce the lengths of stubs within each package 400A, 400B. Various ways of reducing the stub lengths within packages in which the package terminals are disposed in a central region proximate the element contacts of microelectronic elements therein are described in Applicants' co-pending U.S. Provisional Application No. 61/542,488 of Richard D. Crisp, Belgacem Haba and Wael Zohni entitled "Stub Minimization for Assemblies without Wire bonds to Package Substrate" filed Oct. 3, 2011, the disclosure of which is incorporated by reference herein.

Figure 13:
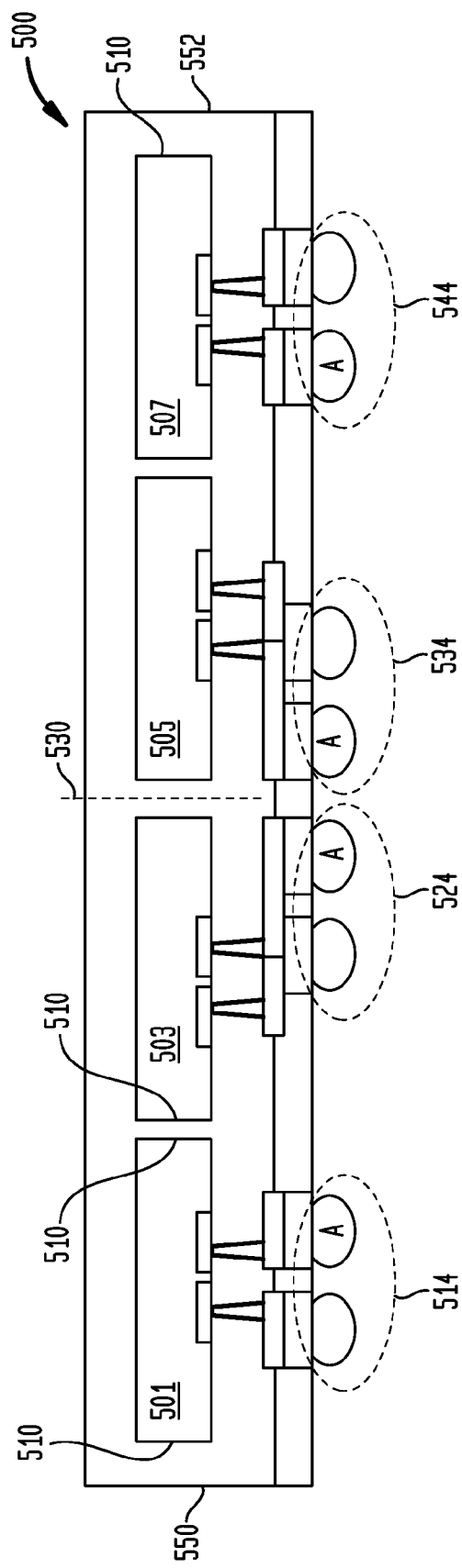
FIGS. 13 and 14 are a sectional view and a plan view illustrating a microelectronic package according to a variation of the embodiment shown in FIGS. 5-7.
Figure 14:
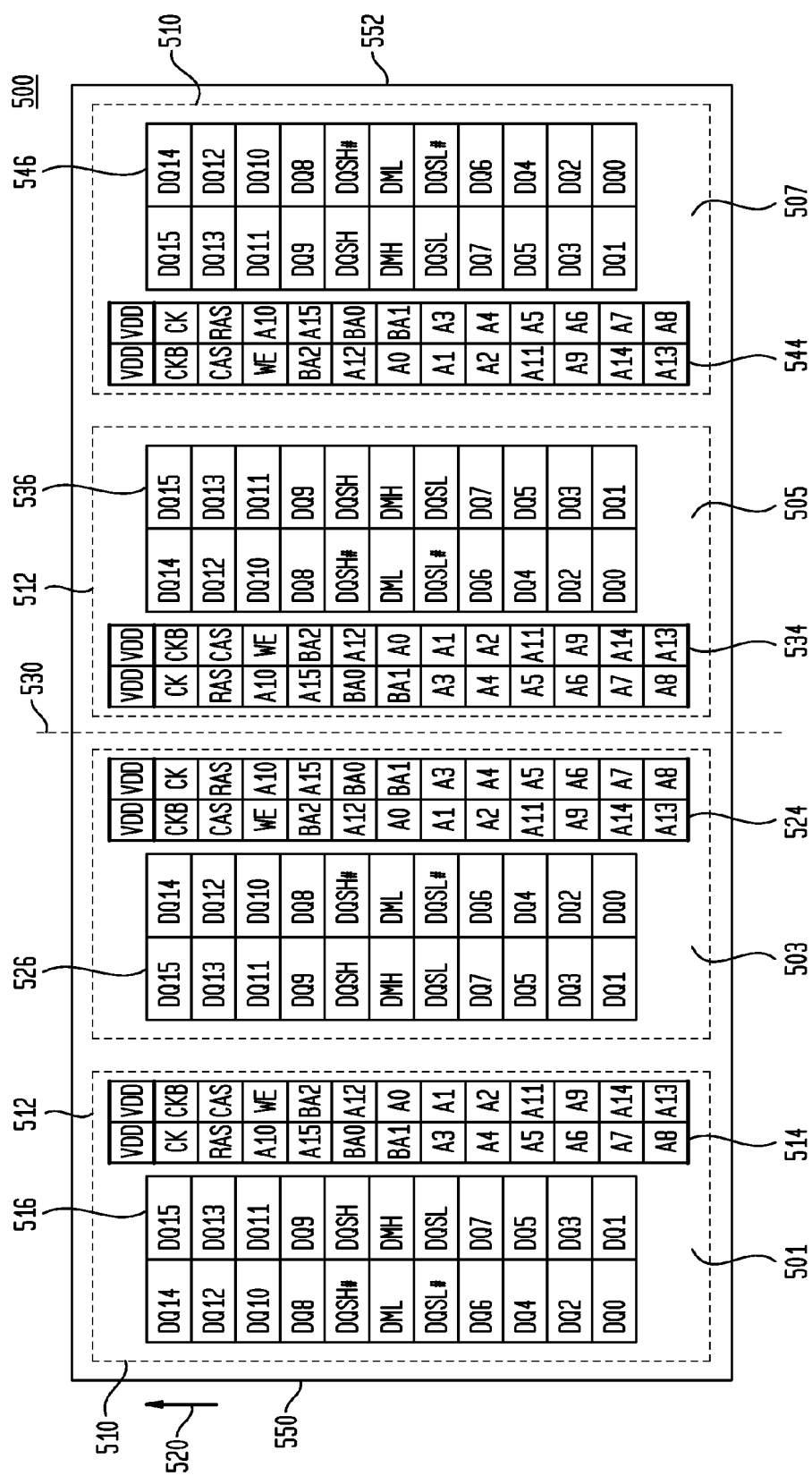

FIGS. 13-14 illustrate a microelectronic package 500 according to a variation of the above-described embodiment of FIGS. 5-7 in which first, second, third and fourth microelectronic elements 501, 503, 505 and 507 are incorporated therein. The package further depicts four grids 514, 524, 534, 544 of first terminals assigned to carry the above-noted signals of the command-address bus. The second terminals, which are shown in FIG. 14 as grids 516, 526, 536, and 546, are omitted from FIG. 13 for clarity. As in the above-described example, each grid of first terminals can be electrically connected with just one of the microelectronic elements, or can be connected to two or more of the microelectronic elements. FIG. 14 illustrates one possible arrangement of the package 500 showing the grids 514, 524, 534, and 544 of first terminals and one possible arrangement of grids 516, 526, 536, and 546 of second terminals.

As shown in FIG. 14, each of the microelectronic elements typically has two first parallel edges 510, which may extend in the same direction or a different direction in which the one or more columns of contacts on the microelectronic element extend. In one example, these first edges may each be longer than two second parallel edges 512 of each microelectronic element. In another example, these first edges 510 may merely extend in the same direction as the one or more columns of contacts, while in fact being shorter than the second edges 512 of the same microelectronic element. References to the first and second edges of microelectronic elements in each of the packages described below incorporate these definitions.

As further seen in FIGS. 13 and 14, in this particular variation, two of the grids 524, 534 of first terminals can be disposed close to a centerline 530 of the package separating microelectronic elements 503, 505, while the other grids 514, 544 of first terminals can be disposed near peripheral edges 550, 552 of the package. In the embodiment shown in FIGS. 13 and 14, there are no terminals separating the grids 524 and 534 of first terminals from one another.

As will be appreciated, it is possible to provide a package (not shown) containing only three of the above-described microelectronic elements 501, 503, 505, 507 and containing an appropriate number of grids of first terminals, and grids of second terminals for connecting the package to a component external to the package, such as a circuit panel.

Figure 15:
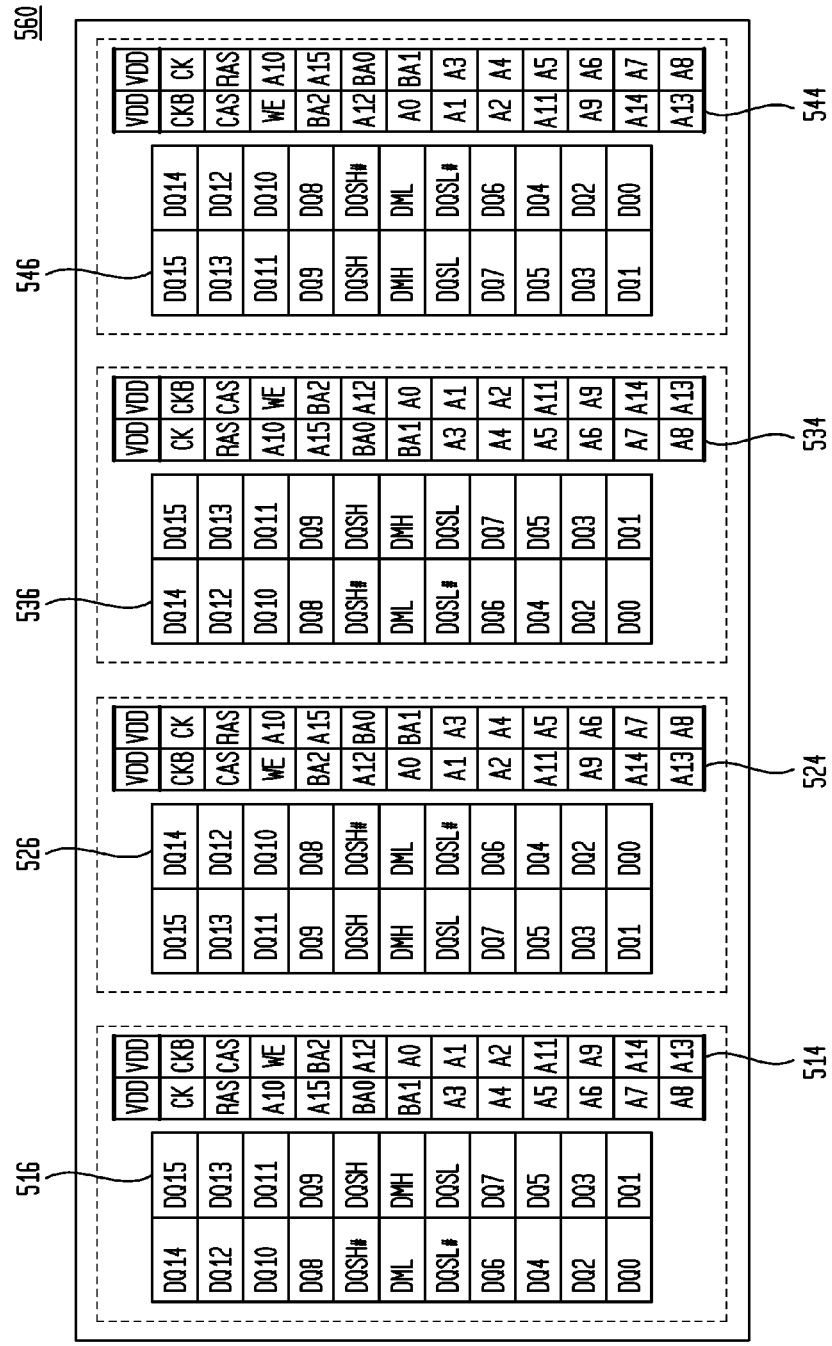
FIG. 15 is a plan view illustrating an alternative arrangement of terminals on a microelectronic package according to a variation of the embodiment shown in FIGS. 13 and 14.

FIG. 15 is a plan view illustrating a package 560 according to a variation of that shown in FIG. 14, in which the positions of the grids of the first terminals on the package are varied. In this case, viewing the differences between package 560 and package 500 of FIG. 14, the position of the grid 534 within package 560 is exchanged with the position of the grid 536 of second terminals, such that the grid 536 is now disposed between the grids 524, 534 of the first terminals. In addition, the position of the grid 544 within the package 560 is exchanged with the position of the grid 546 of second terminals, such that the grid 546 is now disposed between the grids 534, 544 of the first terminals.

Figure 16:
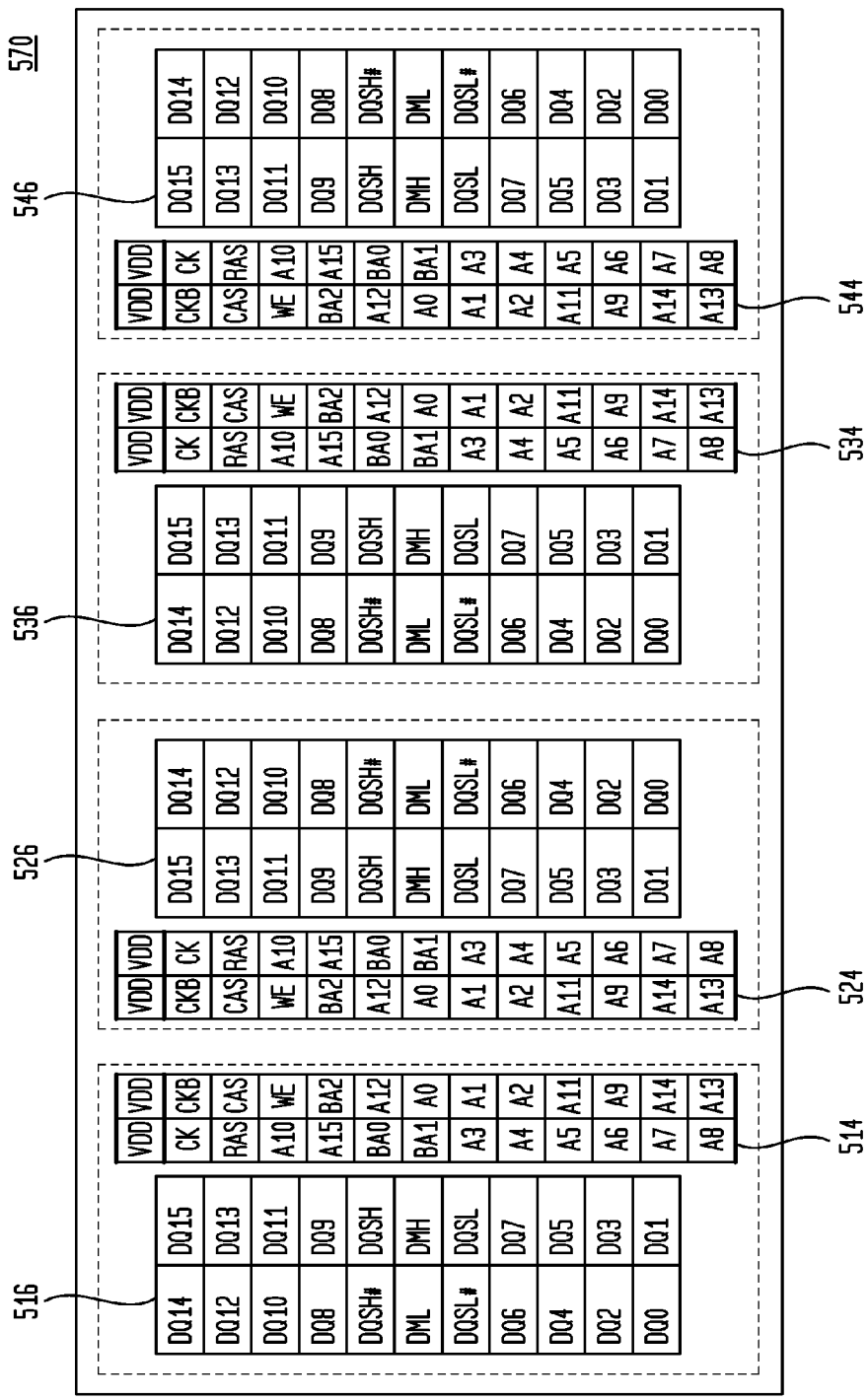
FIG. 16 is a plan view illustrating another alternative arrangement of terminals on a microelectronic package according to a variation of the embodiment shown in FIGS. 13 and 14.

FIG. 16 is a plan view illustrating a package 570 according to another variation of that shown in FIG. 14, in which the positions of the grids of the first terminals are varied. In this case, viewing the differences between package 570 and package 500 of FIG. 14, the position of the grid 524 of first terminals within the package 570 is exchanged with the position of the grid 526 of second terminals, such that the grid 524 is now disposed between and adjacent to grids 514, 526. In addition, the position of the grid 534 within the package 570 is exchanged with the position of the grid 536 of second terminals, such that the grid 534 is now disposed between and adjacent to grids 536, 544.

Figure 17:
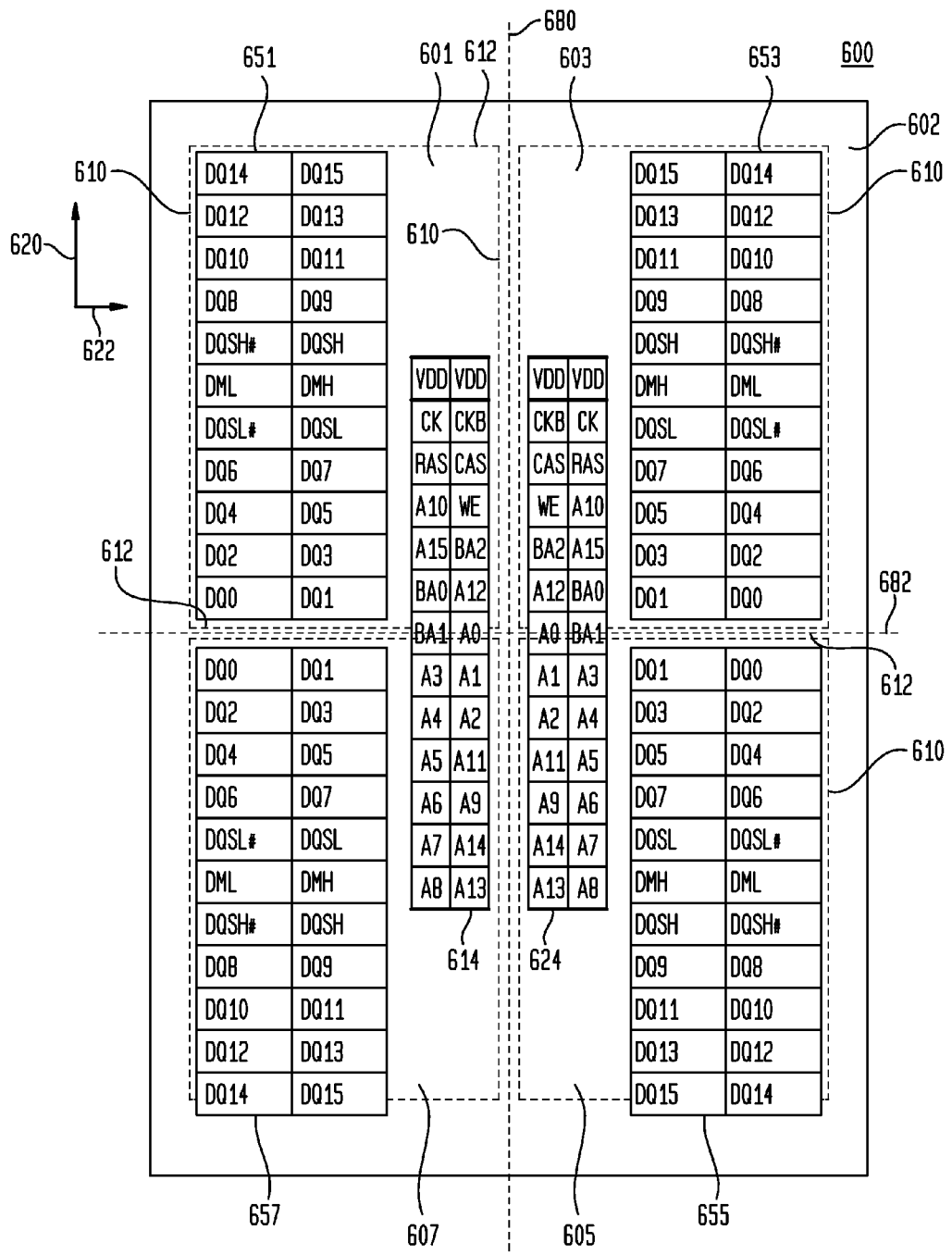
FIG. 17 is a plan view illustrating a microelectronic package according to a variation of the embodiment shown in FIGS. 5-7.

FIG. 17 is a plan view illustrating a package 600 according to a further variation of the above-described embodiment of FIGS. 5-7 in which first, second, third and fourth microelectronic elements 601, 603, 605, 607 are arranged in a matrix on the substrate, wherein each microelectronic element has first edges 610 which typically are parallel and extend in a first direction along the substrate, and second edges 612 which typically are parallel and extend in a second direction along the substrate. As seen in FIG. 17, the microelectronic elements can be arranged with the first edges 610 of microelectronic elements 601, 603 adjacent and parallel to one another, and the first edges of microelectronic elements 605, 607 adjacent and parallel to one another, as well. The microelectronic elements may be arranged such that one second edge 612 of microelectronic element 601 is adjacent and parallel to the second edge 612 of the other microelectronic element 607, and one second edge 612 of microelectronic element 603 is adjacent and parallel to one second edge 612 of the other microelectronic element 605. Each of the first edges 610 of microelectronic element 601 can in some cases be collinear with the first edges 610 of microelectronic element 607. Likewise, each of the first edges 610 of microelectronic element 603 can in some cases be collinear with the first edges 610 of microelectronic element 605.

Grids 651, 653, 655, 657 of second terminals, which may overlie portions of respective microelectronic elements 601, 603, 605, 607 and are electrically connected therewith, can have terminals disposed in any suitable arrangement, there being no requirement to place these second terminals in grids in which the signal assignments in any one of the grids 651, 653, 655, or 657 are a mirror image of the signal assignments of the terminals in any one of the other grids 651, 653, 655, or 657.

In a particular example, the signal assignments of the second terminals in any one of the grids 651, 653, 655, or 657 can be a mirror image of the signal assignments of the second terminals in one or two other ones of the grids 651, 653, 655, or 657, in that the signal assignments of any one of the grids can be symmetric about a vertical axis 680 with respect to the signal assignments of another grid, and/or the signal assignments of any one of the grids can be symmetric about a horizontal axis 682 with respect to the signal assignments of another grid.

For example, as shown in FIG. 17, the signal assignments of the third grid 651 are symmetric about the vertical axis 680 with respect to the signal assignments of the fourth grid 653, where the vertical axis 680 extends in a direction 620 which in the example shown is between the grids 651 and 653. Also, the signal assignments of the third grid 651 are symmetric about the horizontal axis 682 with respect to the signal assignments of the sixth grid 657, where the horizontal axis 682 extends in a direction 622, which in the example shown is between the grids 651 and 657. In an alternative arrangement, each of the grids 651 and 657 may extend to portions of the substrate surface on both sides of the horizontal axis 682, and the relationships described above can otherwise be present.

In the particular example shown in FIG. 17, the signal assignments of the first and fourth grids 651 and 657 are symmetric about the vertical axis 680 with respect to the signal assignments of the respective second and third grids 653 and 655. Also, the signal assignments of the first and second grids 651 and 653 are symmetric about the horizontal axis with respect to the signal assignments of the respective fourth and third grids 657 and 655.

Figure 18:
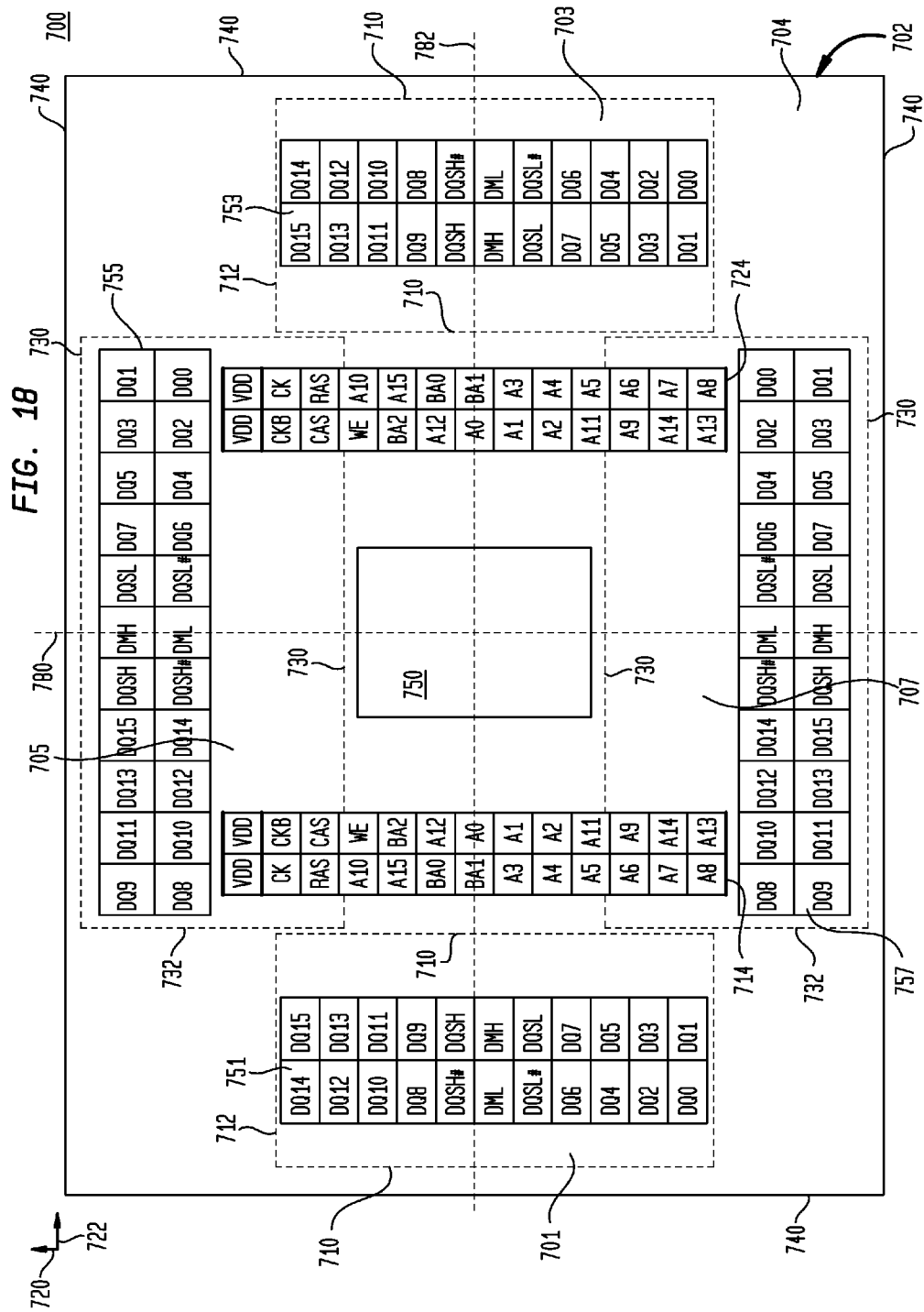
FIG. 18 is a plan view illustrating a microelectronic package according to a variation of the embodiment shown in FIGS. 13 and 14.

FIG. 18 is a plan view illustrating a microelectronic package 700 according to another variation of the above-described embodiment (FIGS. 13-14), in which the first edges 710 of first and second microelectronic elements 701, 703 extend in a first direction 720 parallel to the edge 702 of terminal-bearing substrate surface 704, and where the second edges 712 of microelectronic elements 701, 703 extend in a second direction 722 parallel to the terminal-bearing surface 704 of the substrate. The package 700 further includes third and fourth microelectronic elements 705, 707. However, the first edges 730 of the third and fourth microelectronic elements 705, 707 extend in the second direction 722, and the second edges 732 of the third and fourth microelectronic elements 705, 707 extend in the first direction 720.

As further seen in FIG. 18, in one example, first and second grids 714, 724 of first terminals configured to carry the above-noted command-address bus signals, can be provided in locations on the substrate surface away from the substrate's peripheral edges 740. The signal assignments of the first terminals in the second grid 724 can be a mirror image of the signal assignments of the first terminals in the first grid, as described above. In one example as shown in FIG. 18, the first and second grids 714, 724 of first terminals may be disposed between adjacent first edges 710 of the first and second microelectronic elements 701, 703 and may overlie portions of the third and fourth microelectronic elements 705, 707. Grids of second terminals 751, 753, 755, 757 may at least partially overlie respective microelectronic elements 701, 703, 705, 707 to which the second terminals therein electrically connect.

As seen in FIG. 18, the signal assignments of the second terminals in the fourth grid 753 can be a mirror image of the signal assignments of the second terminals in the third grid 751, where the signal assignments of the third and fourth grids 751 and 753 are symmetric about a vertical axis 780 that extends in a direction 720.

Fifth and sixth grids 755, 757 of second terminals, which may overlie portions of microelectronic elements 705, 707 and be electrically connected therewith, can have terminals disposed in any suitable arrangement, there being no requirement to place these second terminals in grids in which the signal assignments in one of the grids 755 are a mirror image of the signal assignments of the terminals in the other grid 757. In the particular example shown in FIG. 18, the signal assignments of the fifth grid 755 are symmetric about the horizontal axis 782 with respect to the signal assignments of the sixth grid 757, where the horizontal axis 782 extends in a direction 722 between the grids 751 and 757.

Also, as shown in FIG. 18, the signal class assignments of the second terminals in the fifth grid 755 can be symmetric about the vertical axis 780, and the signal class assignments of the second terminals in the sixth grid 757 can be symmetric about the vertical axis 780. As used herein, two signal class assignments can be symmetric with respect to one another if the signal assignments are in the same class of assignments, even if the numerical index within the class differs. Exemplary signal class assignments can include data signals, data strobe signals, data strobe complement signals, and data mask signals. In a particular example, in the fifth grid 755, the second terminals having signal assignments DQSH# and DQSL# are symmetric about the vertical axis 780 with respect to their signal class assignment, which is data strobe complement, even though those second terminals have different signal assignments.

As further shown in FIG. 18, the assignments of the data signals to the spatial positions of the second terminals on the microelectronic package, such as for data signals DQ0, DQ1, . . . , for example, can have modulo-X symmetry about the vertical axis 780. The modulo-X symmetry can help preserve signal integrity in an assembly 300 such as seen in FIG. 8A, in which one or more pairs of first and second packages are mounted opposite one another to a circuit panel, and the circuit panel electrically connects corresponding pairs of second terminals of those first and second packages in each oppositely-mounted package pair. As used herein, when the signal assignments of terminals have "modulo-X symmetry" about an axis, terminals that carry signals that have the same index number "modulo-X" are disposed at positions that are symmetric about the axis. Thus, in such assembly 300 such as in FIG. 8A, modulo-X symmetry can permit electrical connections to be made through the circuit panel so that a terminal DQ0 of a first package can be electrically connected through the circuit panel to a terminal DQ8 of the second package which has the same index number modulo X (X being 8 in this case), so that the connection can be made in a direction essentially straight through, i.e., normal to, the thickness of the circuit panel.

In one example, "X" can be a number $2^n$ (2 to the power of n), wherein n is greater than or equal to 2, or X can be 8×N, N being two or more. Thus, in one example, X may be equal to the number of bits in a half-byte (4 bits), byte (8 bits), multiple bytes (8×N, N being two or more), a word (32 bits) or multiple words. In such way, in one example, when there is modulo-8 symmetry as shown in FIG. 18, the signal assignment of a package terminal DQ0 in grid 755 configured to carry data signal DQ0 is symmetric about the vertical axis 780 with the signal assignment of another package terminal configured to carry data signal DQ8. Moreover, the same is true for the signal assignments of package terminals DQ0 and DQ8 in grid 757. As further seen in FIG. 18, the signal assignments of package terminals DQ2 and DQ10 in grid 755 have modulo-8 symmetry about the vertical axis, and the same is also true for grid 757. Modulo-8 symmetry such as described herein can be seen in grids 755, 757 with respect to each of the signal assignments of package terminals DQ0 through DQ15.

It is important to note that, although not shown, the modulo number "X" can be a number other than $2^n$ (2 to the power of n) and can be any number greater than two. Thus, the modulo number X upon which the symmetry is based can depend upon how many bits are present in a data size for which the package is constructed or configured. For example, when the data size is 10 bits instead of 8, then the signal assignments may have modulo-10 symmetry. It may even be the case that when the data size has an odd number of bits, the modulo number X can have such number.

The mirror image signal assignments of terminals in grids 714, 724, and grids 751, 753, and grids 755, 757 may permit the above-described reduction in stub lengths in a circuit panel, as described above relative to FIGS. 5-7, to be achieved when two packages 700 of like configurations are mounted opposite one another on opposite surfaces of the circuit panel.

FIG. 18 further illustrates that one or more buffer elements 750 can be provided as a microelectronic element disposed in a region of the package 700 between adjacent edges 730, 710 of the first, second, third and fourth microelectronic elements 701, 703, 705, and 707. Each such buffer element can be used to provide signal isolation between terminals of the package, particularly for the above-noted command address bus signals received at the first terminals of the package, and one or more of the microelectronic elements in the package. Typically, the one or more buffer elements regenerate signals received at the first terminals, or which are received at the second terminals, and transfers the regenerated signals to the microelectronic elements in the package.

Alternatively or in addition thereto, the area of the substrate 702 between the adjacent edges 710, 730 of the microelectronic elements may permit one or more decoupling capacitors to be provided on or in the package in such area, the one or more decoupling capacitors being connected to internal power supply or ground buses of the package.

Figure 19:
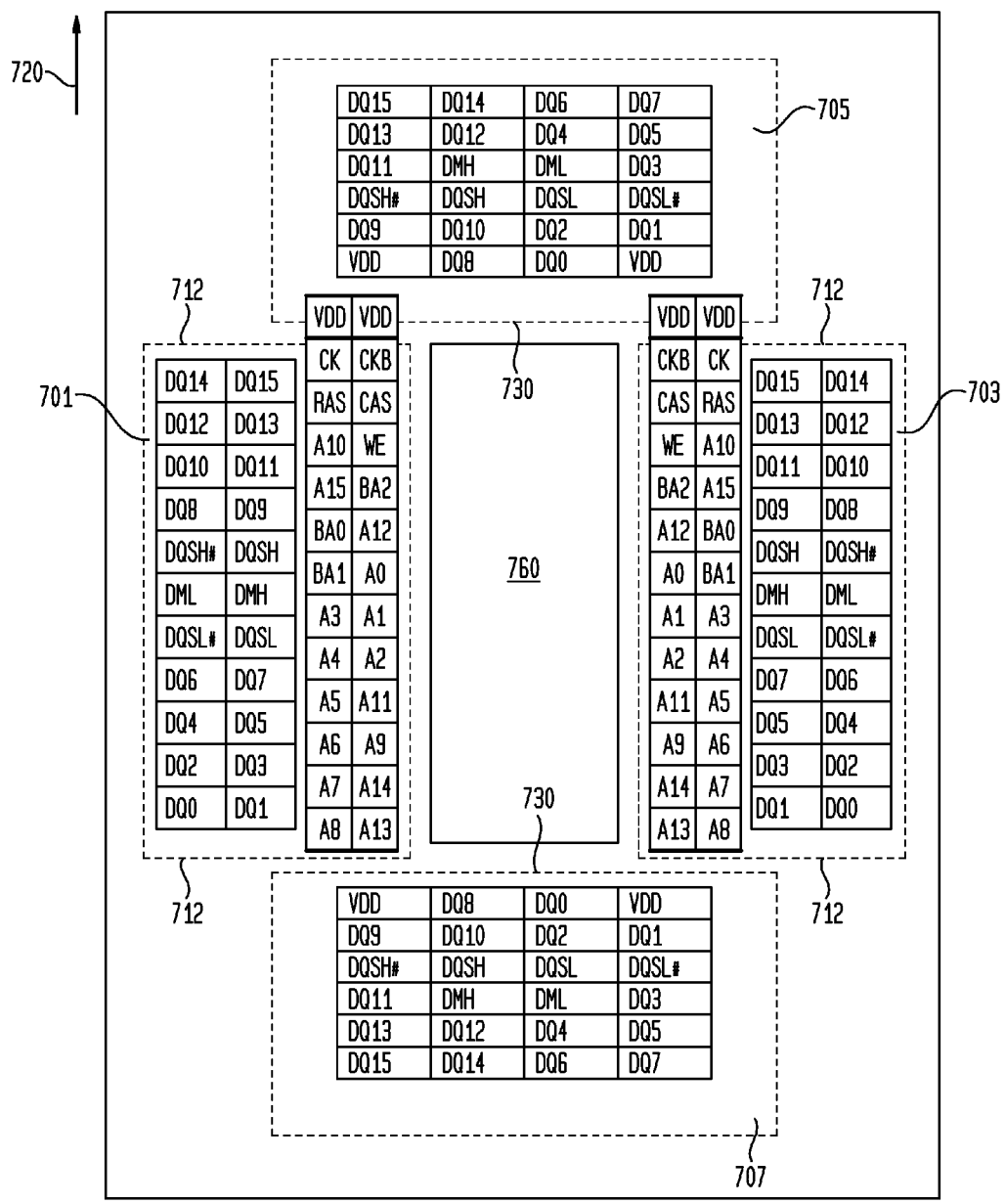
FIG. 19 is a plan view illustrating a microelectronic package according to a variation of the embodiment shown in FIG. 18.

FIG. 19 illustrates a variation of the embodiment seen in FIG. 18, in which the positions of the first and second grids 714, 724 can be varied so as to overlie at least portions of the first and second microelectronic elements 701, 703. In such case, the positions of the third and fourth microelectronic elements 705, 707 may also change such that portions of first edges 730 of the third and fourth microelectronic elements 705, 707 may be moved away from the center of the package. In this case, the first edges 730 of the third and fourth microelectronic elements run parallel to and are spaced apart from portions of the second edges 712 of the first and second microelectronic elements in direction 720, such that an amount of area 760 at the center of the package available for connection of one or more buffer elements or decoupling capacitors, or other device may be greater than that shown in FIG. 18.

Figure 20:
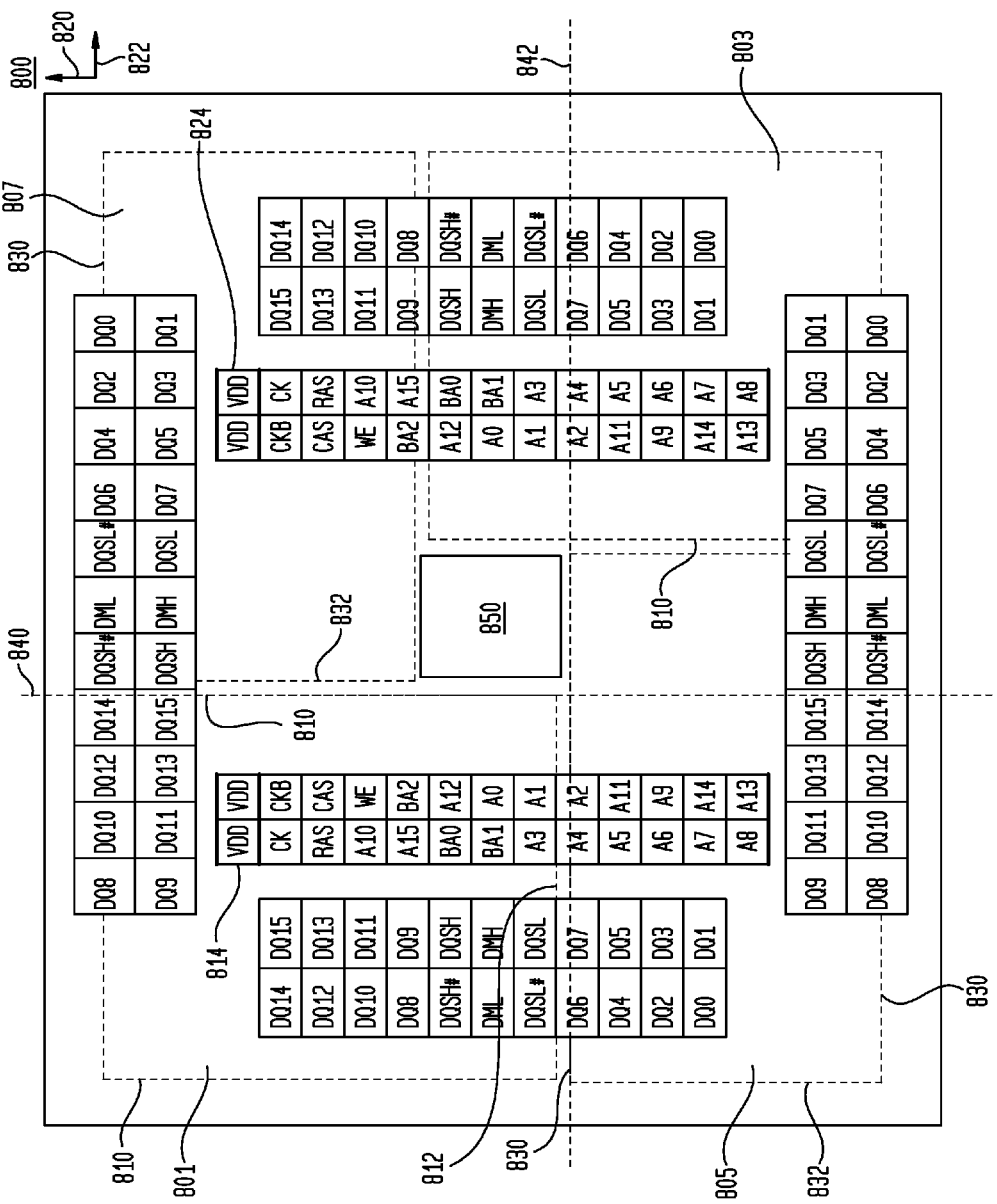
FIG. 20 is a plan view illustrating a microelectronic package according to a variation of the embodiment shown in FIG. 19.

FIG. 20 illustrates a microelectronic package 800 according to a variation of the above-described embodiment (FIG. 19). In this variation, the microelectronic elements 801, 803, 805, 807 are arranged in a pinwheel-like configuration in which the first edges 810 of microelectronic elements 801, 803 extend in the same direction 820 as the second edges of microelectronic elements 805, 807. In addition, the first edges 830 of microelectronic elements 805, 807 extend in the same direction 822 as the second edges 812 of the microelectronic elements 801, 803. A portion of one of the first edges 810 of microelectronic element 801 is spaced apart from and parallel to a portion of one of the second edges 832 of microelectronic element 807. Similarly, a portion of the one of the first edges of microelectronic element 805 is spaced apart from and parallel to one of the second edges of microelectronic element 801. These relationships can be repeated within the package for a portion of one of the first edges 810 of microelectronic element 803 and a portion of one of the second edges 832 of microelectronic element 805, as well as for a portion of one of the first edges of microelectronic element 807 and a portion of one of the second edges of microelectronic element 803.

In addition, it is further seen that there is a plane 840 normal to the substrate which contains one of the first edges 810 of microelectronic element 801, and which intersects the first edges 830 of another microelectronic element 805. Similarly, there is a plane 842 normal to the substrate which contains one of the first edges 830 of microelectronic element 805, and which intersects the first edges 810 of another microelectronic element 803. From an inspection of FIG. 20, it can be seen that a similar plane which contains one of the first edges of microelectronic element 807 will intersect the first edges of microelectronic element 801 and a similar plane which contains one of the first edges of microelectronic element 803 will intersect the first edges of microelectronic element 807.

FIG. 20 further illustrates that the grids 814, 824 of first terminals having mirror image signal assignments may each partially or fully overlie one or more of the microelectronic elements in the package 800. In addition, a central region 850 of the substrate which is disposed between adjacent edges of the microelectronic elements, and over which none of the faces of the microelectronic elements is disposed, may accommodate one or more buffer elements or decoupling capacitors or both as described above relative to FIGS. 18-19.

Figure 21:
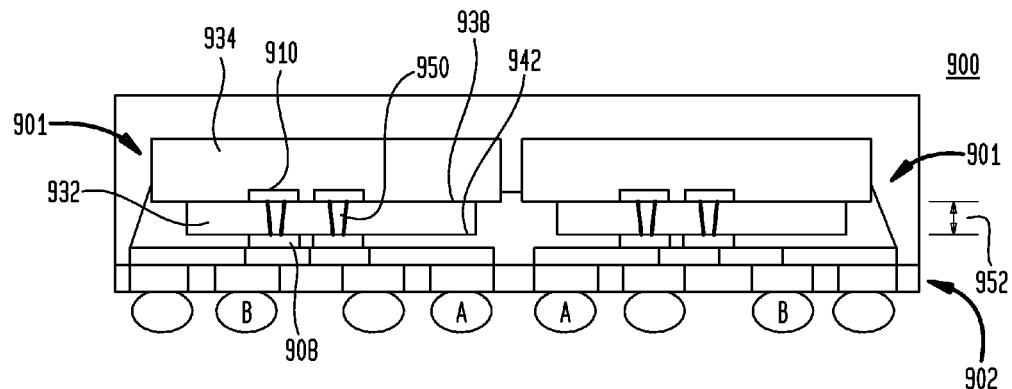
FIG. 21 is a sectional view illustrating a microelectronic package including a stacked electrically connected assembly of semiconductor chips therein in accordance with an embodiment of the invention.

FIG. 21 illustrates a microelectronic package 900 similar to any of the packages described above, in which the microelectronic elements 901 therein are composite structures each of which can include two or more semiconductor chips which are stacked one above the other and are electrically interconnected with each other, and in which each may be connected with the substrate contacts 908. Thus, in the embodiment seen in FIG. 21, each microelectronic element 901 may include a first semiconductor chip 932 having contacts 906 facing and joined with corresponding substrate contacts 908 of the substrate, as well as a second semiconductor chip 934 having contacts 910 electrically connected with the first semiconductor chip 932 and the substrate 902 by through-silicon vias ("TSVs") 950 that extend in a direction of a thickness 952 of the first semiconductor chip 932, i.e., in a direction between first and second opposed faces 938, 942 of the chip 932.

In a particular embodiment, the TSVs 950 can be electrically connected with the element contacts 908 of the first semiconductor chip 932, such as by traces extending along a face 942 of the first semiconductor chip 932. Although any electrical connections between the first and second semiconductor chips can be made in this manner, such connections are well-suited for the distribution of power and ground to the first and second semiconductor chips. In another example, the TSVs 950 may extend only partially through a thickness of the first semiconductor chip, and be connected with internal circuitry within the first semiconductor chip 932, rather than being connected to traces on the face 942 of the first semiconductor chip 932 or being connected directly to the contacts of the first semiconductor chip.

In the microelectronic package 900 seen in FIG. 21, each of the first and second semiconductor chips 932, 934 can be configured such that each such semiconductor chip embodies a greater number of active devices to provide memory storage array function than any other function. For example, each of the first and second semiconductor chips can include a memory storage array and all circuitry required for inputting data to and outputting data from the memory storage array. For example, when the memory storage array in each semiconductor chip is writable, each of the semiconductor chips can include circuitry configured to receive external data input from terminals of the package, as well as circuitry configured to transfer data output from such semiconductor chip to terminals of the package.

Thus, each first and each second semiconductor chip 932, 934 can be a dynamic random access memory ("DRAM") chip or other memory chip that is capable of inputting and outputting data from the memory storage array within such semiconductor chip and receiving and transmitting such data to a component external to the microelectronic package. Stated another way, in such case, signals to and from the memory storage array within each DRAM chip or other memory chip may not require buffering by an additional semiconductor chip within the microelectronic package.

Alternatively, in another example, the one or more second semiconductor chips 934 may embody a greater number of active devices to provide memory storage array function than any other function, but the first semiconductor chip 932 may be a different type of chip. In such case, the first semiconductor chip 932 can be configured, e.g., designed, constructed, or set up, to buffer signals, i.e., regenerate signals received at the terminals for transfer to the one or more second semiconductor chips 934, or to regenerate signals received from one or more of the second semiconductor chips 934 for transfer to the terminals, or to regenerate signals being transferred in both directions from the terminals to the one or more second semiconductor chips 934; and from the one or more semiconductor chips to the terminals of the microelectronic package. Signals that are regenerated by a first semiconductor chip 932 operating as a buffer element, which are then transferred to the one or more second semiconductor chips, can be routed through TSVs connected to internal circuitry, for example.

Alternatively or in addition to regenerating signals as described above, in a particular example, the first semiconductor chip 932 can be configured to partially or fully decode at least one of address information or command information received at the terminals, such as at the first terminals. The first chip can then output the result of such partial or full decoding for transfer to the one or more second semiconductor chips 934.

In a particular example, the first semiconductor chip 932 can be configured to buffer the address information, or in one example, the command signals, address signals, and clock signals that are transferred to the one or more second semiconductor chips 934. For example, the first semiconductor chip 932 can be a buffer chip that embodies a greater number of active devices to provide a buffering function in transferring signals to other devices, e.g., to the one or more second semiconductor chips 934, than for any other function. Then, the one or more second semiconductor chips 934 can be reduced function chips that have memory storage arrays but which can omit circuitry common to DRAM chips, such as buffer circuitry, decoders, predecoders, or wordline drivers, among others.

In such an example, the first chip 932 can function as a "master" chip in the stack and to control operations in each of the second semiconductor chips 934. In a particular example, the second semiconductor chips 934 can be configured such that they are not capable of performing the buffering function. In that case, the stacked arrangement of the first and second semiconductor chips can be configured such that the buffering function required in the microelectronic package can be performed by the first semiconductor chip 932, and cannot be performed by any of the second semiconductor chips 934 in the stacked arrangement.

In any of the embodiments described herein, the one or more second semiconductor chips can be implemented in one or more of the following technologies: DRAM, NAND flash memory, RRAM ("resistive RAM" or "resistive random access memory"), phase-change memory ("PCM"), magnetoresistive random access memory, e.g. such as may embodiment tunnel junction devices, static random access memory ("SRAM"), spin-torque RAM, or content-addressable memory, among others.

Figure 22A:
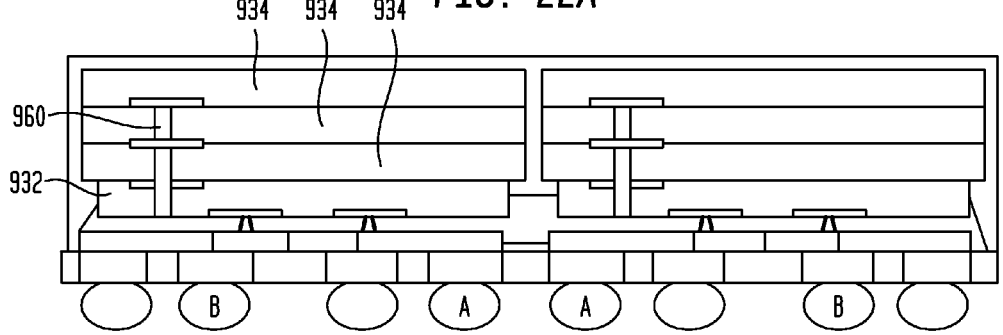
FIG. 22A is a sectional view illustrating a microelectronic package including a stacked electrically connected assembly of semiconductor chips therein in accordance with an embodiment of the invention.

As further seen in the embodiment depicted in FIG. 22A, the microelectronic package may also include through-silicon vias 960 extending partially or completely through one or more of the second semiconductor chips 934 and may also extend through the first semiconductor chip 932. In a particular example, each of the second semiconductor chips 934 can be functionally and mechanically equivalent to any other of the second semiconductor chips. In a particular example, the first semiconductor chip 932 can be configured to regenerate or at least partially decode received information or signals and then transfer the regenerated information or signals to the one or more of the second semiconductor chips 934, e.g., through the TSVs 960 between the first and second chips 932, 934 and within the stack of second chips 934.

Figure 22B:
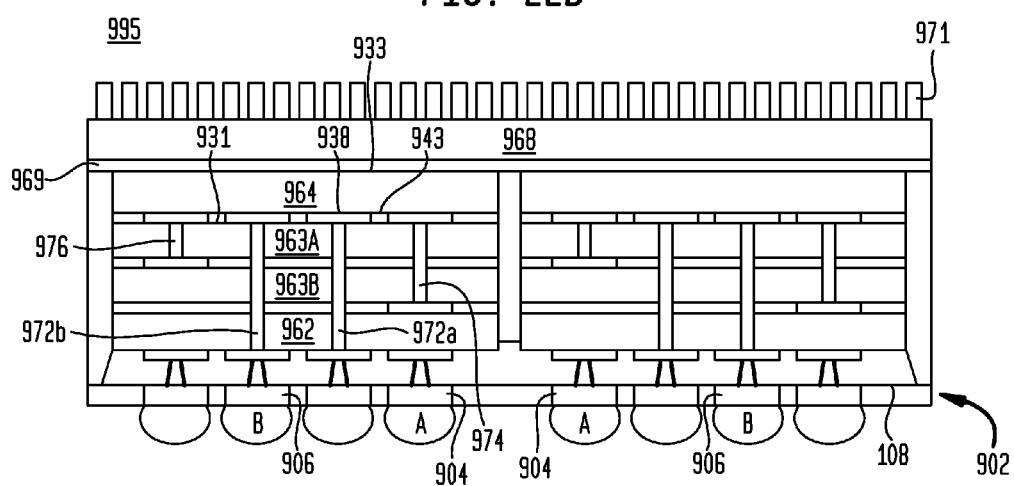
FIG. 22B is a sectional view illustrating a microelectronic package according to a variation of the embodiment shown in FIG. 22A.

FIG. 22B illustrates a variation of the microelectronic package shown in FIG. 22A. Unlike the package shown in FIG. 22A, semiconductor chip 964, which can be configured to regenerate or at least partially decode address information or other information, e.g., regenerate signals for transfer to other semiconductor chips in the package, is not located adjacent to the first surface 108 of the substrate 902. Rather, in this case, the semiconductor chip 964 can be disposed at a position within the package that overlies one or more other semiconductor chips. For example, as shown in FIG. 22B, the chip 964 at least partially overlies the semiconductor chip 962 that is disposed adjacent to the first surface 108 of the substrate 902 and at least partially overlies semiconductor chips 963A and 963B which are disposed atop semiconductor chip 962.

In one example, the semiconductor chips 962, 963A, and 963B may include memory storage arrays. As in the examples described above, such chips 962, 963A, and 963B may each incorporate circuits configured to buffer, e.g., temporarily store, data that is to be written to such chip, or data that is being read from such chip, or both. Alternatively, the chips 962, 963A, and 963B may be more limited in function and may need to be used together with at least one other chip that is configured to temporarily store data that is to be written to such chip or data that is being read from such chip, or both.

The semiconductor chip 964 can be electrically connected to terminals of the microelectronic package, e.g., to grids in which the first terminals 904 and the second terminals 906 are disposed, through electrically conductive structure, e.g., TSVs 972a and 972b (collectively TSVs 972), that connect to contacts exposed at the first surface 108 of the substrate 902. The electrically conductive structure, e.g., the TSVs 972, can electrically connect to the semiconductor chip 964 through contacts 938 on the chip 964 and through conductors (not shown) that extend along the face 943 of the chip 964, or along a confronting face 931 of the chip 963A, or along the faces 931, 943 of both of the chips 963A, 964. As indicated above, the semiconductor chip 964 may be configured to regenerate or at least partially decode signals or information that it receives through the conductive structure, e.g., the TSVs 972, and it may be configured to transfer the regenerated or at least partially decoded signals or information to other chips within the package such as to the chips 962, 963A, and 963B.

As further seen in FIG. 22B, the semiconductor chips 962, 963A, and 963B can be electrically connected to the semiconductor chip 964 and to one another by a plurality of through-silicon vias ("TSVs") 972, 974, and 976 that can extend through one, two, or three or more of such chips. Each such TSV may electrically connect with wiring within the package, e.g., conductive pads or traces of two or more of the semiconductor chips 962, 963A, 963B, and 964. In a particular example, signals or information can be transferred from the substrate 902 to the chip 964 along a first subset of TSVs 972a, and signals or information can be transferred from the chip 964 to the substrate along a second subset of TSVs 972b. In one embodiment, at least a portion of the TSVs 972 can be configured to have signals or information be transferred in either direction between the chip 964 and the substrate 902, depending on the particular signals or information. In one example (not shown), through silicon vias may extend through the thicknesses of all semiconductor chips 962, 963A, and 963B, even though each through silicon via may not electrically connect with each such semiconductor chip through which it extends.

As further seen in FIG. 22B, a heat sink or heat spreader 968, which may include a plurality of fins 971, can be thermally coupled to a face of the semiconductor chip 964, e.g., a rear face 933 thereof, such as through a thermally conductive material 969 such as thermal adhesive, thermally conductive grease, or solder, among others.

The microelectronic assembly 995 shown in FIG. 22B may be configured to operate as a memory module capable of transferring a designated number of data bits per cycle onto or off of the microelectronic package through the first and second terminals provided therefor on the substrate. For example, the microelectronic assembly may be configured to transfer a number of data bits such as thirty-two data bits, sixty-four data bits, or ninety-six data bits, among other possible configurations, to or from an external component such as a circuit panel that can be electrically connected with the terminals 904, 906. In another example, when the bits transferred to and from the package include error correction code bits, the number of bits transferred per cycle to or from the package may be thirty-six bits, seventy-two bits, or one-hundred-eight bits. Other data widths are possible other than those that are specifically described here.

Figure 23:
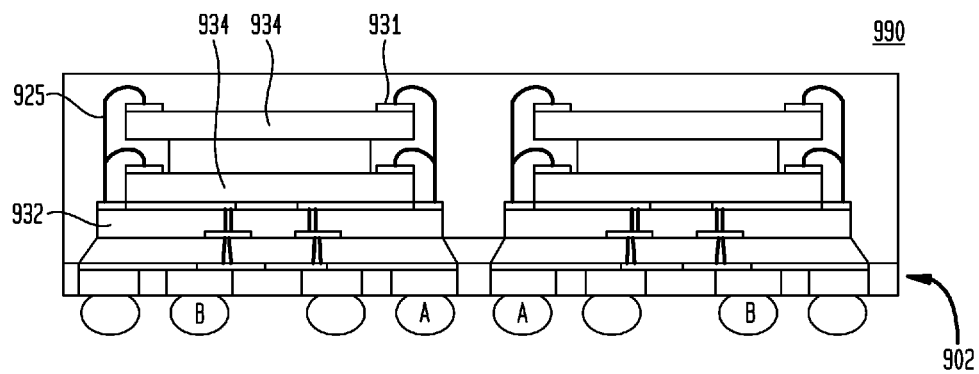
FIG. 23 is a sectional view illustrating a microelectronic package according to a variation of the embodiment shown in FIG. 22A.

FIG. 23 further illustrates a microelectronic package 990 according to a variation of the embodiment seen in FIG. 22A. In this case, the first semiconductor chip 934 is interconnected with the substrate 902 in the same manner as described above relative to FIG. 21. However, the one or more second semiconductor chips 934 may be electrically interconnected with the first semiconductor chip 932 through wire bonds 925. The wire bonds may connect each second chip 934 directly with the first semiconductor chip 932 as shown in FIG. 23. Alternatively, in some cases the wire bonds can be cascaded, with some wire bonds connecting adjacent second chips 934 together and other wire bonds connecting the first chip 932 with the second chip 934 adjacent to the first chip, but not necessarily directly connecting the first chip 932 with each of the second chips 934.

In the example shown in FIG. 23, the second semiconductor chips 934 are placed with their front faces and contacts 931 thereon facing upwardly, that is, facing away from the first semiconductor chip 932. However, in another variation seen in FIG. 24, another way the first and second semiconductor chips 932, 934 can be mounted together in the microelectronic package is for each of the first and second semiconductor chips 932, 934 to be placed with their front faces and contacts 931 facing downwardly, that is, towards the substrate 902. In that way, the contacts 931 can be electrically connected to corresponding contacts 941 on the front face 942 of the first semiconductor chip 932 through wire bonds 936. In this case, the contacts 941 can be electrically connected to the element contacts 939 on the first semiconductor chip 932 such as by traces 938 extending along the front face 942 of the first semiconductor chip 932, with the connections between the element contacts 939 and the substrate contacts 908 being as described above relative to FIG. 21. Each second chip 934 in the package shown in FIG. 24 can be connected with the first chip 932 either directly by a wire bond extending therebetween or indirectly through a series of cascaded wire bonds, as described above.

Figure 25:
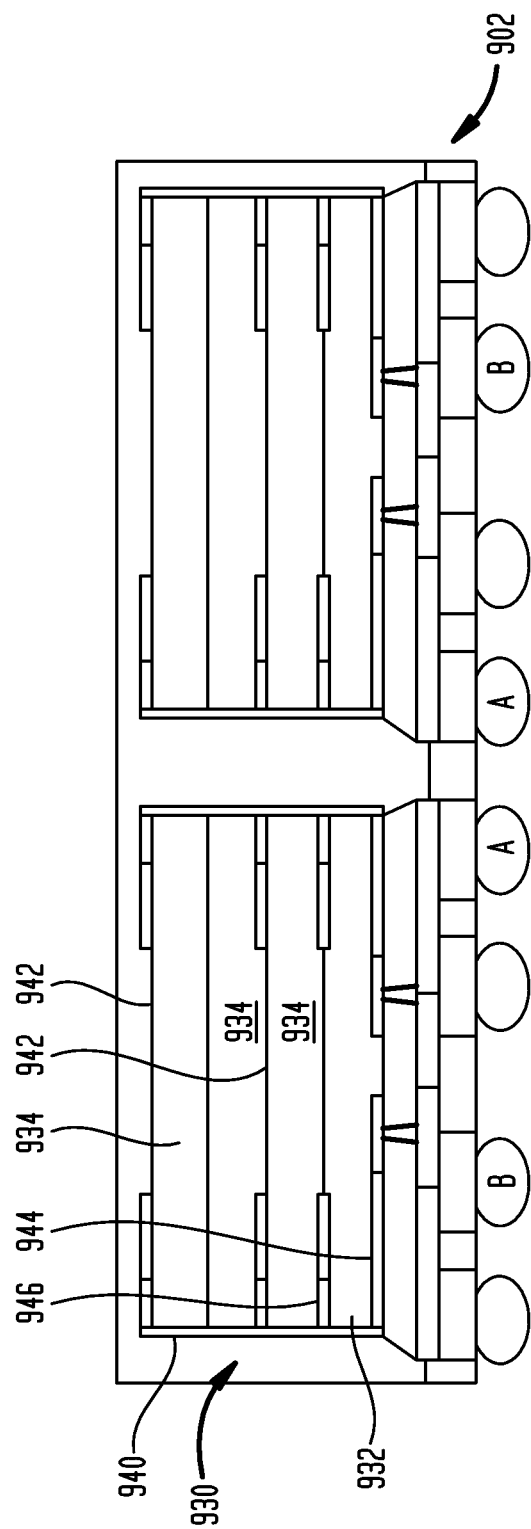
FIG. 25 is a sectional view illustrating a microelectronic package according to yet another variation of the embodiment shown in FIG. 22A.

FIG. 25 illustrates a microelectronic package according to a further variation of the embodiment described above relative to FIG. 22A, in which connections between contacts of the one or more second semiconductor chips 934 and the first semiconductor chip 932 can include traces 940 which extend along one or more edges of the microelectronic element 930, i.e., along edges of the semiconductor chips 932, 934 within the microelectronic element. The electrical connections between the semiconductor chips 932, 934 may further include traces 944, 946 that extend along front faces of the first semiconductor chip 932 and the second semiconductor chips 934, respectively. As further shown in FIG. 25, the front faces 942 of the second semiconductor chips may face upwardly away from the substrate 902 or downwardly towards the substrate 902.

Figure 26A:
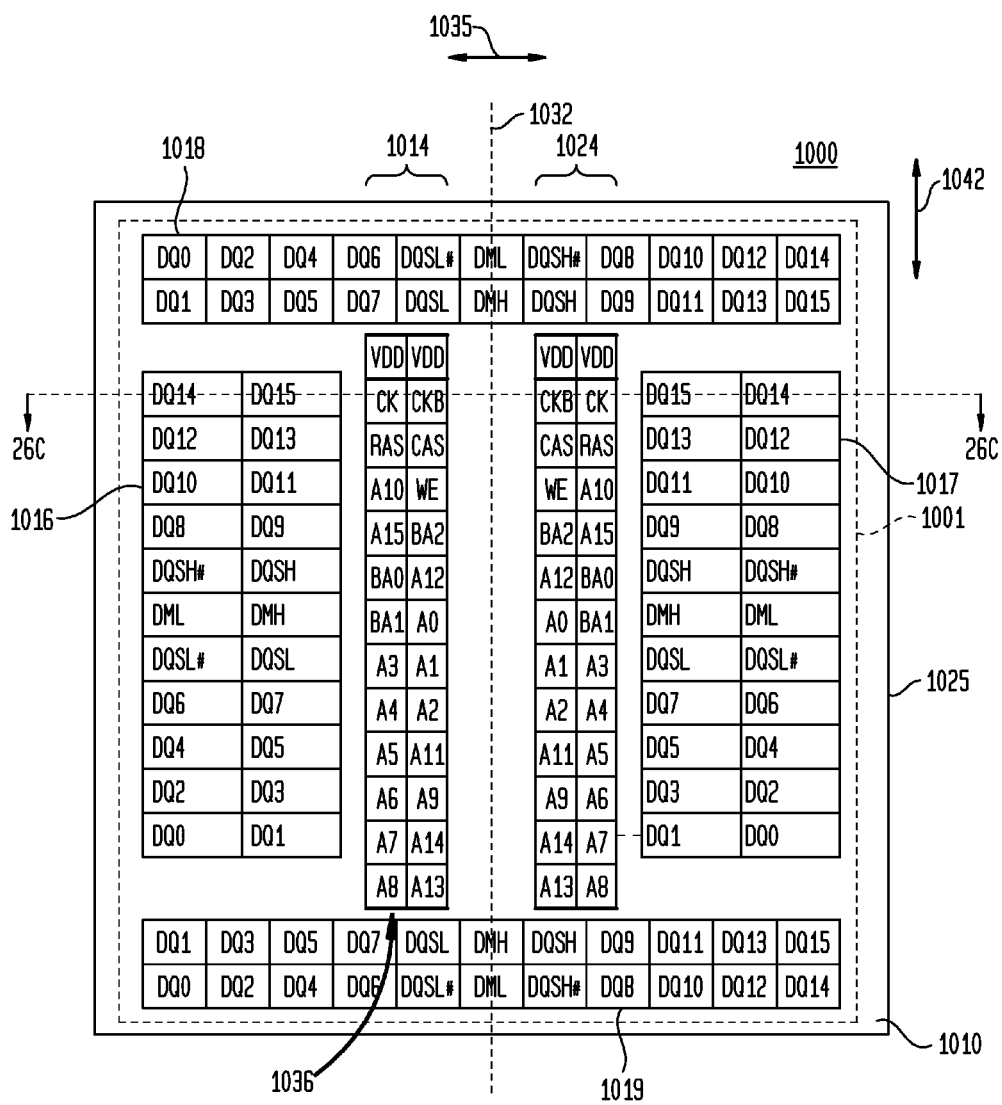
FIG. 26A is a diagrammatic plan view illustrating an arrangement and signal assignment of terminals in a microelectronic package according to an embodiment of the invention.
Figure 26B:
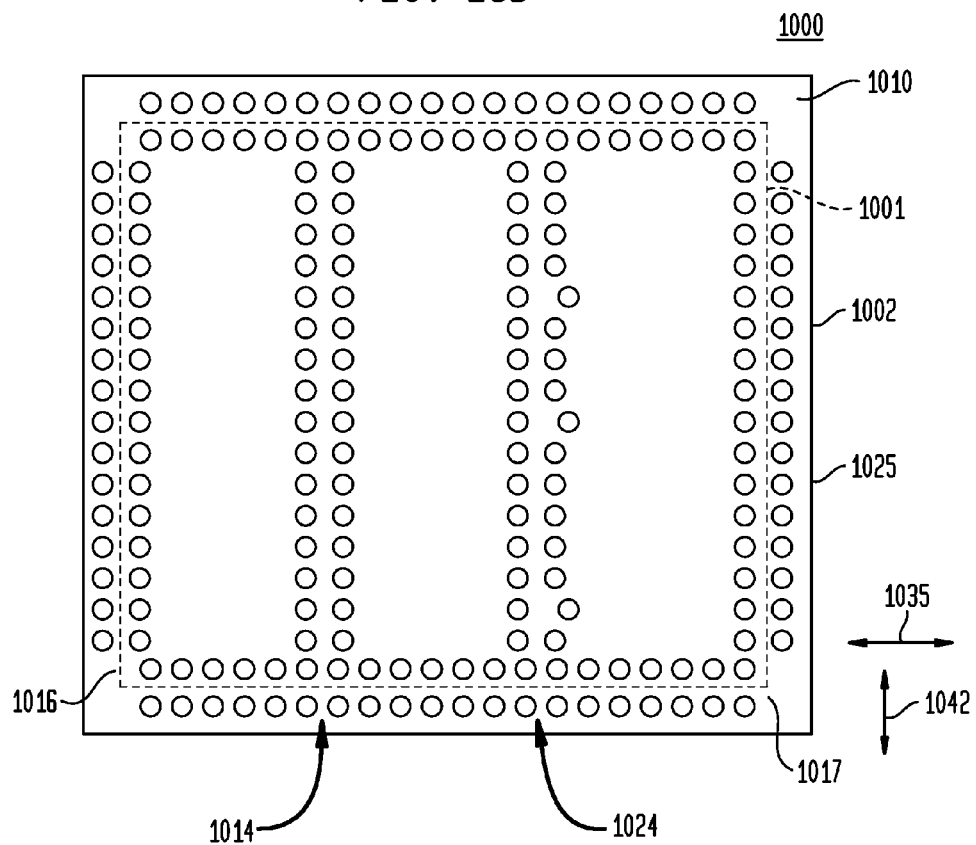
FIG. 26B is a plan view further illustrating an arrangement of terminals in accordance with the embodiment shown in FIG. 26A.
Figure 26C:
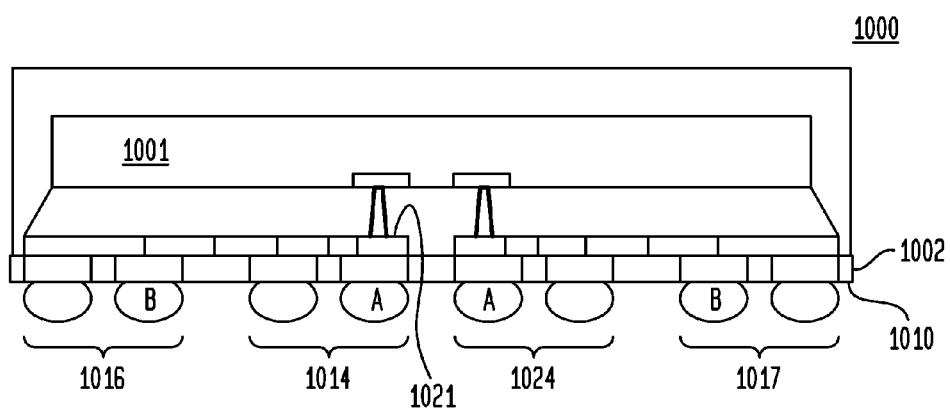
FIG. 26C is a sectional view through line 26C-26C of FIG. 26A further illustrating the microelectronic package shown in FIG. 26A.

A microelectronic package 1000 according to an embodiment of the invention is illustrated in FIGS. 26A-26C. As seen therein, the package 1000 can include a microelectronic element 1001 configured to predominantly provide memory storage array function, in that the microelectronic element has a greater number of active devices, e.g., transistors, configured to provide memory storage array function than any other function, as indicated above. The microelectronic package 1000 shown in FIGS. 26A-26C is similar to the microelectronic package 100 shown in FIGS. 5-7, except that the microelectronic package 1000 includes only a single microelectronic element 1001 configured to predominantly provide memory storage array function.

As seen in FIG. 26A, the signal assignments of the first terminals in the second grid 1024 are a mirror image of the signal assignments of the first terminals in the first grid 1014. Stated another way, the signal assignments of the first terminals in the first and second grids are symmetric about an axis 1032 between the first and second grids 1014, 1024, the axis 1032 in this case extending in a direction 1042 in which columns 1036 of the first terminals extend.

As shown in FIG. 26A, some or all of the second terminals 106 can be disposed in third, fourth, fifth, and sixth grids 1016, 1017, 1017, and 1019 on the second surface 1010 of the substrate 1002. In a particular case, the signal assignments of the second terminals in the third grid 1016 can be a mirror image of the signal assignments of the second terminals in the fourth grid 1017, in like manner to that described above for the first and second grids. In one example, each of the fifth and sixth grids 1018, 1019 can extend in another direction 1035 which is transverse to or even orthogonal to the direction 1042 in which the first, second, third, and fourth grids extend. In the embodiment shown in FIGS. 26A-26C, the third, fourth, fifth, and sixth grids 1016, 1017, 1018, and 1019 are each disposed adjacent a periphery 1025 of the second surface 1010 of the substrate 1002.

The arrangement shown in FIGS. 26A-26C, where a microelectronic package can include a single microelectronic element 1001 that is disposed adjacent to and electrically connected with a substrate 1002, can be modified by making the microelectronic element 1001 a composite structure that can include two or more stacked semiconductor ships, to produce microelectronic packages such as those shown and described above with respect to FIGS. 21-25. Such embodiments including a single composite microelectronic element can be the same as those shown in FIGS. 21-25, except there may be only one composite microelectronic element structure, rather than two composite microelectronic elements structures as shown in FIGS. 21-25.

For example, the microelectronic element 1001 of FIGS. 26A-26C can be one of the microelectronic elements 901 shown in FIG. 21, in which the microelectronic element is a composite microelectronic element that can include a first semiconductor chip 932 having contacts 906 facing and joined with corresponding substrate contacts 908 of the substrate, as well as a second semiconductor chip 934 having contacts 910 electrically connected with the first semiconductor chip 932 and the substrate 902 by through-silicon vias ("TSVs") 950 which extend in a direction of a thickness 952 of the first semiconductor chip 932.

In another example, the microelectronic element 1001 of FIGS. 26A-26C can be one of the composite microelectronic elements shown in FIG. 22A, in which the microelectronic package can also include through-silicon vias 960 extending partially or completely through one or more of the second semiconductor chips 934 and can also extend through the first semiconductor chip 932.

In a particular embodiment, the microelectronic element 1001 of FIGS. 26A-26C can be one of the composite microelectronic elements shown in FIG. 23, in which the first semiconductor chip 934 is interconnected with the substrate 902 in the same manner as described above relative to FIG. 21. However, the one or more second semiconductor chips 934 may be electrically interconnected with the first semiconductor chip 932 through wire bonds 925. The wire bonds may connect each second chip 934 directly with the first semiconductor chip 932 as shown in FIG. 23.

Figure 24:
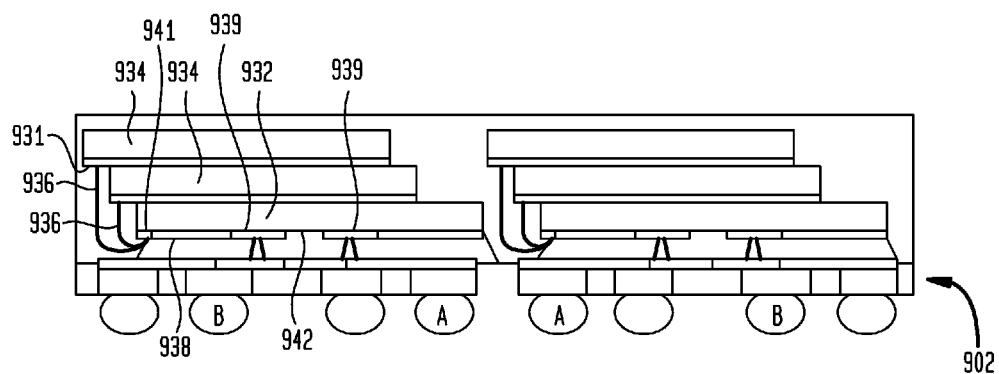
FIG. 24 is a sectional view illustrating a microelectronic package according to another variation of the embodiment shown in FIG. 22A.

In one example, the microelectronic element 1001 of FIGS. 26A-26C can be one of the composite microelectronic elements shown in FIG. 24, in which another way the first and second semiconductor chips 932, 934 can be mounted together in the microelectronic package is for each of the first and second semiconductor chips 932, 934 to be placed with their front faces and contacts 931 facing downwardly, that is, towards the substrate 902. In that way, the contacts 931 can be electrically connected to corresponding contacts 941 on the front face 942 of the first semiconductor chip 932 through wire bonds 936.

In an exemplary embodiment, the microelectronic element 1001 of FIGS. 26A-26C can be one of the composite microelectronic elements shown in FIG. 25, in which connections between contacts of the one or more second semiconductor chips 934 and the first semiconductor chip 932 can include traces 940 that extend along one or more edges of the microelectronic element 930, i.e., along edges of the semiconductor chips 932, 934 within the microelectronic element.

Figure 26D:
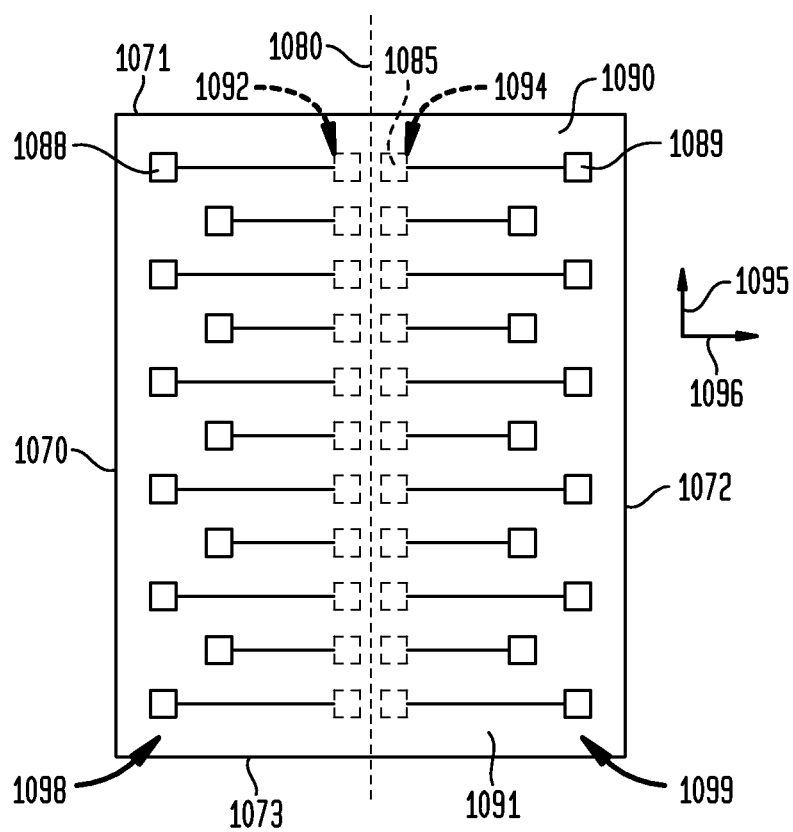
FIG. 26D is a plan view illustrating an alternative arrangement of contacts on a microelectronic element according to a variation of the embodiment shown in FIGS. 26A-26C.

FIG. 26D illustrates a variation of the microelectronic element 1001 shown in FIGS. 26A-26C in which contact pads 1085 of a microelectronic element 1090 can be disposed in one or two columns 1092, 1094 near the center of the microelectronic element, e.g., adjacent a central axis 1080 of the microelectronic element. In this example, the element contacts that are joined to corresponding contacts 1021 (FIG. 26C) of the substrate can be redistribution contacts 1088, 1089 on the microelectronic element. Some or all of the redistribution contacts 1088, 1089 that are electrically connected with the contact pads 1085 can be displaced from the contact pads in one or more directions 1095, 1096 along a face of the microelectronic element 1090.

In one example, the redistribution contacts 1088, 1089 can be disposed in a plurality of columns 1098, 1099 that are closer to the edges 1070, 1072 of the microelectronic element 1090 than the columns 1092, 1094 of contact pads 1085. In a particular example, the redistribution contacts 1088, 1089 can be distributed in an area array exposed at the surface 1091 of the microelectronic element 1090. In another particular example, the redistribution contacts 1088, 1089 can be distributed along one or more peripheral edges 1070, 1072 of the microelectronic element that extend in a first direction 1095, or can be distributed along one or more peripheral edges 1071, 1073 of the microelectronic element that extend in a second direction 1096 transverse to the first direction 1095.

In yet another example, the redistribution contacts 1088, 1089 can be distributed along two or more of the peripheral edges 170, 171, 172, and 173 of the microelectronic element. In any of these examples, the redistribution contacts 1088, 1089 can be disposed on the same face 1091 of the microelectronic element 1090 as the contact pads 1085, or can be disposed on a face of the microelectronic element opposite from the contact pads. In one example, each contact pad 1085 can be connected to a redistribution contact 1088, 1089. In another example, there may be no redistribution contact connected to one or more contact pads 1085. Such one or more contact pads 1085 that are not connected to a redistribution contact may or may not be electrically connected to one or more corresponding terminals of the microelectronic package in which the microelectronic element 1090 is disposed.

Figure 27:
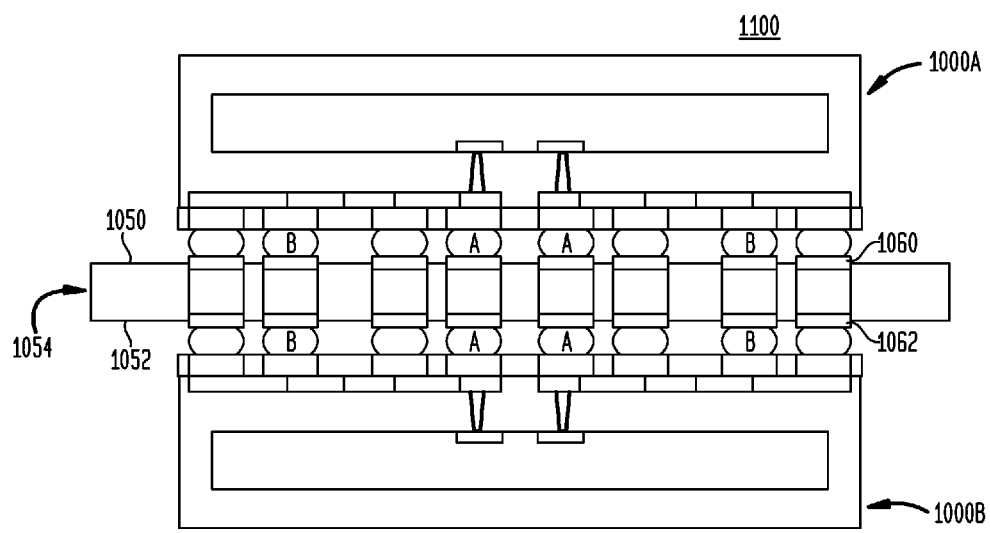
FIG. 27 is a sectional view illustrating a microelectronic assembly and first and second microelectronic packages electrically interconnected therewith in accordance with an embodiment of the invention.

FIG. 27 illustrates an assembly 1100 of first and second microelectronic packages 1000A, 1000B, each being a microelectronic package 1000 as described with reference to FIGS. 26A-26C above, as mounted to opposite first and second surfaces 1050, 1052 of a circuit panel 1054. The circuit panel can be of various types, such as a printed circuit board used in a dual-inline memory module ("DIMM") module, a circuit board or panel to be connected with other components in a system, or a motherboard, among others. The first and second microelectronic packages 1000A, 1000B can be mounted to corresponding contacts 1060, 1062 exposed at the first and second surfaces 1050, 1052 of the circuit panel 1054, respectively. The microelectronic assembly 1100 shown in FIG. 27 is similar to the microelectronic package 200 shown in FIG. 8A, except that each of the microelectronic packages 1000A, 1000B include only a single microelectronic element configured to predominantly provide memory storage array function.

Figure 28:
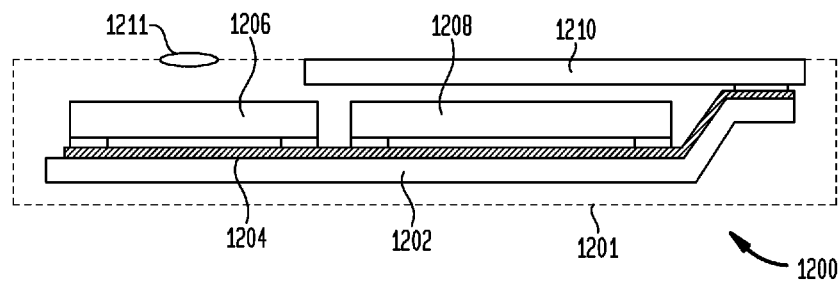
FIG. 28 is a schematic sectional view illustrating a system according to an embodiment of the invention.

The microelectronic packages and microelectronic assemblies described above with reference to FIGS. 5-27 can be utilized in construction of diverse electronic systems, such as the system 1200 shown in FIG. 28. For example, the system 1200 in accordance with a further embodiment of the invention can include one or more modules or components 1206, such as the microelectronic packages and/or microelectronic assemblies as described above, in conjunction with other electronic components 1208 and 1210.

In the exemplary system 1200 shown, the system can include a circuit panel, motherboard, or riser panel 1202 such as a flexible printed circuit board, and the circuit panel can include numerous conductors 1204, of which only one is depicted in FIG. 28, interconnecting the modules or components 1206, 1208, and/or 1210 with one another. Such a circuit panel 1202 can transport signals to and from each of the microelectronic packages and/or microelectronic assemblies included in the system 1200. However, this is merely exemplary; any suitable structure for making electrical connections between the modules or components 1206 can be used.

In a particular embodiment, the system 1200 can also include a processor such as the semiconductor chip 1208, such that each module or component 1206 can be configured to transfer a number N of data bits in parallel in a clock cycle, and the processor can be configured to transfer a number M of data bits in parallel in a clock cycle, M being greater than or equal to N.

In the example depicted in FIG. 28, the component 1208 is a semiconductor chip and component 1210 is a display screen, but any other components can be used in the system 1200. Of course, although only two additional components 1208 and 1210 are depicted in FIG. 28 for clarity of illustration, the system 1200 can include any number of such components.

Modules or components 1206 and components 1208 and 1210 can be mounted in a common housing 1201, schematically depicted in broken lines, and can be electrically interconnected with one another as necessary to form the desired circuit. The housing 1201 is depicted as a portable housing of the type usable, for example, in a cellular telephone or personal digital assistant, and screen 1210 can be exposed at the surface of the housing. In embodiments where a structure 1206 includes a light-sensitive element such as an imaging chip, a lens 1211 or other optical device also can be provided for routing light to the structure. Again, the simplified system shown in FIG. 28 is merely exemplary; other systems, including systems commonly regarded as fixed structures, such as desktop computers, routers and the like can be made using the structures discussed above.

Figure 29:
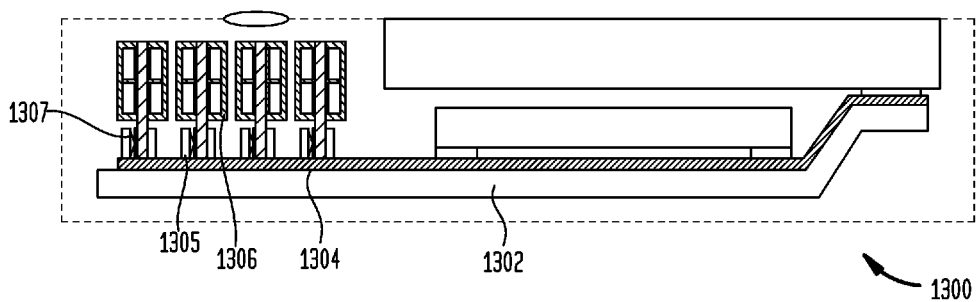
FIG. 29 is a schematic sectional view illustrating a system according to an embodiment of the invention.

The microelectronic packages and microelectronic assemblies described above with reference to FIGS. 5-27 can also be utilized in construction of an electronic system such as the system 1300 shown in FIG. 29. For example, the system 1300 in accordance with a further embodiment of the invention is the same as the system 1200 shown in FIG. 28, except the component 1206 has been replaced by a plurality of components 1306.

Each of the components 1306 can be or can include one or more of the microelectronic packages or microelectronic assemblies described above with reference to FIGS. 5-27. In a particular example, one or more of the components 1306 can be a variation of the microelectronic assembly 200 shown in FIG. 8A, in which the circuit panel 154 includes exposed edge contacts, and the circuit panel 154 of each microelectronic assembly 200 can be suitable for insertion into a socket 1305.

Each socket 1305 can include a plurality of contacts 1307 at one or both sides of the socket, such that each socket 1305 can be suitable for mating with corresponding exposed edge contacts of a corresponding component 1306 such as the above-described variation of the microelectronic assembly 200. In the exemplary system 1300 shown, the system can include a second circuit panel 1302 or motherboard such as a flexible printed circuit board, and the second circuit panel can include numerous conductors 1304, of which only one is depicted in FIG. 29, interconnecting the components 1306 with one another.

In a particular example, a module such as the system 1300 can include a plurality of components 1306, each component 1306 being the above-described variation of the microelectronic assembly 200. Each component 1306 can be mounted to, and electrically connected with the second circuit panel 1302 for transport of signals to and from each component 1306. The specific example of the system 1300 is merely exemplary; any suitable structure for making electrical connections between the components 1306 can be used.

In any or all of the microelectronic packages described in the foregoing, the rear surface of one or more of the microelectronic elements can be at least partially exposed at an exterior surface of the microelectronic package after completing fabrication. Thus, in the microelectronic package 100 described above with respect to FIGS. 5-7, the rear surface of one or more of the microelectronic elements can be partially or fully exposed at an exterior surface of an encapsulant 146 in the completed microelectronic package 100.

In any of the embodiments described above, the microelectronic packages and microelectronic assemblies may include a heat spreader partly or entirely made of any suitable thermally conductive material. Examples of suitable thermally conductive material include, but are not limited to, metal, graphite, thermally conductive adhesives, e.g., thermally-conductive epoxy, a solder, or the like, or a combination of such materials. In one example, the heat spreader can be a substantially continuous sheet of metal.

In one embodiment, the heat spreader can include a metallic layer disposed adjacent to one or more of the microelectronic elements. The metallic layer may be exposed at a rear surface of the microelectronic package. Alternatively, the heat spreader can include an overmold or an encapsulant covering at least the rear surface of one or more of the microelectronic elements. In one example, the heat spreader can be in thermal communication with at least one of the front surface and rear surface of one or more of the microelectronic elements such as the microelectronic elements 101 and 103 shown in FIG. 6. In some embodiments, the heat spreader can extend between adjacent edges of adjacent ones of the microelectronic elements. The heat spreader can improve heat dissipation to the surrounding environment.

In a particular embodiment, a pre-formed heat spreader made of metal or other thermally conductive material may be attached to or disposed on the rear surface of one or more of the microelectronic elements with a thermally conductive material such as thermally conductive adhesive or thermally conductive grease. The adhesive, if present, can be a compliant material that permits relative movement between the heat spreader and the microelectronic element to which it is attached, for example, to accommodate differential thermal expansion between the compliantly attached elements. The heat spreader may be a monolithic structure. Alternatively, the heat spreader may include multiple spreader portions spaced apart from one another. In a particular embodiment, the heat spreader may be or include a layer of solder joined directly to at least a portion of a rear surface of one or more of microelectronic elements such as the microelectronic elements 101 and 103 shown in FIG. 6.

The above embodiments can be combined in ways other than explicitly described or shown in the foregoing. For example, each package can incorporate any of the types of microelectronic elements shown and described above relative to FIGS. 5-7, 9, 10, 26A-26C, or any of FIG. 21, 22, 23, 24, or 25, being either bare semiconductor chips, or vertically stacked and electrically interconnected semiconductor chips, or one or more semiconductor chips having a redistribution layer thereon.

As these and other variations and combinations of the features discussed above can be utilized without departing from the present invention, the foregoing description of the preferred embodiments should be taken by way of illustration rather than by way of limitation of the invention as defined by the claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic package, comprising:
   a microelectronic element having a face and a plurality of element contacts thereon, the microelectronic element embodying a greater number of active devices to provide memory storage array function than any other function;
   a substrate having first and second opposed surfaces, the substrate having a set of substrate contacts on the first surface facing the element contacts of the microelectronic element and joined to the element contacts; and
   a plurality of terminals on the second surface of the substrate configured for connecting the microelectronic package with at least one component external to the microelectronic package, the terminals electrically connected with the substrate contacts and including first terminals arranged at positions within first and second parallel grids, each grid disposed on a respective side of an axis, the first terminals of each of the first and second grids being configured to carry address information usable by circuitry within the microelectronic package to determine an addressable memory location from among all the available addressable memory locations of a memory storage array within the microelectronic element, the terminals including second terminals arranged at positions within third and fourth parallel grids and configured to carry second information, the second information being other than the information carried by the first terminals, the second information including data signals, wherein the first and second grids separate the third and fourth grids from one another, the first terminals having signal assignments, wherein the signal assignments of the first terminals in the first grid are symmetric about the axis with the signal assignments of the first terminals in the second grid, such that of the first terminals of the first grid that are configured to carry address information, each of such first terminals is configured to carry the same address information as a corresponding one of the first terminals of the second grid at a position symmetric about the axis with respect to such first terminal.

2. The microelectronic package as claimed in claim 1, wherein the first terminals of each of the first and second grids are configured to carry all of the address information usable by the circuitry within the microelectronic package to determine the addressable memory location.

3. The microelectronic package as claimed in claim 1, wherein the first terminals of each of the first and second grids are configured to carry information that controls an operating mode of the microelectronic element.

4. The microelectronic package as claimed in claim 3, wherein the first terminals of each of the first and second grids are configured to carry all of the command signals transferred to the microelectronic package, the command signals being write enable, row address strobe, and column address strobe signals.

5. The microelectronic package as claimed in claim 1, wherein the first terminals of each of the first and second grids are configured to carry clock signals transferred to the microelectronic package, the clock signals being clocks used for sampling signals carrying the address information.

6. The microelectronic package as claimed in claim 1, wherein the first terminals of each of the first and second grids are configured to carry all of the bank address signals transferred to the microelectronic package.

7. The microelectronic package as claimed in claim 1, wherein the element contacts include redistribution contacts exposed at the front face of the microelectronic element, each redistribution contact being electrically connected with a contact pad of the microelectronic element through at least one of a trace or a via.

8. The microelectronic package as claimed in claim 1, wherein the signal assignments of the first terminals in the first and second grids are symmetric about an axis between the first and second grids, wherein the axis is equidistant from first and second opposed edges of the substrate.

9. The microelectronic package as claimed in claim 1, wherein columns of terminals in the first and second grids extend in a direction parallel to first and second opposed edges of the substrate, wherein the axis is not more than a distance of three and one-half times a minimum pitch between any two adjacent columns of the terminals in the first and second grids from a line parallel to and equidistant from the first and second edges of the substrate.

10. The microelectronic package as claimed in claim 9, wherein one of the columns of the terminals in the first and second grids contains at least some of the first terminals and defines a respective column axis which extends through centers of a majority of the terminals of the column and does not extend through a center of one or more of the terminals of the column.

11. The microelectronic package as claimed in claim 10, wherein the column axis does not extend through at least one of the one or more non-centered terminals of the column.

12. The microelectronic package as claimed in claim 1, wherein each of the first and second grids includes first and second parallel columns of the first terminals.

13. The microelectronic package as claimed in claim 12, wherein at least one of the first and second grids includes at least one terminal between the first and second parallel columns of the respective grid.

14. The microelectronic package as claimed in claim 1, wherein the second terminals are disposed at positions on the second surface other than in the first and second grids.

15. The microelectronic package as claimed in claim 1, wherein at least some of the second terminals are disposed within the first and second grids.

16. The microelectronic package as claimed in claim 1, wherein the signal assignments of the second terminals in the third grid are a mirror image of the signal assignments of the second terminals in the fourth grid.

17. The microelectronic package as claimed in claim 1, wherein the data signals include bi-directional data signals and the second terminals are configured to carry all of the bi-directional data signals for receipt of data to be written to the addressable locations of the memory storage array and for output of data read from the addressable locations of the memory storage array.

18. The microelectronic package as claimed in claim 1, wherein one portion of the second terminals are arranged in a fifth grid and another portion of the second terminals are arranged in a sixth grid, wherein columns of terminals in the fifth and sixth grids are parallel to one another and extend in a second direction transverse to a first direction in which columns of terminals in the first and second terminals extend, wherein the signal assignments of the second terminals in the fifth grid are symmetric about an axis between the first and second grids, and the signal assignments of the second terminals in the sixth grid are symmetric about the axis between the first and second grids, wherein the axis is equidistant from first and second opposed edges of the substrate.

19. The microelectronic package as claimed in claim 1, wherein the at least one component external to the package is a circuit panel.

20. The microelectronic package as claimed in claim 1, further comprising a buffer chip having a surface facing the first surface of the substrate, the buffer chip being electrically connected with the first terminals of at least one of the first and second grids, the buffer chip being configured to regenerate at least some of the address information received at the first terminals and output the regenerated address information to the microelectronic element.

21. The microelectronic package as claimed in claim 1, wherein the microelectronic element is a first microelectronic element and the set of substrate contacts is a first set of substrate contacts, the microelectronic package further comprising a second microelectronic element having a face and a plurality of element contacts thereon, the second microelectronic element embodying a greater number of active devices to provide memory storage array function than any other function, the substrate having a second set of substrate contacts on the first surface facing the element contacts of the second microelectronic element and joined thereto, the terminals being electrically connected with the second set of substrate contacts, the first terminals of each of the first and second grids being configured to carry address information usable by circuitry within the microelectronic package to determine an addressable memory location from among all the available addressable memory locations of a memory storage array within the first and second microelectronic elements.

22. The microelectronic package as claimed in claim 21, wherein the faces of the first and second microelectronic elements are arranged in a single plane parallel to the first surface of the substrate.

23. The microelectronic package as claimed in claim 21, wherein the first terminals of the first grid are electrically connected with the first microelectronic element and the first terminals of the second grid are electrically connected with the second microelectronic element.

24. The microelectronic package as claimed in claim 23, wherein the first terminals of the first and second grids are electrically connected with each of the first and second microelectronic elements.

25. The microelectronic package as claimed in claim 21, wherein the first terminals of the first grid are electrically connected with the first microelectronic element and are not electrically connected with the second microelectronic element and the first terminals of the second grid are electrically connected with the second microelectronic element and are not electrically connected with the first microelectronic element.

26. The microelectronic package as claimed in claim 1, wherein the substrate includes a dielectric element having a coefficient of thermal expansion ("CTE") in the plane of the dielectric element of less than 30 parts per million per degree Celsius ("ppm/° C.").

27. The microelectronic package as claimed in claim 1, wherein the second terminals are configured to carry all of the data signals for receipt of data to be written to the addressable locations of the memory storage array and for output of data read from the addressable locations of the memory storage array.

28. A microelectronic package, comprising:
a microelectronic element having a face and a plurality of element contacts thereon, the microelectronic element embodying a greater number of active devices to provide memory storage array function than any other function;
a substrate having first and second opposed surfaces, the substrate having a set of substrate contacts on the first surface facing the element contacts of the microelectronic element and joined to the element contacts; and
a plurality of terminals on the second surface of the substrate configured for connecting the microelectronic package with at least one component external to the microelectronic package, the terminals electrically connected with the substrate contacts and including first terminals arranged at positions within first and second parallel grids, each grid disposed on a respective side of an axis, the first terminals of each of the first and second grids being configured to carry a majority of the address information usable by circuitry within the microelectronic package to determine an addressable memory location from among all the available addressable memory locations of a memory storage array within the microelectronic element, the terminals including second terminals arranged at positions within third and fourth parallel grids and configured to carry second information, the second information being other than the information carried by the first terminals, the second information including data signals, wherein the first and second grids separate the third and fourth grids from one another, the first terminals having signal assignments, wherein the signal assignments of the first terminals in the first grid are symmetric about the axis with the signal assignments of the first terminals in the second grid, such that of the first terminals of the first grid that are configured to carry address information, each of such first terminals is configured to carry the same address information as a corresponding one of the first terminals of the second grid at a position symmetric about the axis with respect to such first terminal.

29. The microelectronic package as claimed in claim 28, wherein the first terminals of each of the first and second grids are configured to carry at least three-quarters of the address information usable by the circuitry within the microelectronic package to determine the addressable memory location.

30. A microelectronic package, comprising:
a microelectronic element having a face and a plurality of element contacts thereon, the microelectronic element embodying a greater number of active devices to provide memory storage array function than any other function;
a substrate having first and second opposed surfaces, the substrate having a set of substrate contacts on the first surface facing the element contacts of the microelectronic element and joined to the element contacts; and
a plurality of terminals on the second surface of the substrate configured for connecting the microelectronic package with at least one component external to the microelectronic package, the terminals electrically connected with the substrate contacts and including first terminals arranged at positions within first and second parallel grids, each grid disposed on a respective side of an axis, the first terminals of each of the first and second grids being configured to carry all address information usable by circuitry within the microelectronic package to determine an addressable memory location from among all the available addressable memory locations of a memory storage array within the microelectronic element, the first terminals having signal assignments, wherein the signal assignments of the first terminals in the first grid are symmetric about the axis with the signal assignments of the first terminals in the second grid, such that of the first terminals of the first grid that are configured to carry address information, each of such first terminals is configured to carry the same address information as a corresponding one of the first terminals of the second grid at a position symmetric about the axis with respect to such first terminal, wherein each of the first and second grids includes first and second adjacent parallel columns of the first terminals, the second column of the first grid being disposed adjacent the axis on a first side of the axis, the first column of the second grid being disposed adjacent the axis on a second side of the axis.

* * * * *